(12) United States Patent
Yu et al.

(10) Patent No.: US 12,199,130 B2
(45) Date of Patent: Jan. 14, 2025

(54) APPARATUS FOR INTEGRATED MICROWAVE PHOTONICS ON A SAPPHIRE PLATFORM, METHOD OF FORMING SAME, AND APPLICATIONS OF SAME

(71) Applicant: BOARD OF TRUSTEES OF THE UNIVERSITY OF ARKANSAS, Little Rock, AR (US)

(72) Inventors: Shui-Qing Yu, Fayetteville, AR (US); Gregory J. Salamo, Fayetteville, AR (US); Rahul Kumar, Fayetteville, AR (US); Samir K. Saha, Fayetteville, AR (US); Yang Zhang, Fayetteville, AR (US); Samir M. El-Ghazaly, Fayetteville, AR (US)

(73) Assignee: BOARD OF TRUSTEES OF THE UNIVERSITY OF ARKANSAS, Little Rock, AR (US)

( * ) Notice: Subject to any disclaimer, the term of this patent is extended or adjusted under 35 U.S.C. 154(b) by 443 days.

(21) Appl. No.: 17/509,635

(22) Filed: Oct. 25, 2021

(65) Prior Publication Data
US 2022/0130887 A1    Apr. 28, 2022

Related U.S. Application Data

(60) Provisional application No. 63/104,616, filed on Oct. 23, 2020.

(51) Int. Cl.
*H01L 31/0352* (2006.01)
*H01L 21/02* (2006.01)
(Continued)

(52) U.S. Cl.
CPC .... *H01L 27/14658* (2013.01); *H01L 21/0242* (2013.01); *H01L 21/02433* (2013.01);
(Continued)

(58) Field of Classification Search
None
See application file for complete search history.

(56) References Cited

U.S. PATENT DOCUMENTS

| 2015/0244151 | A1* | 8/2015 | Liu | H01S 5/3412 |
| | | | | 438/47 |
| 2017/0179681 | A1* | 6/2017 | Barwicz | G02B 6/4206 |
| 2018/0240936 | A1* | 8/2018 | Hong | H01L 33/04 |

FOREIGN PATENT DOCUMENTS

| KR | 20190095750 A | * | 8/2019 | ......... H01L 33/0075 |

OTHER PUBLICATIONS

Translation of KR 20190095750 A (Year: 2019).*
(Continued)

*Primary Examiner* — Suberr L Chi
*Assistant Examiner* — Carnell Hunter, III
(74) *Attorney, Agent, or Firm* — Locke Lord LLP; Tim Tingkang Xia, Esq.

(57) ABSTRACT

An integrated microwave photonics (IMWP) apparatus is provided using sapphire as a platform. The IMWP apparatus includes: a sapphire substrate having a step-terrace surface; and a III-V stack layer epitaxially grown on the sapphire substrate. The III-V stack layer includes: a first III-V layer disposed on the sapphire substrate; a low temperature (LT) III-V buffer layer disposed on the first III-V layer; multiple second III-V layers disposed and stacked on the LT III-V buffer layer; a third III-V layer disposed on the second III-V layers; a III-V quantum well layer disposed on the third III-V layers; and a fourth III-V layer disposed on the III-V quantum well layer. The second III-V layers are respectively annealed. A growth temperature of the LT III-V layer and a growth temperature of the III-V quantum well layer are lower than a growth temperature of each of the first, second, third and fourth III-V layers.

9 Claims, 56 Drawing Sheets

(51) Int. Cl.
   *H01L 27/146* (2006.01)
   *H01L 31/0304* (2006.01)
   *H04N 5/32* (2023.01)

(52) U.S. Cl.
   CPC .. *H01L 21/02463* (2013.01); *H01L 21/02505* (2013.01); *H01L 21/02507* (2013.01); *H01L 21/02516* (2013.01); *H01L 21/02546* (2013.01); *H01L 21/02609* (2013.01); *H01L 21/02631* (2013.01); *H01L 31/0304* (2013.01); *H01L 31/035209* (2013.01); *H04N 5/32* (2013.01)

(56) References Cited

OTHER PUBLICATIONS

D. Kelly/C. Brindle/C. Kemerling/M. Stuber, The state-of-the-art of silicon-on-sapphire CMOS RF switches, 2005, IEEE, p. 1 (Year: 2005).*

J. Capmany and D. Novak, "Microwave photonics combines two worlds," Nat. Photonics, vol. 1, No. 6, pp. 319-330, 2007.

J. S. Fandiño, p. Muñoz, D. Doménech, and J. Capmany, "A monolithic integrated photonic microwave filter," Nat. Photonics, vol. 11, No. 2, pp. 124-129, 2017.

J. Yao, "Photonic generation of microwave arbitrary waveforms," Opt. Commun., vol. 284, No. 15, pp. 3723-3736, 2011.

D. Marpaung and C. Roeloffzen, "Integrated microwave photonics for phase modulated systems," 2012 IEEE Photonics Conf. IPC 2012, pp. 84-85, 2012.

A. J. Seeds, "Microwave photonics," IEEE Trans. Microw. Theory Tech., vol. 50, No. 3, pp. 877-887, 2002.

K. J. Williams, "Microwave photonics," Conf. Proc.-Int. Conf. Indium Phosphide Relat. Mater., vol. 27, No. 3, pp. 212-214, 2012.

C. Cox, "Techniques and performance of intensity-modulation direct-detection analog optical links," IEEE Trans. Microw. Theory Tech., vol. 45, No. 8 Part 2, pp. 1375-1383, 1997.

E. I. Ackerman et al., "Signal-to-noise performance of two analog photonic links using different noise reduction techniques," IEEE MTT-S Int. Microw. Symp. Dig., pp. 51-54, 2007.

J. D. McKinney, M. Godinez, V. J. Urick, S. Thaniyavarn, W. Charczenko, and K. J. Williams, "Sub-10-dB noise figure in a multiple-GHz analog optical link," IEEE Photonics Technol. Lett., vol. 19, No. 7, pp. 465-467, 2007.

D. Jäger and A. Stöhr, "Microwave Photonics—From Concepts to Applications," Architecture, No. December, pp. 1-4, 2005.

D. Marpaung, J. Yao, and J. Capmany, "Integrated microwave photonics," Nat. Photonics, vol. 13, No. 2, pp. 80-90, 2019.

X. Xu, M. Tan, J. Wu, R. Morandotti, A. Mitchell, and D. J. Moss, "Microcomb-Based Photonic RF Signal Processing," IEEE Photonics Technol. Lett., vol. 31, No. 23, pp. 1854-1857, 2019.

M. Smit et al., "An introduction to InP-based generic integration technology," Semicond. Sci. Technol., vol. 29, No. 8, 2014.

L. M. Augustin et al., "InP-Based Generic Foundry Platform for Photonic Integrated Circuits," IEEE J. Sel. Top. Quantum Electron., vol. 24, No. 1, 2018.

W. Zhang and J. Yao, "Silicon-based integrated microwave photonics," IEEE J. Quantum Electron., vol. 52, No. 1, 2016.

S. Ibrahim et al., "Demonstration of a fast-reconfigurable silicon CMOS optical lattice filter," Opt. Express, vol. 19, No. 14, p. 13245, 2011.

K. Wörhoff, R. G. Heideman, A. Leinse, and M. Hoekman, "TriPlex: A versatile dielectric photonic platform," Adv. Opt. Technol., vol. 4, No. 2, pp. 189-207, 2015.

J. F. Bauters et al., "Planar waveguides with less than 01 dB/m propagation loss fabricated with wafer bonding," Opt. Express, vol. 19, No. 24, p. 24090, 2011.

X. Ji et al., "Ultra-low-loss on-chip resonators with sub-milliwatt parametric oscillation threshold," Optica, vol. 4, No. 6, p. 619, 2017.

D. Pérez et al., "Multipurpose silicon photonics signal processor core," Nat. Commun., vol. 8, No. 1, pp. 1-9, 2017.

C. G. H. Roeloffzen et al., "Low-loss si3n4 triplex optical waveguides: Technology and applications overview," IEEE J. Sel. Top. Quantum Electron., vol. 24, No. 4, 2018.

J. Kischkat et al., "Mid-infrared optical properties of thin films of aluminum oxide, titanium dioxide, silicon dioxide, aluminum nitride, and silicon nitride," Appl. Opt., vol. 51, No. 28, pp. 6789-6798, 2012.

S. K. Saha et al., "Crystalline GaAs Thin Film Growth on a c-Plane Sapphire Substrate," Cryst. Growth Des., vol. 19, No. 9, pp. 5088-5096, 2019.

S. K. Saha et al., "GaAs epitaxial growth on R-plane sapphire substrate," J. Cryst. Growth, vol. 548, No. August, p. 125848, 2020.

M. Yamaguchi, A. Yamamoto, M. Tachikawa, Y. Itoh, and M. Sugo, "Defect reduction effects in GaAs on Si substrates by thermal annealing," Appl. Phys. Lett., vol. 53, No. 23, pp. 2293-2295, 1988.

D. S. Abramkin et al., "Influence of a Low-Temperature GaAs Dislocation Filter on the Perfection of GaAs/Si Layers," Optoelectron. Instrum. Data Process., vol. 54, No. 2, pp. 181-186, 2018.

N. A. El-Masry, J. C. Tarn, and N. H. Karam, "Interactions of dislocations in GaAs grown on Si substrates with InGaAs—GaAsP strained layered superlattices," J. Appl. Phys., vol. 64, No. 7, pp. 3672-3677, 1988.

J. S. Blakemore, "Semiconducting and other major properties of gallium arsenide," J. Appl. Phys., vol. 53, No. 10, 1982.

N. Moll, A. Kley, E. Pehlke, and M. Scheffler, "GaAs equilibrium crystal shape from first principles," Phys. Rev. B-Condens. Matter Mater. Phys., vol. 54, No. 12, pp. 8844-8855, 1996.

F. Cuccureddu et al., "Surface morphology of c-plane sapphire (α-alumina) produced by high temperature anneal," Surf. Sci., vol. 604, No. 15-16, pp. 1294-1299, 2010.

R. Chandrasekaran, A. S. Ozcan, D. Deniz, K. F. Ludwig, and T. D. Moustakas, "Growth of non-polar (1120) and semi-polar (1126) AlN and GaN films on the R-plane sapphire," Phys. Status Solidi Curr. Top. Solid State Phys., vol. 4, No. 5, pp. 1689-1693, 2007.

P. Vogt, A. Trampert, M. Ramsteiner, and O. Bierwagen, Domain matching epitaxy of cubic In2O3 on r-plane sapphire, vol. 212, No. 7. 2015.

V. Cimalla et al., "Growth of cubic InN on r-plane sapphire," Appl. Phys. Lett., vol. 83, No. 17, pp. 3468-3470, 2003.

T. Lei, K. F. Ludwig, and T. D. Moustakas, "Heteroepitaxy, polymorphism, and faulting in GaN thin films on silicon and sapphire substrates," J. Appl. Phys., vol. 74, No. 7, pp. 4430-4437, 1993.

J. M. Chauveau, P. Venngus, M. Laugt, C. Deparis, J. Zuniga-Perez, and C. Morhain, "Interface structure and anisotropic strain relaxation of nonpolar wurtzite (11 2- 0) and (101-0) orientations: ZnO epilayers grown on sapphire," J. Appl. Phys., vol. 104, No. 7, 2008.

R. Kumar et al., "GaAs Layer on c-plane Sapphire for Light Emitting Sources," Appl. Surf. Sci., p. 148554, 2020.

Yu.B.Bolkhovityanov and O.P.Pchelyakov, "GaAs epitaxy on Si substrates:modern status of research and engineering," Uspekhi Fiz. Nauk, vol. 51, No. 5, pp. 437-456, 2008.

Y. Wang, W. Chen, B. Wang, and Y. Zheng, "Ultrathin ferroelectric films: Growth, characterization, physics and applications," Materials (Basel)., vol. 6, No. 9, pp. 6377-6485, 2014.

F. Wu, "Planar Defects in Metallic Thin Film Heterostructures," No. Apr. 2014.

M. S. Muthuvalu and J. Sulaiman, "Journal of Fundamental Sciences," vol. 6, No. 2, pp. 104-110, 2010.

S. P. Minor, "Growth of Indium Nitride Quantum Dots by Molecular Beam Epitaxy by," 2019.

N. Kaiser, Review of the fundamentals of thin-film growth. 2002.

C.-Y. Chou, "III-V Semiconductor Materials Grown by Molecular Beam Epitaxy for Infrared and High-Speed Transistor Applications," 2016.

T. A. Morgan, "Self-Assembled Barium Titanate Nanoscale Films by Molecular Beam Epitaxy," 2018.

R. B. Lewis, "Molecular Beam Epitaxy Growth Technology and Properties of GaAsBi Alloys," 2014.

(56) References Cited

OTHER PUBLICATIONS

A. V. Vasev, M. A. Putyato, and V. V. Preobrazhenskii, "Some geometrical aspects of diffracted waves formation on a reconstructed crystal face at RHEED," Surf. Sci., vol. 677, pp. 306-315, 2018.

B. Müller and M. Henzler, "SPA-RHEED—A novel method in reflection high-energy electron diffraction with extremely high angular and energy resolution," Rev. Sci. Instrum., vol. 66, No. 11, pp. 5232-5235, 1995.

J. M. Van Hove, P. Pukite, P. I. Cohen, and C. S. Lent, "RHEED streaks and instrument response," J. Vac. Sci. Technol. A Vacuum, Surfaces, Film., vol. 1, No. 2, pp. 609-613, 1983.

S. Johnson, "In situ temperature control of molecular beam epitaxy growth using band-edge thermometry," J. Vac. Sci. Technol. B Microelectron. Nanom. Struct., vol. 16, No. 3, p. 1502, 1998.

I. Farrer, J. J. Harris, R. Thomson, D. Barlett, C. A. Taylor, and D. A. Ritchie, "Substrate temperature measurement using a commercial band-edge detection system," J. Cryst. Growth, vol. 301-302, No. Spec. Iss., pp. 88-92, 2007.

R. N. Sacks, D. Barlett, C. A. Taylor, and J. Williams, "Growth related interference effects in band edge thermometry of semiconductors," J. Vac. Sci. Technol. B Microelectron. Nanom. Struct., vol. 23, No. 3, p. 1247, 2005.

Y. F. Dufrêne, "Atomic force microscopy, a powerful tool in microbiology," J. Bacteriol., vol. 184, No. 19, pp. 5205-5213, 2002.

Y. F. Dufrêne et al., "Imaging modes of atomic force microscopy for application in molecular and cell biology," Nat. Nanotechnol., vol. 12, No. 4, pp. 295-307, 2017.

R. Splinter, "Action potential transmission and vol. conduction," Handb. Phys. Med. Biol., vol. 56, No. 9, pp. 5-1-5-9, 2010.

G. Zeng, Y. Duan, F. Besenbacher, and M. Dong, "Nanomechanics of Amyloid Materials Studied by Atomic Force Microscopy," At. Force Microsc. Investig. into Biol.—From Cell to Protein, 2012.

M. Frentrup et al., "X-ray diffraction analysis of cubic zincblende III-nitrides," J. Phys. D. Appl. Phys., vol. 50, No. 43, 2017.

H. J. Kim, Y. Park, H. Bin Bae, and S. H. Choi, "High-electron-mobility SiGe on sapphire substrate for fast chipsets," Adv. Condens. Matter Phys., vol. 2015, 2015.

K. Inaba, S. Kobayashi, K. Uehara, A. Okada, S. L. Reddy, and T. Endo, "High Resolution X-Ray Diffraction Analyses of (La,Sr)MnO3ZnOSapphire(0001) Double Heteroepitaxial Films," Adv. Mater. Phys. Chem., vol. 03, No. 01, pp. 72-89, 2013.

N. G. Orji et al., "TEM calibration methods for critical dimension standards," Metrol. Insp. Process Control Microlithogr. XXI, vol. 6518, p. 651810, 2007.

B. Saad Alharthi, "Growth and Characterization of Silicon-Germanium-Tin Semiconductors for Future Nanophotonics Devices," 2018.

T. Pham, "Si-based Germanium Tin Photodetectors for Short-Wave and Mid-Wave Infrared Detections Part of the Electronic Devices and Semiconductor Manufacturing Commons," 2018.

S. H. S. Al-Kabi, Si-Based Germanium Tin Semiconductor Lasers for Optoelectronic Applications. 2017.

S. P. Minor, "Plasma-Assisted Molecular Beam Epitaxial Growth of Indium Nitride for Future Device Fabrication," p. 93, 2012.

P. C. Grant, GeSn Thin Film Epitaxy and Quantum Wells for Optoelectronic Devices. 2018.

Wei Dou, High-Sn-content GeSn Alloy towards Room-temperature Mid Infrared Laser. 2018.

R. Kumar, A. Bag, P. Mukhopadhyay, S. Das, and D. Biswas, "Comparison of Different Grading Schemes in InGaAs Metamorphic Buffers on GaAs Substrate: Tilt Dependence on Cross-Hatch Irregularities," Appl. Surf. Sci., vol. 357, pp. 922-930, Sep. 2015.

R. Kumar et al., "Excitation intensity and thickness dependent emission mechanism from an ultrathin InAs layer in GaAs matrix," J. Appl. Phys., vol. 124, No. 23, 2018.

Y. Park, G. C. King, and S. H. Choi, "Rhombohedral epitaxy of cubic SiGe on trigonal c-plane sapphire," J. Cryst. Growth, vol. 310, No. 11, pp. 2724-2731, 2008.

H. J. Kim, A. Duzik, and S. H. Choi, "Lattice-alignment mechanism of SiGe on Sapphire," Acta Mater., vol. 145, pp. 1-7, 2018.

A. Koma, "Van der Waals epitaxy for highly lattice-mismatched systems," J. Cryst. Growth, vol. 201-202, 1999.

G. Saint-Girons, J. Cheng, P. Regreny, L. Largeau, G. Patriarche, and G. Hollinger, "Accommodation at the interface of highly dissimilar semiconductor/oxide epitaxial systems," Phys. Rev. B—Condens. Matter Mater. Phys., vol. 80, No. 15, pp. 1-6, 2009.

W. Wegscheider, K. Eberl, G. Abstreiter, H. Cerva, and H. Oppolzer, "Novel relaxation process in strained Si/Ge superlattices grown on Ge (001)," Appl. Phys. Lett., vol. 57, No. 15, pp. 1496-1498, 1990.

W. Wegscheider, "Effect of compressive and tensile strain on misfit dislocation injection in SiGe epitaxial layers," J. Vac. Sci. Technol. B Microelectron. Nanom. Struct., vol. 11, No. 3, p. 1056, 1993.

H. K. T.Maeda, M.Yoshimoto, T.Ohnishi, G.H.Lee, "Orientation-defined molecular layer epitaxy of α—Al2O3 thin films," J. Cryst. Growth, vol. 177, No. 1-2, pp. 95-101, 1997.

I. M. Y. Shun-ichi, K. Shunsuke, F. Masanori, "Self-formed silicon quantum wires on ultrasmooth sapphire substrates," Appl. Phys. Lett., vol. 71, No. 1409, 1997.

A. Ohtake and T. A. T. Ito, "As-rich (2 x 2) surface reconstruction on GaAs(111)A," Surf. Sci., vol. 606, No. 23-24, pp. 1864-1870, 2012.

D. A. Woolf, Z. Sobiesierski, D. I. Westwood, and R. H. Williams, "The molecular beam epitaxial growth of GaAs/GaAs (111)B: Doping and growth temperature studies," J. Appl. Phys., vol. 71, No. 10, pp. 4908-4915, 1992.

A. Kawaharazuka and Y. Horikoshi, "Behavior of Ga atoms deposited on GaAs (111)B and (111)A surfaces," J. Cryst. Growth, vol. 477, pp. 25-29, 2017.

S. Y. Tong, G. Xu, and W. N. Mei, "Vacancy-buckling model for the (2x2) GaAs(111) surface," Phys. Rev. Lett., vol. 52, No. 19, pp. 1693-1696, 1984.

H. Li, Y. Sun, C. Law, B. Visbeck, and F. Hicks, "Reconstructions of the InP(111)A surface," Phys. Rev. B—Condens. Matter Mater. Phys., vol. 68, No. 8, 2003.

M. R. Fahy, K. Sato, and B. A. Joyce, "Reflection high-energy electron diffraction intensity oscillations during the growth by molecular beam epitaxy of GaAs (111)A," Appl. Phys. Lett., vol. 64, No. 2, pp. 190-192, 1994.

K. Yang and L. J. Schowalter, "Surface reconstruction phase diagram and growth on GaAs(111)B substrates by molecular beam epitaxy," Appl. Phys. Lett., vol. 60, No. 15, pp. 1851-1853, 1992.

J. W. Kim, S. Kim, and J. M. Seo, "Surface core-level shift of InSb(111)-2x2," Phys. Rev. B—Condens. Matter Mater. Phys., vol. 54, No. 7, pp. 4476-4479, 1996.

L. Esposito, S. Bietti, A. Fedorov, R. Notzel, and S. Sanguinetti, "Ehrlich-Schwobel effect on the growth dynamics of GaAs(111)A surfaces," Phys. Rev. Mater., vol. 1, No. 2, 2017.

Y. Park et al., "Analysis of twin defects in GaAs(111)B molecular beam epitaxy growth," J. Vac. Sci. Technol. B Microelectron. Nanom. Struct., vol. 18, No. 3, p. 1566, 2000.

K. Sato, M. R. Fahy, and B. A. Joyce, "The growth of high quality GaAs on GaAs (111)A," Jpn. J. Appl. Phys., vol. 33, No. 7, pp. L905-L907, 1994.

Y. Horikoshi, T. Uehara, T. Iwai, and I. Yoshiba, "Area selective growth of GaAs by migration-enhanced epitaxy," Phys. Status Solidi Basic Res., vol. 244, No. 8, pp. 2697-2706, 2007.

M. Yamaguchi, M. Tachikawa, Y. Itoh, M. Sugo, and S. Kondo, "Thermal annealing effects of defect reduction in GaAs on Si substrates," J. Appl. Phys., vol. 68, No. 9, pp. 4518-4522, 1990.

N. C. Patra, S. Bharatan, J. Li, and S. Iyer, "Annealing studies of heteroepitaxial InSbN on GaAs grown by molecular peam epitaxy for long-wavelength infrared detectors," J. Appl. Phys., vol. 112, No. 8, pp. 2010-2015, 2012.

M. S. Abrahams and C. J. Buiocchi, "Etching of dislocations on the low-index faces of GaAs," J. Appl. Phys., vol. 36, No. 9, pp. 2855-2863, 1965.

S. Kanjanachuchai and C. Euaruksakul, "Self-running Ga droplets on GaAs (111)A and (111)B surfaces," ACS Appl. Mater. Interfaces, vol. 5, No. 16, pp. 7709-7713, 2013.

D. Zeng, W. Jie, T. Wang, J. Zhang, and G. Zha, "Type and formation mechanism of thermal etch pit on annealed (111) CdZnTe surface," Thin Solid Films, vol. 517, No. 9, pp. 2896-2899, Mar. 2009.

(56) References Cited

OTHER PUBLICATIONS

H. Maki et al., "Control of surface morphology of ZnO (0 0 0 1) by hydrochloric acid etching," Thin Solid Films, vol. 411, No. 1, pp. 91-95, 2002.

R. Kumar and D. Biswas, "Tilt investigation of In(Al,Ga)As metamorphic buffer layers on GaAs (001) substrate: A novel technique for tilt determination," Cryst. Res. Technol., vol. 51, No. 12, pp. 723-729, Dec. 2016.

J. P. Bosco, G. M. Kimball, N. S. Lewis, and H. A. Atwater, "Pseudomorphic growth and strain relaxation of α—$Zn_3P_2$ on GaAs(001) by molecular beam epitaxy," J. Cryst. Growth, vol. 363, pp. 205-210, 2013.

M. Briceño, J. Kacher, and I. M. Robertson, "Dynamics of dislocation interactions with stacking-fault tetrahedra at high temperature," J. Nucl. Mater., vol. 433, No. 1-3, pp. 390-396, 2013.

D. Hull and D. J. Bacon, "Dislocations in Face-centered Cubic Metals," Introd. to Dislocations, No. 110, pp. 85-107, 2011.

M. Kiritani, "Story of stacking fault tetrahedra," Mater. Chem. Phys., vol. 50, No. 2, pp. 133-138, 1997.

Y. Matsukawa and S. J. Zinkle, "Dynamic observation of the collapse process of a stacking fault tetrahedron by moving dislocations," J. Nucl. Mater., vol. 329-333, No. 1-3 Part B, pp. 919-923, 2004.

F. Martin, P. Muralt, M.-A. Dubois, and A. Pezous, "Thickness dependence of the properties of highly c-axis textured AlN thin films," J. Vac. Sci. Technol. A Vacuum, Surfaces, Film., vol. 22, No. 2, pp. 361-365, 2004.

A. C. Diebold, S. W. Steinhauser, R. P. Mariella, J. Marti, F. Reidinger, and R. F. Antrim, "Growth and characterization of GaAs on sapphire (0001) by molecular beam epitaxy," Surf. Interface Anal., vol. 15, No. 2, pp. 150-158, 1990.

J. Wang et al., "Extremely Low-Threshold Current Density InGaAs/AlGaAs Quantum-Well Lasers on Silicon," J. Light. Technol., vol. 33, No. 15, pp. 3163-3169, 2015.

A. A. Spirina, A. G. Nastovjak, and N. L. Shwartz, "Influence of GaAs substrate properties on the congruent evaporation temperature," J. Phys. Conf. Ser., vol. 993, No. 1, 2018.

J. Van De Ven, W. J. A. M. Hartmann, and L. J. Giling, Photoluminescence studies of defects and impurities in annealed GaAs, vol. 60, No. 10. 1986.

A. A. Klochikhin, V. P. Kochereshko, and S. Tatarenko, "Influence of free carriers on exciton ground states in quantum wells," J. Lumin., vol. 154, pp. 310-315, 2014.

S. Jin, Y. Zheng, and A. Li, "Characterization of photoluminescence intensity and efficiency of free excitons in semiconductor quantum well structures," J. Appl. Phys., vol. 82, No. 8, pp. 3870-3873, 1997.

H. J. Kim, H. H. Bin Bae, Y. Park, K. Lee, and S. H. Choi, "Temperature dependence of crystalline SiGe growth on sapphire (0001) substrates by sputtering," J. Cryst. Growth, vol. 353, No. 1, pp. 124-128, 2012.

W. . Dubbelday and K. . Kavanagh, "The growth of SiGe on sapphire using rapid thermal chemical vapor deposition," J. Cryst. Growth, vol. 222, No. 1-2, pp. 20-28, Jan. 2001.

A. Sugimura, T. Hosoi, K. Ishibitsu, and T. Kawamura, "Heteroepitaxial growth of GaAs on sapphire substrates by a three-step method using low pressure MOCVD," J. Cryst. Growth, vol. 77, No. 1-3, pp. 524-529, 1986.

K. Kasai, K. Nakai, and M. Ozeki, "Material and device properties of GaAs on sapphire grown by metalorganic chemical vapor deposition," J. Appl. Phys., vol. 60, No. 1, pp. 1-5, 1986.

T. P. Humphreys et al., "Heteroepitaxial growth and characterization of GaAs on silicon-on-sapphire and sapphire substrates," Appl. Phys. Lett., vol. 54, No. 17, pp. 1687-1689, 1989.

T. F. Kuech, A. Segmüller, T. S. Kuan, and M. S. Goorsky, "Growth and properties of thin GaAs epitaxial layers on $Al_2O_3$," J. Appl. Phys., vol. 67, No. 10, pp. 6497-6506, 1990.

L. C. Chuang et al., "GaAs nanoneedles grown on sapphire," Appl. Phys. Lett., vol. 98, No. 12, pp. 98-101, 2011.

J. E. Boschker et al., "Surface reconstruction-induced coincidence lattice formation between two-dimensionally bonded materials and a three-dimensionally bonded substrate," Nano Lett., vol. 14, No. 6, pp. 3534-3538, 2014.

T. Stirner, J. Sun, and M. Aust, "Ab Initio Hartree-Fock Simulation of R-Plane Sapphire," Phys. Procedia, vol. 32, No. Aug. 2010, pp. 635-639, 2012.

J. Sun, T. Stirner, and A. Matthews, "Structure and surface energy of low-index surfaces of stoichiometric α—$Al_2O_3$ and α—$Cr_2O_3$," Surf. Coatings Technol., vol. 201, No. 7 Spec. Iss., pp. 4205-4208, 2006.

G. Madras and B. J. McCoy, "Temperature effects during Ostwald ripening," J. Chem. Phys., vol. 119, No. 3, pp. 1683-1693, 2003.

T. Van Westen and R. D. Groot, "Effect of Temperature Cycling on Ostwald Ripening," Cryst. Growth Des., vol. 18, No. 9, pp. 4952-4962, 2018.

\* cited by examiner

(b)
- Annealed at 800°C for 4s
- Ramp up to 800°C, 25°C/min
- Ramp down to 300°C, 25°C/min
- Annealed at 800°C for 4s
- Ramp up to 800°C, 25°C/min
- Ramp down to 300°C, 25°C/min
- Annealed at 800°C for 4s

(a)
- 100 nm GaAs, $T_g$=650°C
- Annealed at 800°C for Xs or TCA
- 200 nm GaAs, $T_g$=650°C
- Annealed at 800°C for Xs or TCA
- 200 nm GaAs, $T_g$=650°C
- 200 nm GaAs, $T_g$=600°C
- 5 nm AlAs, $T_g$=700°C
- $Al_2O_3$ (0001)

FIG. 42

APPARATUS FOR INTEGRATED MICROWAVE PHOTONICS ON A SAPPHIRE PLATFORM, METHOD OF FORMING SAME, AND APPLICATIONS OF SAME

CROSS-REFERENCE TO RELATED PATENT APPLICATION

This application claims priority to and the benefit of U.S. Provisional Patent Application Ser. No. 63/104,616, filed Oct. 23, 2020, which is incorporated herein in its entirety by reference.

FIELD OF THE INVENTION

This invention relates generally to microwave photonics technology, and particularly to an apparatus for integrated microwave photonics on a sapphire platform, a method of forming the same, and applications of the same.

BACKGROUND OF THE INVENTION

The background description provided herein is for the purpose of generally presenting the context of the present invention. The subject matter discussed in the background of the invention section should not be assumed to be prior art merely as a result of its mention in the background of the invention section. Similarly, a problem mentioned in the background of the invention section or associated with the subject matter of the background of the invention section should not be assumed to have been previously recognized in the prior art. The subject matter in the background of the invention section merely represents different approaches, which in and of themselves may also be inventions.

Microwave (MW) frequency lies at the higher frequency end of the radio waveband, and its frequency ranges from 300 MHz to 300 GHz, which is used for wireless and satellite communications, radar, cellular, Wi-Fi, cable television, medical imaging, and cooking. In microwave photonics (MWP) systems, laser, modulator, waveguide, and photodetector are used to modify, control, transmit, and distribute MW and millimeter-wave. The photonic technology has broadband and minimum loss facilities, which can process the complicated signal and added value to the conventional radiofrequency (RF) systems. The MWP improves the RF communication system by increasing speed, bandwidth, dynamic range, and processing capability, which opens a new window of research where extensive device integration would be possible by reducing device size, and also creates new opportunities for ICT and networks. The MWP not only bridges the fields of the RF engineering and optoelectronics but has brought considerable value to traditional microwave and photonic systems especially in defense applications. The MWP has also penetrated to a variety of civilian applications such as cellular, wireless, and satellite communications, cable television, distributed antenna systems, optical signal processing and medical imaging systems using THz waves and optical coherence tomography techniques.

However, future defense and newly emerging commercial applications of MWP call for a new generation of systems with dramatically increased speed, bandwidth, processing capability and dynamic range. Moreover, the devices need to be of small size, lightweight, low-power consumption, highly tunable, and strongly immune to electromagnetic interference. These needs call for integration of MWP elements on the same platform.

Integrated Microwave Photonics (IMWP) incorporates the functions of MWP components/subsystems in monolithic or hybrid photonic circuits and offers the promise of needed reduced size-weight-and-power (SWAP) at very low cost when manufactured in a foundry. The IMWP integrates optoelectronics and passive like Triplex™ technology in monolithic or hybrid photonic circuits, which reduces footprint, complexity and improves the light-matter interaction due to the small mode volume by the nonlinear optical process.

A recent study compared four different approaches for electronics/photonics integration on a single substrate based on performance of both active and passive devices and the ability to scale as well as the cost. The four approaches that were compared include (i) InP, (ii) silicon on insulator (SOI), (iii) heterogeneous integration of III-V on SOI and (iv) epitaxial growth of III-V on silicon. Of these four state-of-the-art approaches, it was concluded that a photonic integrated circuit using only III-V epitaxially grown on a silicon substrate offered the "competitive techno-economic and performance advantages amongst the four." The advantage of the monolithic integrated approach is that the system can leverage the existing advanced technology infrastructure behind the complementary metal-oxide-semiconductor (CMOS) industry and reduce transit times, space, weight, and over all durability issues. However, there remains significant mismatch in thermal expansion issues, a low index contrast between III-V semiconductors, a thick buffer layer, significant RF parasitics and power loss due to coupling to the substrate, and consequently misses many of the key advantages of a fully integrated microwave photonic system that has the potential to mimic the progress made in electronic circuitry.

Therefore, a heretofore unaddressed need exists in the art to address the aforementioned deficiencies and inadequacies.

SUMMARY OF THE INVENTION

One of the objectives of the invention is to provide an integrated microwave photonics on a sapphire platform, which utilizes a unique and transformative approach to integrated microwave photonics that can include RF silicon circuits and III-V semiconductor photonic components on a sapphire platform, fabricated by two methods: (1) Heterogenous integration by transfer printing; and (2) Monolithic integration by epitaxial growth that is enabled by the demonstration of high quality III-V quantum wells on sapphire. The invention will leverage the recent achievements in the growth and high optical performance of AlAs, GaAs, and InAs quantum and quantum dot semiconductors on sapphire, the large index contrast and the thermal expansion match between III-V semiconductors and sapphire, to fabricate III-V semiconductor lasers, gain elements, modulator, detector, waveguide and electronic materials, all epitaxially on sapphire. This makes possible the ideal integrated microwave photonic (IMWP) system that will provide much wider bandwidth and higher speed.

In certain embodiments, the sapphire platform can support a fully functional device that can enable the highest performance of all the needed components: (i) ready-to-go, high performance silicon on sapphire (SOS) CMOS RF circuits. (ii) high power, high efficiency, and narrow line width optical gain; (iii) thermal expansion match between sapphire and GaAs for monolithic device. (iv) high frequency, high linearity, modulators, better than thin film $LiNbO_3$ (v) high power, high linearity, and high frequency detectors; (vi) high index contrast between sapphire and GaAs and between Si3N4 for low loss passives. The rationale to utilize sapphire as the integration platform is based on integrating the highest performance laser, gain, modulator, detector, and passives; leveraging both existing microwave and III-V technology; and its potential for monolithic integration yielding low loss, low cost, and scalability.

One aspect of the present invention relates to an IMWP apparatus, which includes: a sapphire substrate having a step-terrace surface; and a III-V semiconductor circuit disposed on the sapphire substrate, comprising a III-V stack layer epitaxially grown on the sapphire substrate. In certain embodiments, the III-V stack layer includes: a first III-V layer disposed on the sapphire substrate; a low temperature (LT) III-V buffer layer disposed on the first III-V layer; a plurality of second III-V layers disposed and stacked on the LT III-V buffer layer, wherein the plurality of second III-V layers are respectively annealed; a third III-V layer disposed on the second III-V layers; a III-V quantum well layer disposed on the third III-V layers; and a fourth III-V layer disposed on the III-V quantum well layer. A growth temperature of the LT III-V layer and a growth temperature of the III-V quantum well layer are lower than a growth temperature of each of the first, second, third and fourth III-V layers.

In one embodiment, the first III-V layer is an AlAs layer, the III-V quantum well layer is an InGaAs quantum well layer, and each of the LT III-V buffer layer and the second, third and fourth III-V layers is a GaAs layer.

In one embodiment, the growth temperature of the LT III-V layer and the growth temperature of the III-V quantum well layer are 600° C., and the growth temperature of the first, second, third and fourth III-V layers is 700° C.

In one embodiment, a growth time of the III-V quantum well layer is 41 seconds, a growth time of each of the LT III-V buffer layer and the second III-V layers is 16 minutes, and a growth time of each of the third and fourth III-V layers is 8 minutes.

In one embodiment, a thickness of the first III-V layer is 5 nm, a thickness of the III-V quantum well layer is 1 nm, a thickness of each of the LT III-V buffer layer and the second III-V layers is 20 nm, and a thickness of each of the third and fourth III-V layers is 10 nm. In one embodiment, the plurality of second III-V layers are respectively annealed at an annealing temperature of 800° C. for an annealing time of 45 seconds.

In certain embodiments, the III-V semiconductor circuit further comprises a III-V circuitry disposed on the III-V stack layer. In one embodiment, the III-V circuitry comprises at least one of a III-V modulator, a III-V quantum dot (QD) amplifier, a III-V QD laser, a III-V ring resonator, a III-V detector, and integrated photonic components.

In one embodiment, the IMWP apparatus further includes a silicon on sapphire (SOS) CMOS RF circuit formed on the sapphire substrate.

Another aspect of the present invention relates to a method of forming an IMWP apparatus, which includes: providing a sapphire substrate having a step-terrace surface; and forming, by epitaxial growth, a III-V stack layer grown on the sapphire substrate by: forming a first III-V layer on the sapphire substrate; forming a low temperature (LT) III-V buffer layer on the first III-V layer; forming one second III-V layer on the LT III-V buffer layer; performing first annealing to the second III-V layer; forming another second III-V layer on the one second III-V layer; performing second annealing to the stacked second III-V layer; forming a third III-V layer on the second III-V layers; forming a III-V quantum well layer disposed on the third III-V layers; and forming a fourth III-V layer disposed on the III-V quantum well layer; wherein a growth temperature of the LT III-V layer and a growth temperature of the III-V quantum well layer are lower than a growth temperature of the first, second, third and fourth III-V layers.

In one embodiment, the first III-V layer is an AlAs layer, the III-V quantum well layer is an InGaAs quantum well layer, and each of the LT III-V buffer layer and the second, third and fourth III-V layers is a GaAs layer.

In one embodiment, the growth temperature of the LT III-V layer and the growth temperature of the III-V quantum well layer are 600° C., and the growth temperature of the first, second, third and fourth III-V layers is 700° C.

In one embodiment, a growth time of the III-V quantum well layer is 41 seconds, a growth time of each of the LT III-V buffer layer and the second III-V layers is 16 minutes, and a growth time of each of the third and fourth III-V layers is 8 minutes.

In one embodiment, a thickness of the first III-V layer is 5 nm, a thickness of the III-V quantum well layer is 1 nm, a thickness of each of the LT III-V buffer layer and the second III-V layers is 20 nm, and a thickness of each of the third and fourth III-V layers is 10 nm.

In one embodiment, the plurality of second III-V layers are respectively annealed at an annealing temperature of 800° C. for an annealing time of 45 seconds.

In certain embodiments, the method further includes: forming a III-V circuitry on the III-V stack layer, wherein the III-V stack layer and the III-V circuitry form a III-V semiconductor circuit. In one embodiment, the III-V circuitry comprises at least one of a III-V modulator, a III-V quantum dot (QD) amplifier, a III-V QD laser, a III-V ring resonator, a III-V detector, and integrated photonic components.

In one embodiment, the method further includes: forming a silicon on sapphire (SOS) CMOS RF circuit on the sapphire substrate.

In a further aspect of the present invention, an electronic device having the IMWP apparatus as disclosed above or having the IMWP apparatus formed by the method as disclosed above is provided.

These and other aspects of the present invention will become apparent from the following description of the preferred embodiments, taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. The same reference numbers may be used throughout the drawings to refer to the same or like elements in the embodiments.

peak; (c) Raman spectra of these samples with homoepitaxial GaAs (111)A sample, arrows pointing the GaAs longitudinal optical (LO) phonon peaks of these three samples show the gradual shift of LO peak from homoepitaxial GaAs, TO stands for transverse optical phonon peak; and (d) phi-scan of (220) plane for these three samples showing the twinning in GaAs film, according to certain embodiments of the invention.

Figure 36:
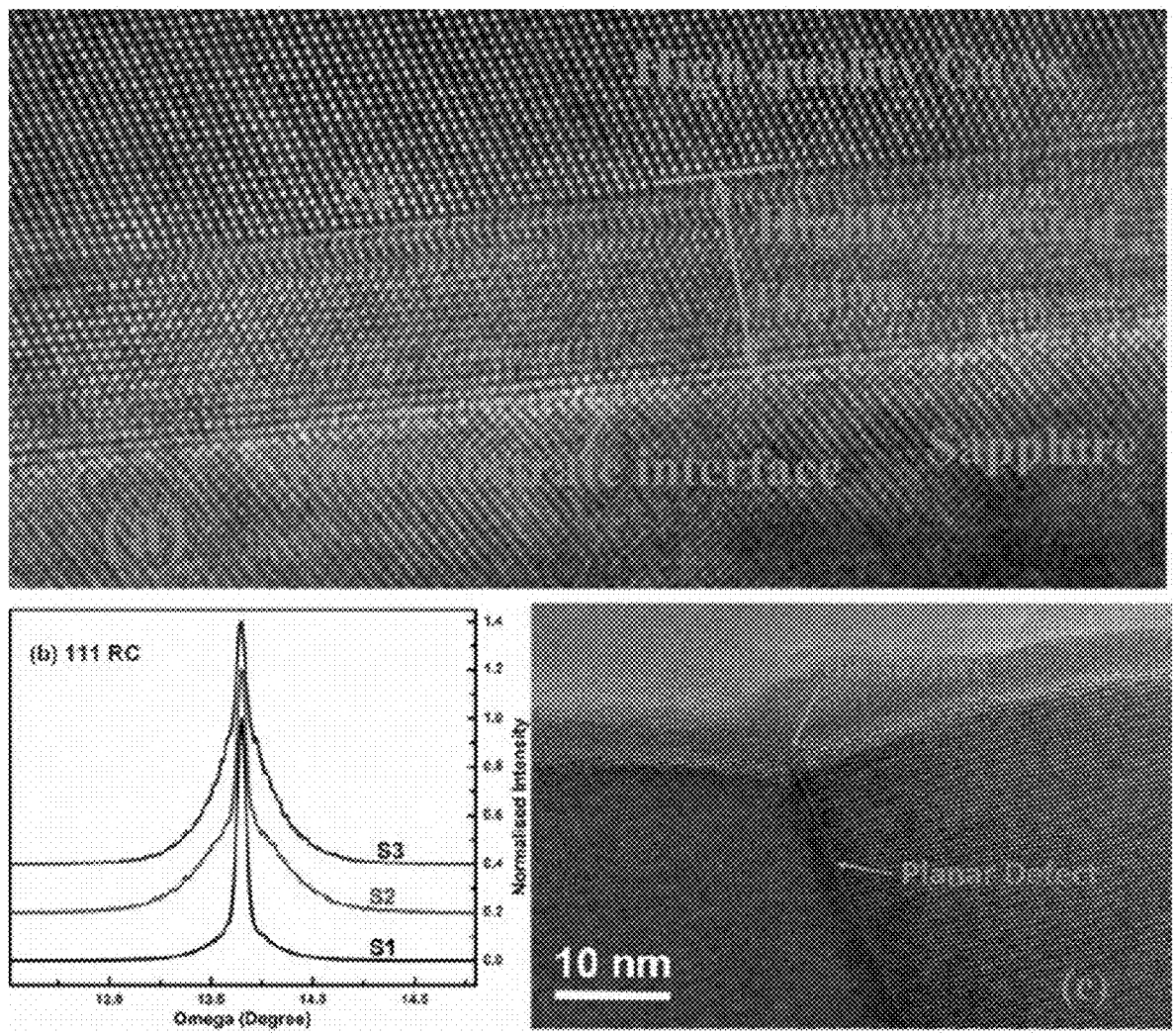

FIG. 36 shows (a) cross-sectional HRTEM image of Si near film/substrate interface, SF is the abbreviation for stacking fault; (b) RC of all three samples (c) HRTEM image showing the formation of a pit on the surface due to extended defect, according to certain embodiments of the invention.

Figure 37:
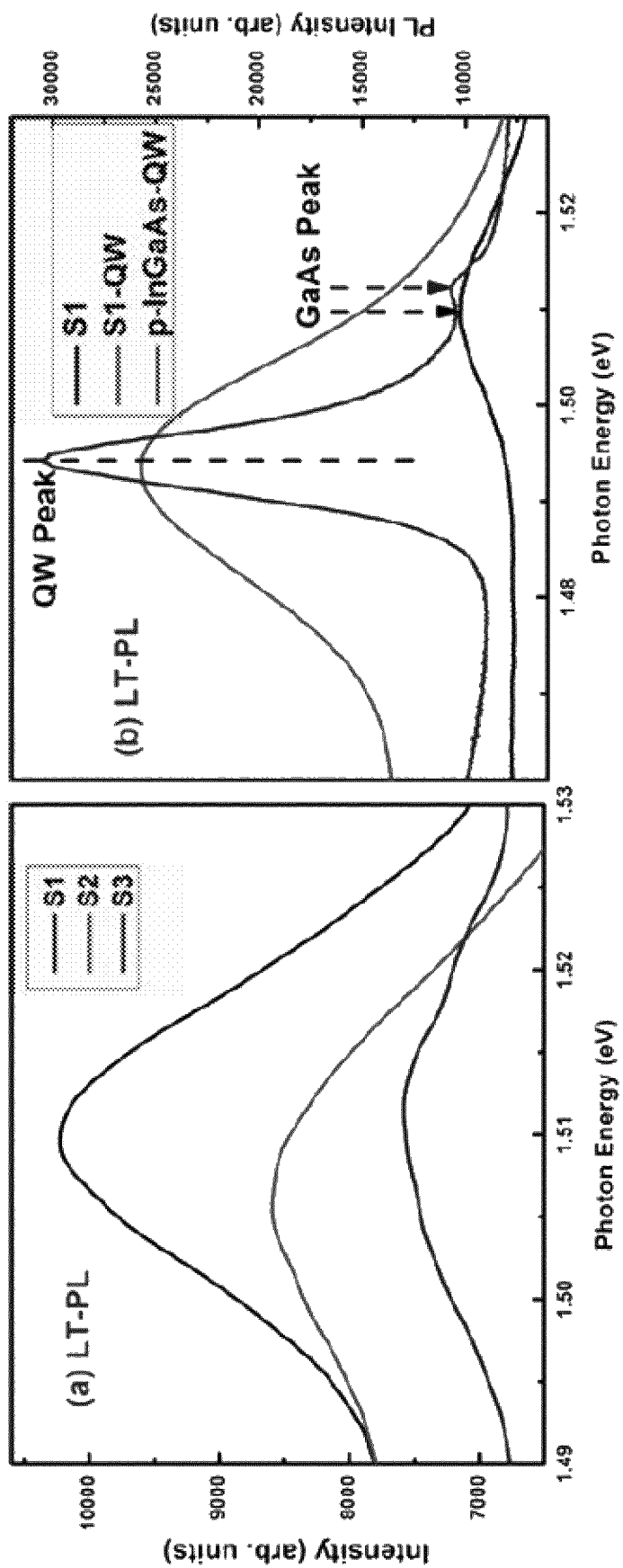

FIG. 37 shows (a) PL spectra of samples having three different thicknesses of LT layer and (b) PL of GaAs buffer (Si), InGaAs QW on sapphire (S1-QW), and InGaAs QW on GaAs substrate (p-InGaAs-QW) according to certain embodiments of the invention.

Figure 38:
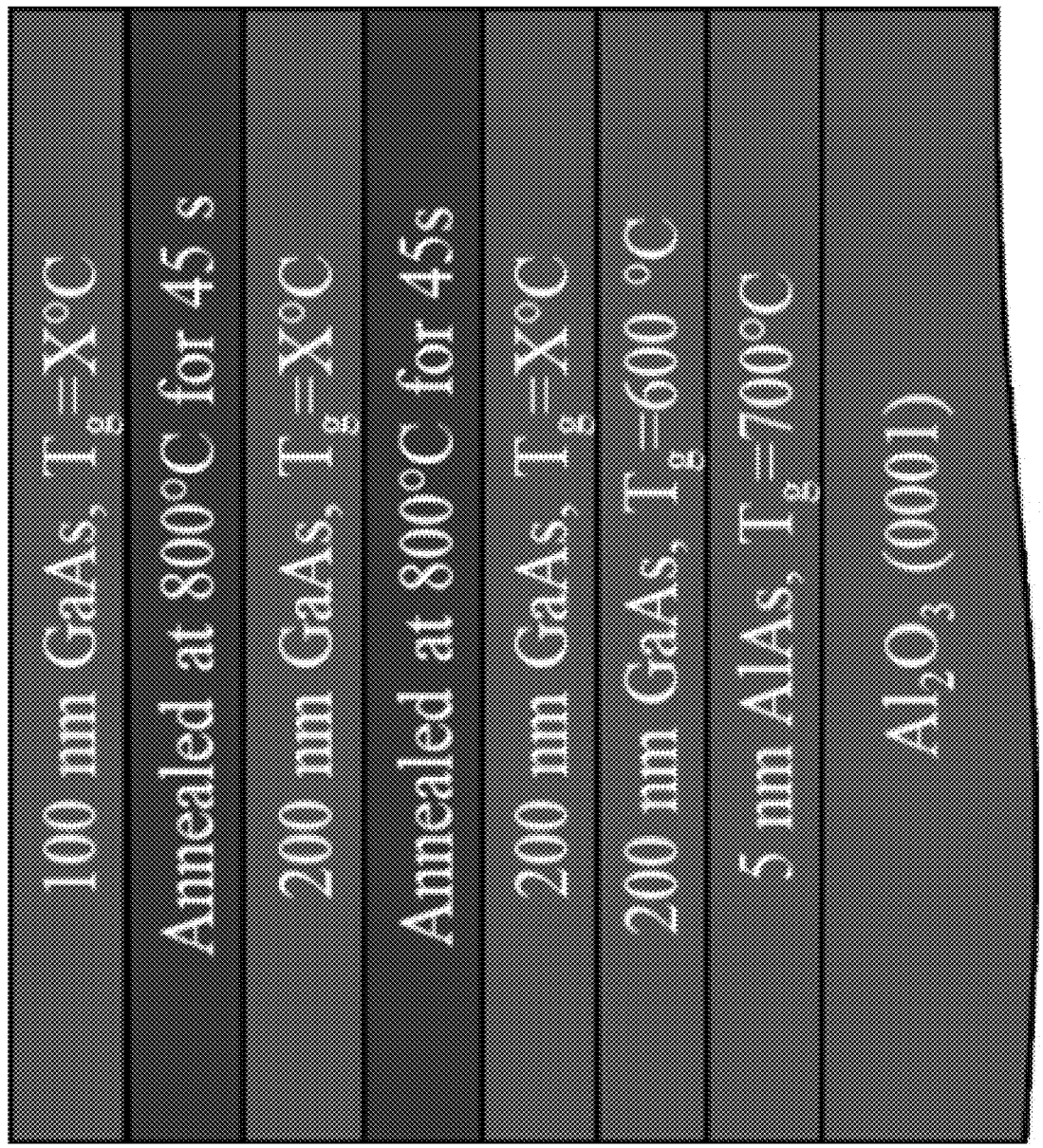

FIG. 38 shows schematically a sample structure according to certain embodiments of the invention.

Figure 39:
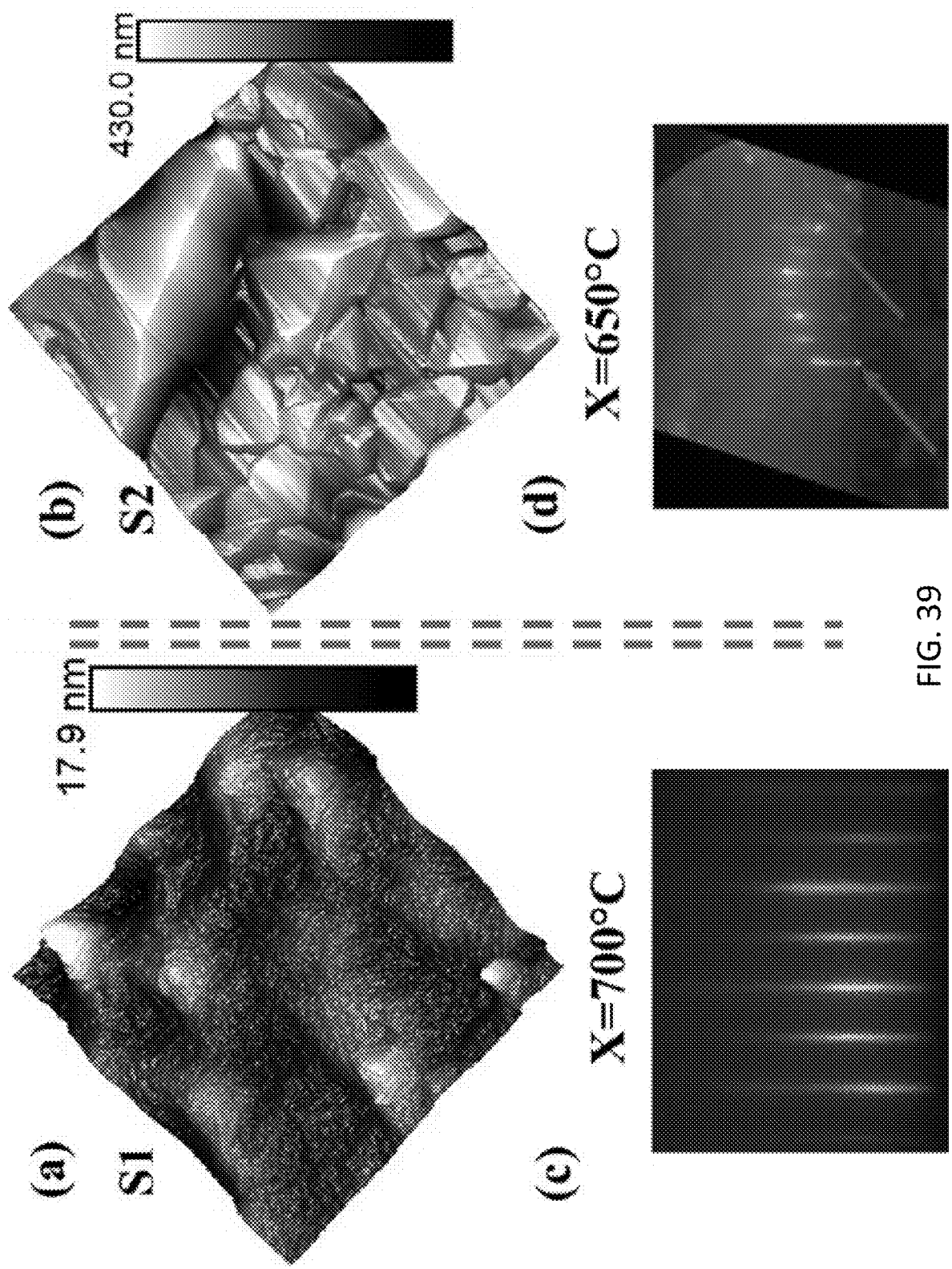

FIG. 39 shows surface morphologies of the samples grown at (a) 650° C. and (c) 700° C., and real time growth image after the growth at (b) 650° C. and (d) 700° C. according to certain embodiments of the invention.

Figure 40:
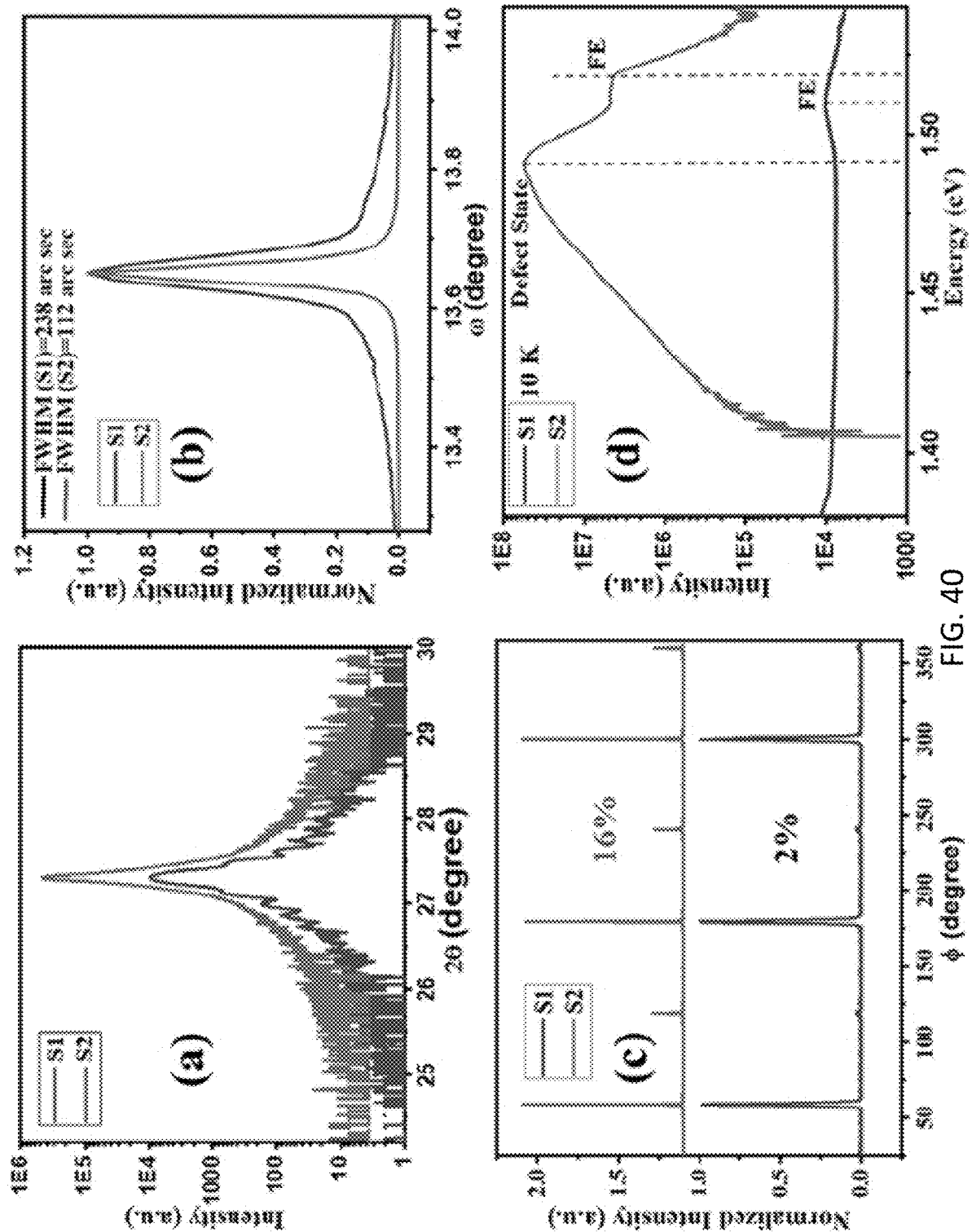

FIG. 40 shows (a) only (111) crystal orientation is observed in out of plane measurements; (b) Sample S2 shows the lowest FWHM; (c) Phi scan shows the twinning on both samples; (d) PL measurements of both samples at 10 K, according to certain embodiments of the invention.

Figure 41:
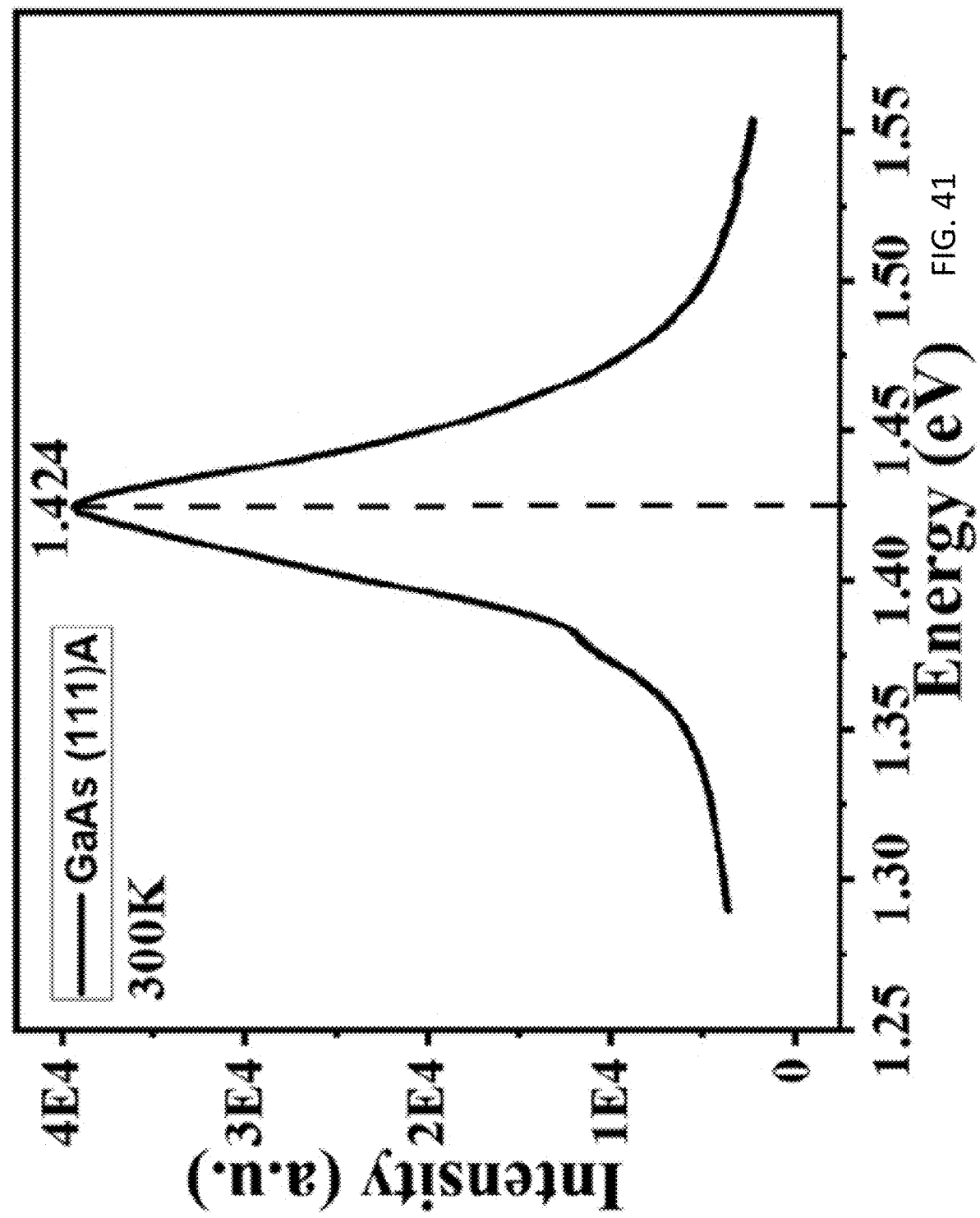

FIG. 41 shows room temperature PL from sample S2 according to certain embodiments of the invention.

FIG. 42 shows schematically (a) samples A1, A2 and A3; and (b) TCA steps according to certain embodiments of the invention.

Figure 43:
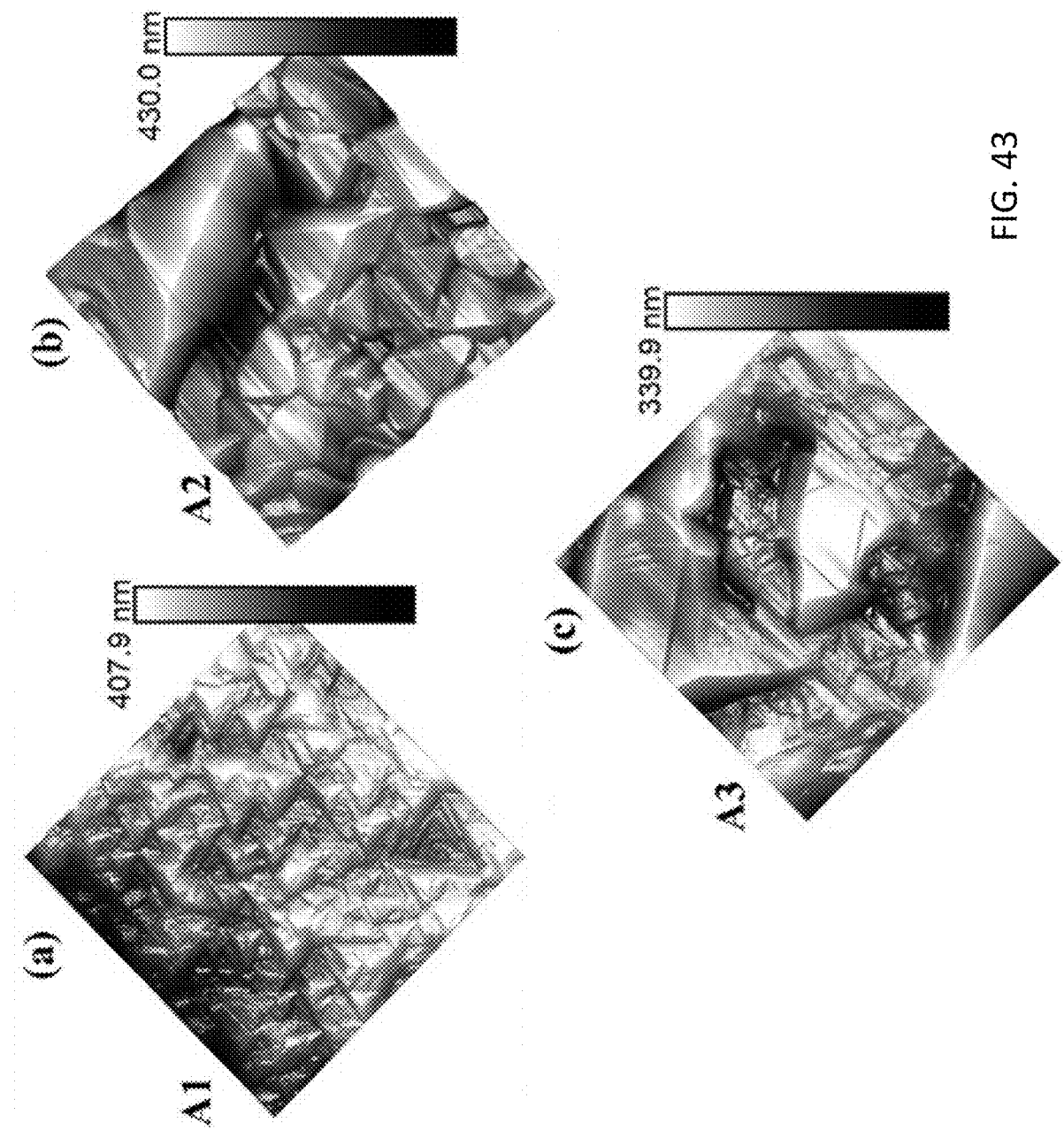

FIG. 43 shows AFM images of samples grown (a) without annealing, (b) two times annealing, and (c) TCA according to certain embodiments of the invention.

Figure 44:
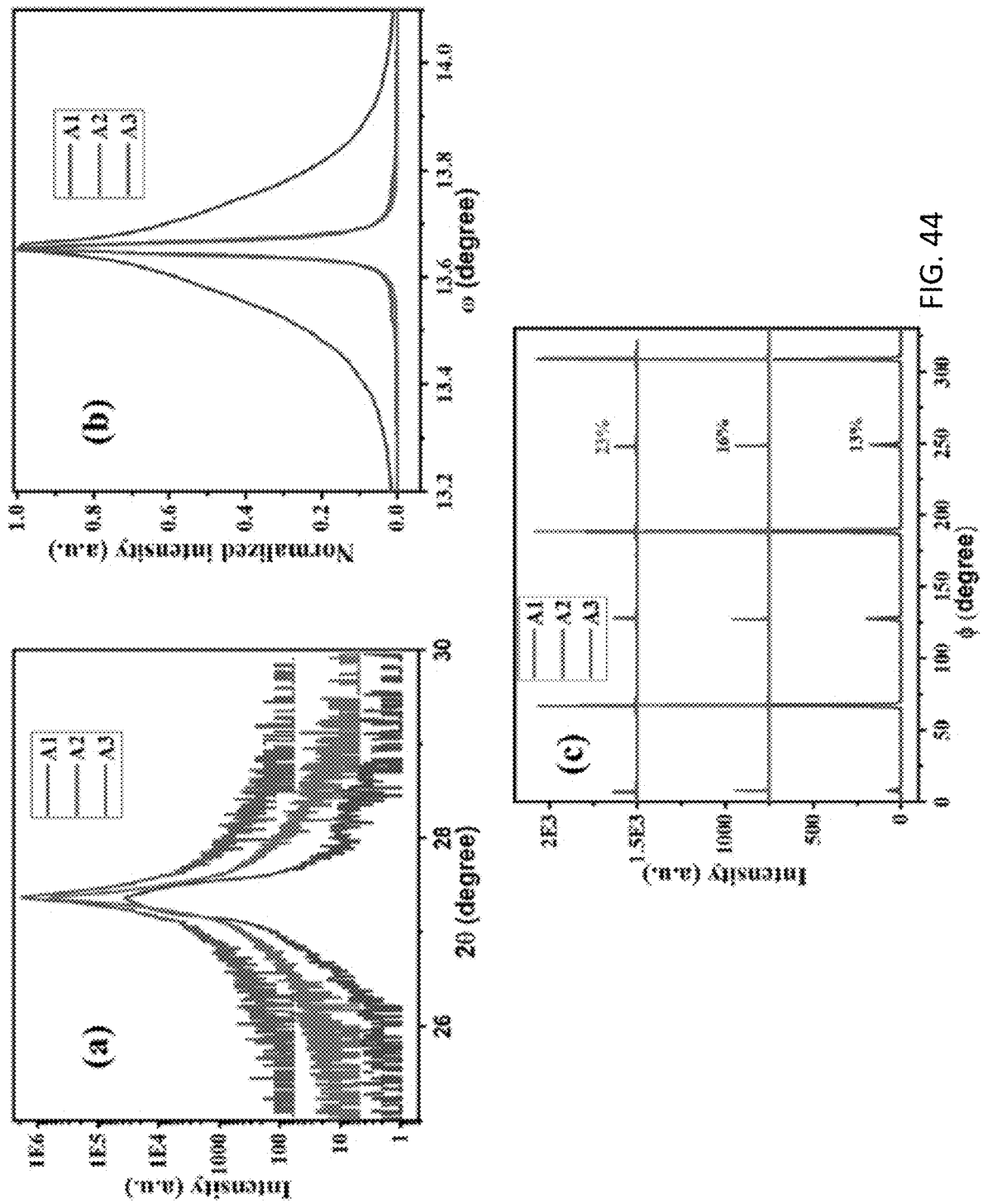

FIG. 44 shows (a) Out of plane orientation confirmed only (111) single crystal orientation; (b) sample A1 shows the highest FWHM from the rocking curve measurements; (c) Twinning is observed from all samples; (d) RT PL emission from A1, A2 and A3 samples according to certain embodiments of the invention.

Figure 45:
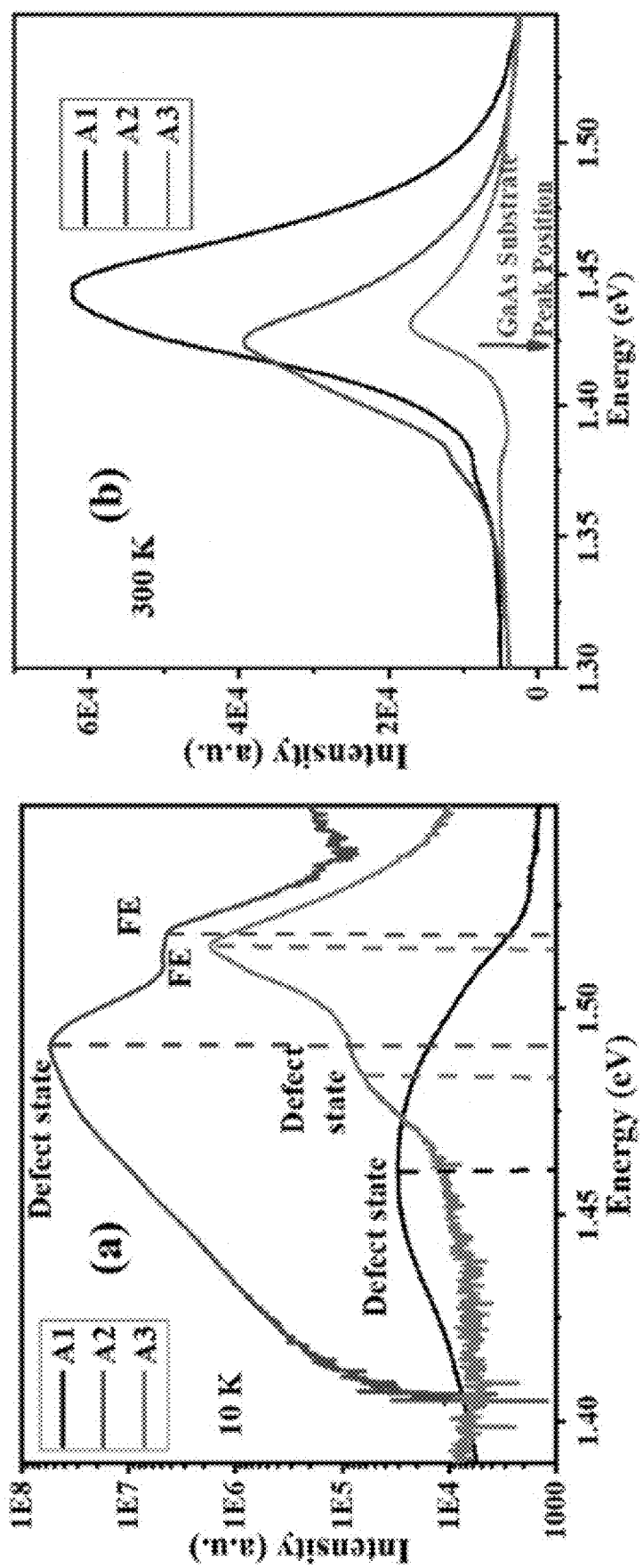

FIG. 45 shows PL measurements of samples A1, A2 and A3 at (a) LT, (b) RT according to certain embodiments of the invention.

Figure 46:
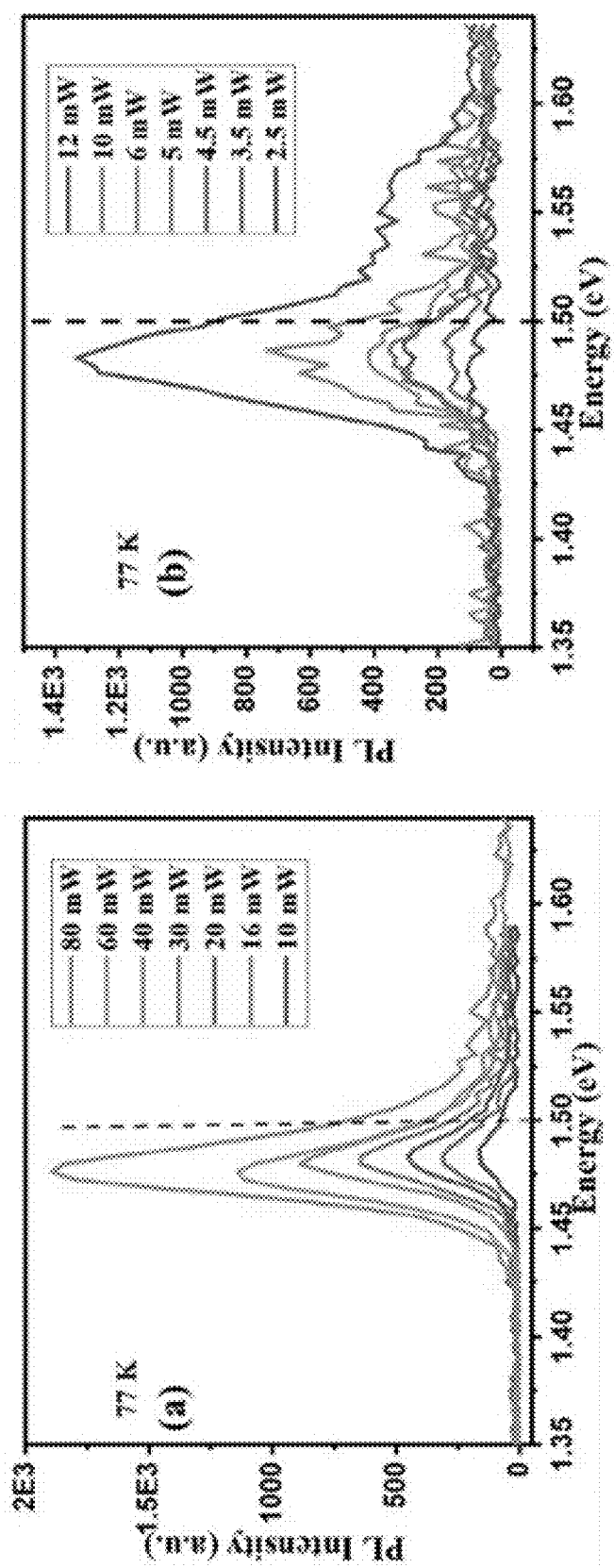

FIG. 46 shows power dependent PL spectra for two lasers (a) 532 nm cw; (b) 700 nm fs according to certain embodiments of the invention.

Figure 47:
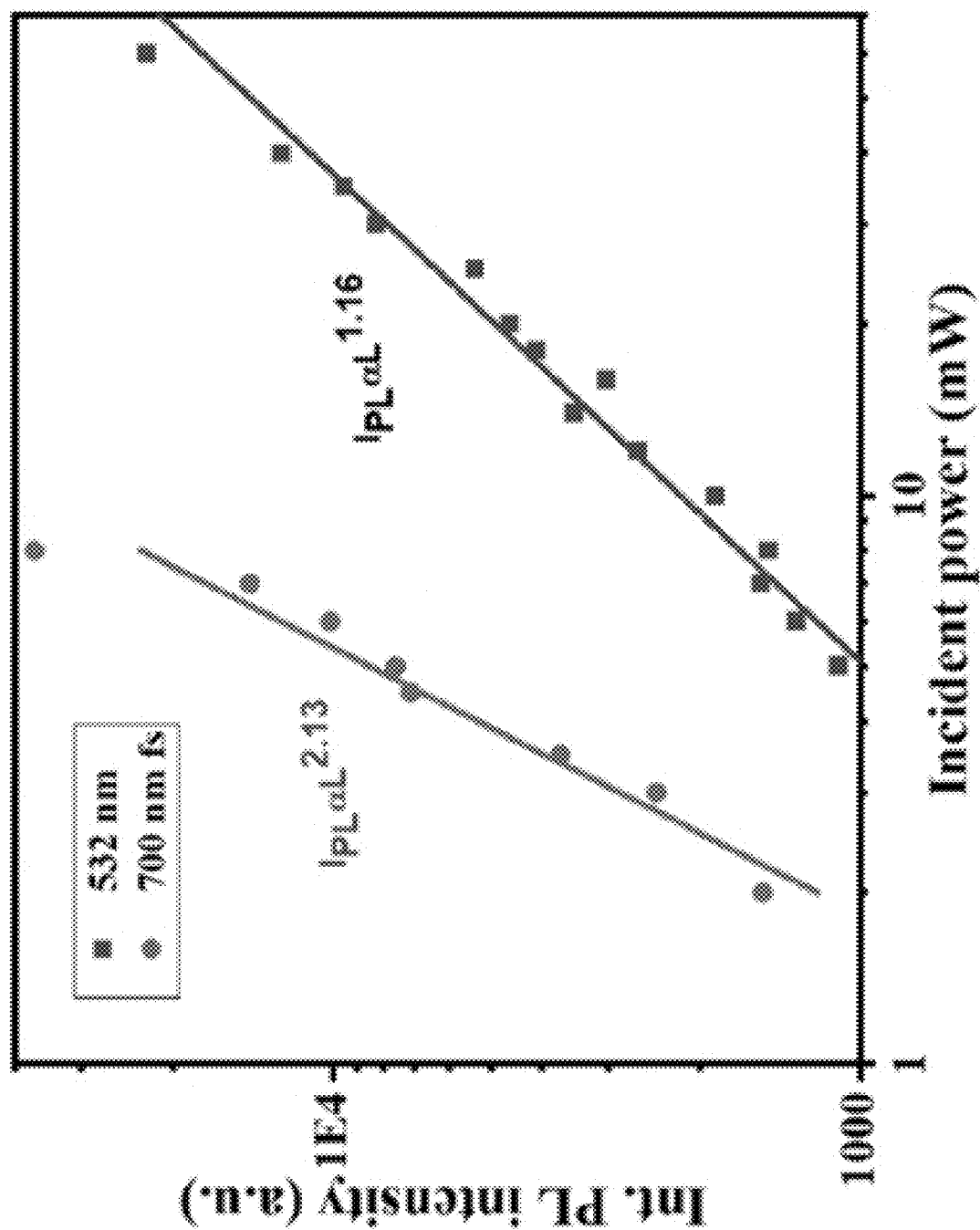

FIG. 47 shows integrated PL intensity vs incident power for two cw laser and pulsed laser according to certain embodiments of the invention.

Figure 48:
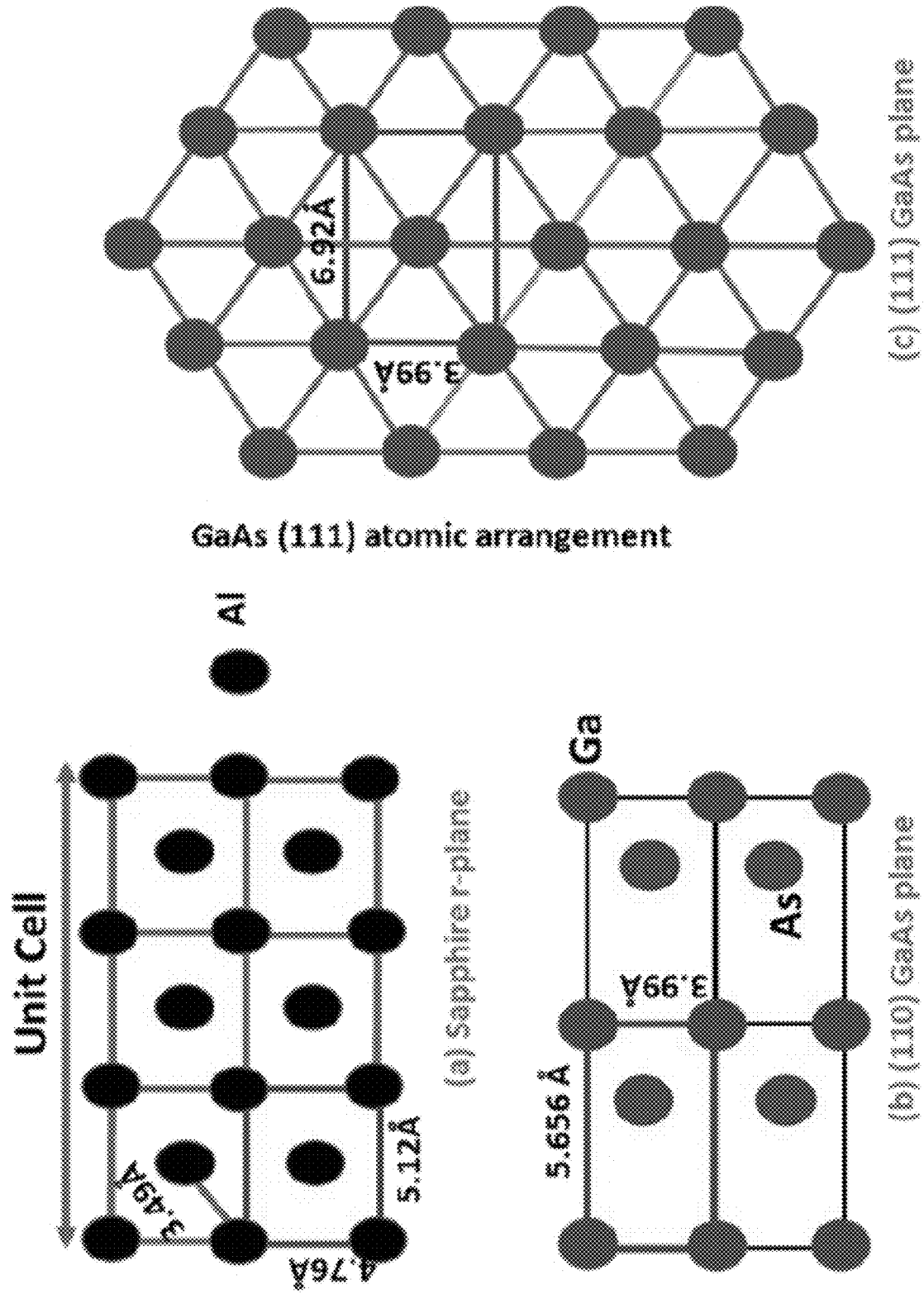

FIG. 48 shows schematically atomic arrangements of (a) r-plane sapphire, (b) GaAs (110) plane, and (c) GaAs (111) plane according to certain embodiments of the invention.

Figure 49:
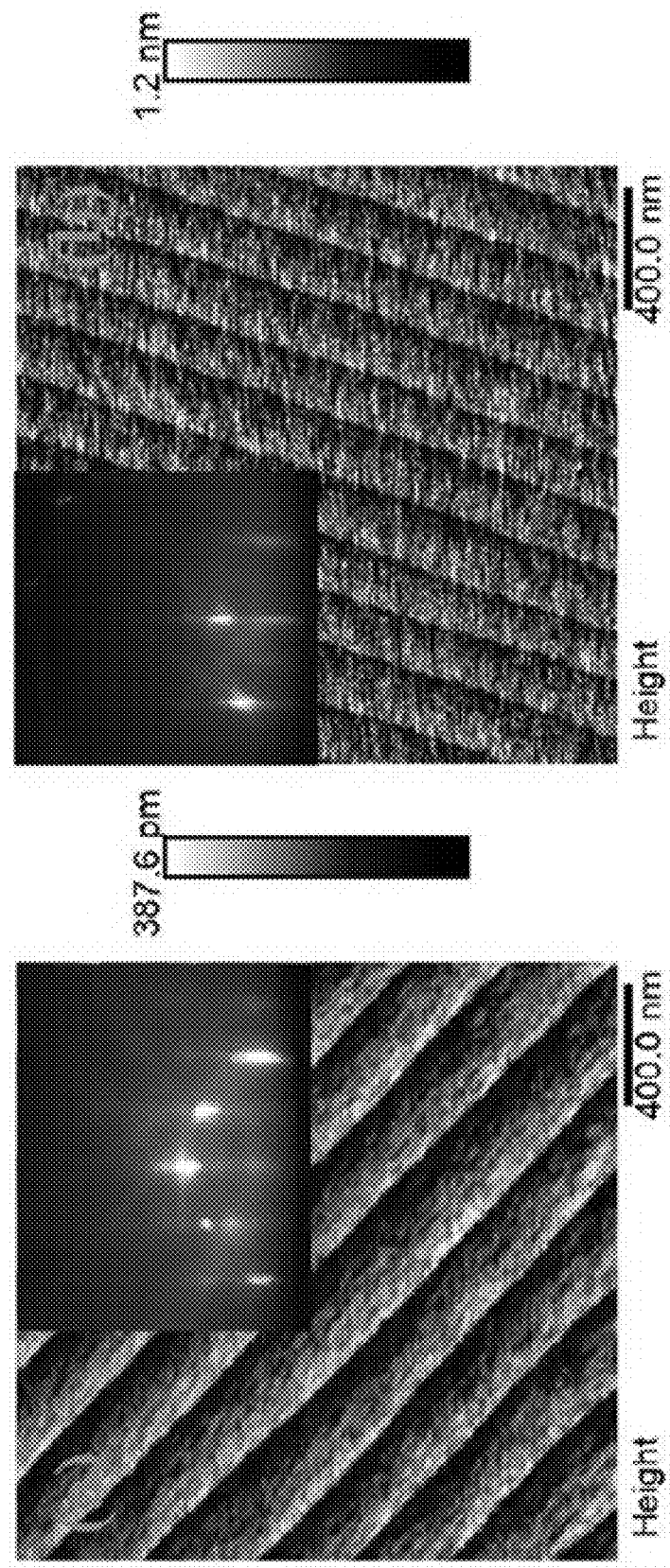

FIG. 49 shows AFM images of (a) c plane and (b) r plane sapphire substrates according to certain embodiments of the invention.

Figure 50:
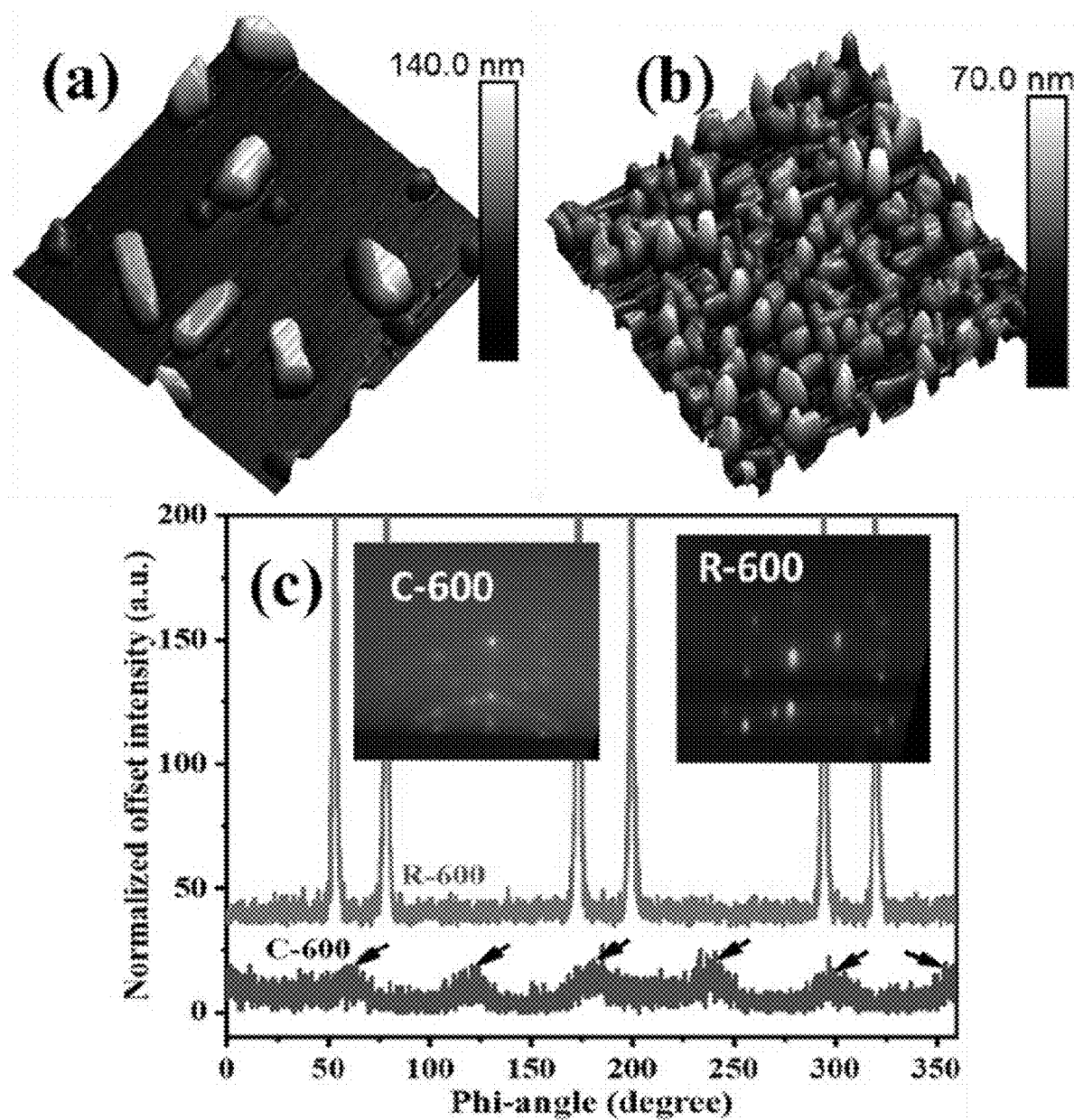

FIG. 50 shows AFM Surface morphology on 2 μm×2 μm scan area of 10 nm GaAs growth on (a) c-plane (C-600) and (b) r-plane sapphire substrate (R-600); (c) Phi-scans of both samples according to certain embodiments of the invention, where arrows showing GaAs (220) peaks, corresponding RHEED images after the growth are shown in the inset of figure.

Figure 51:
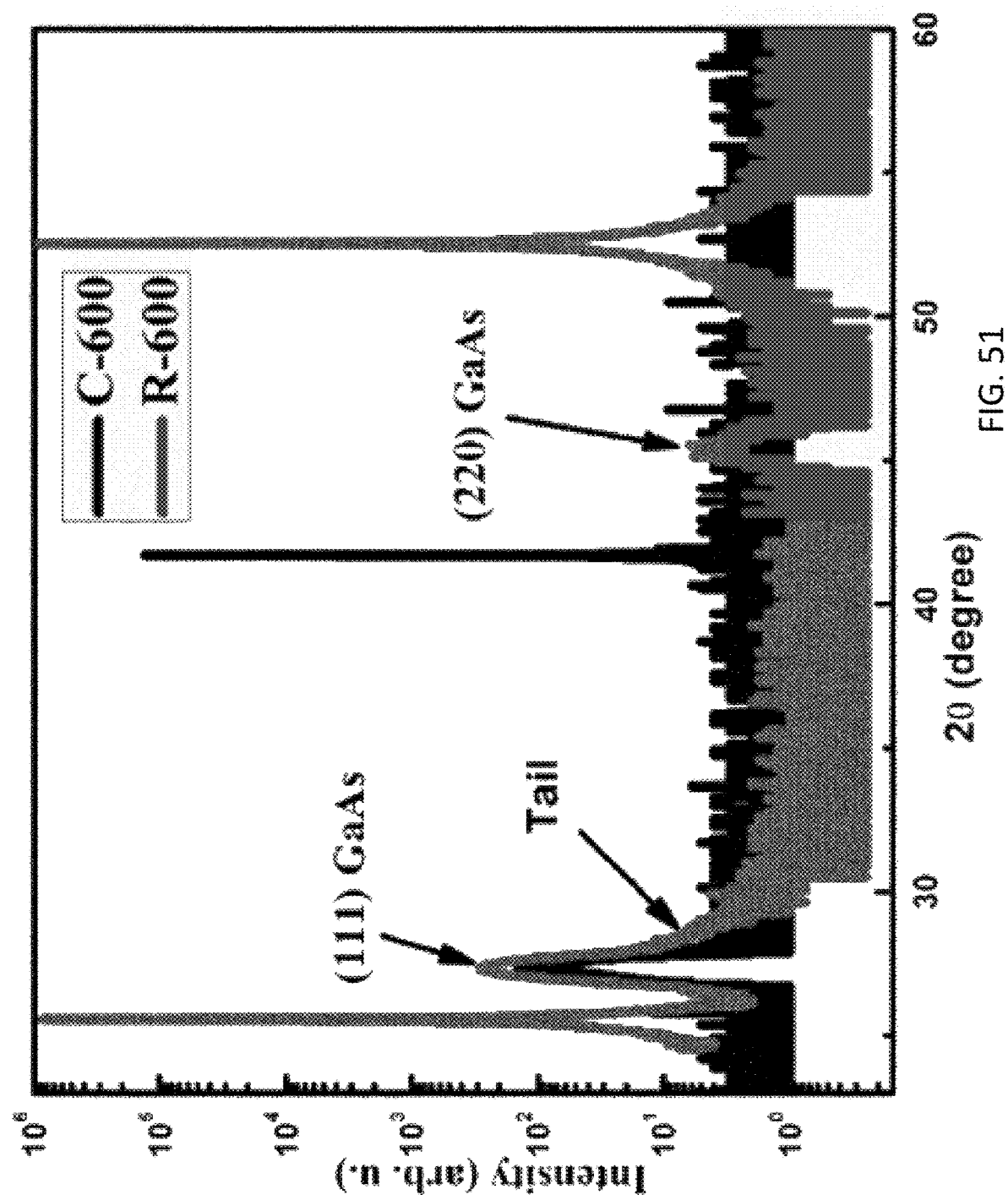

FIG. 51 shows XRD omega-2theta scan of C-600 and R-600 according to certain embodiments of the invention.

Figure 52:
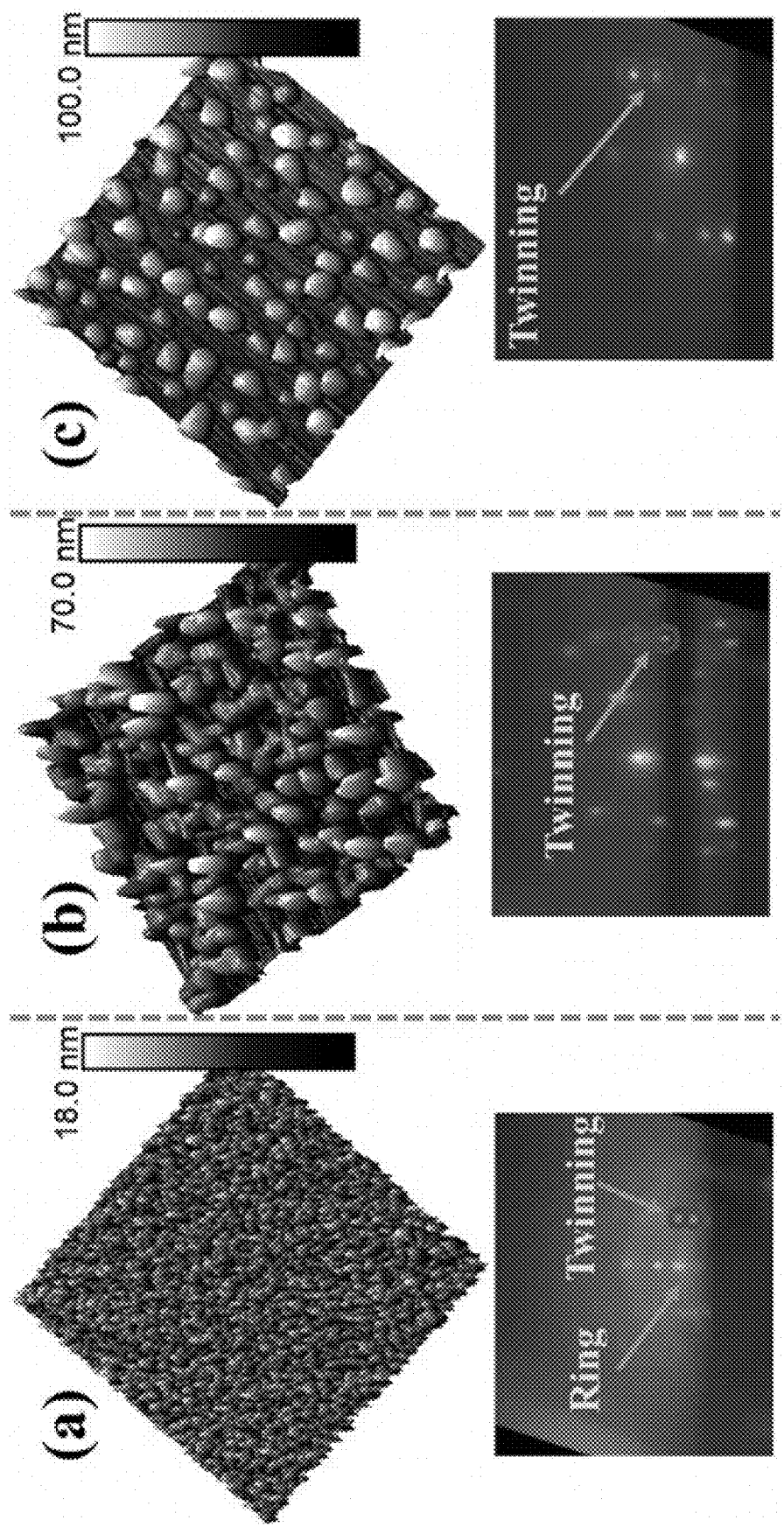

FIG. 52 shows AFM and RHEED of (a) R-500 (b) R-600 (c) R-650 according to certain embodiments of the invention.

Figure 53:
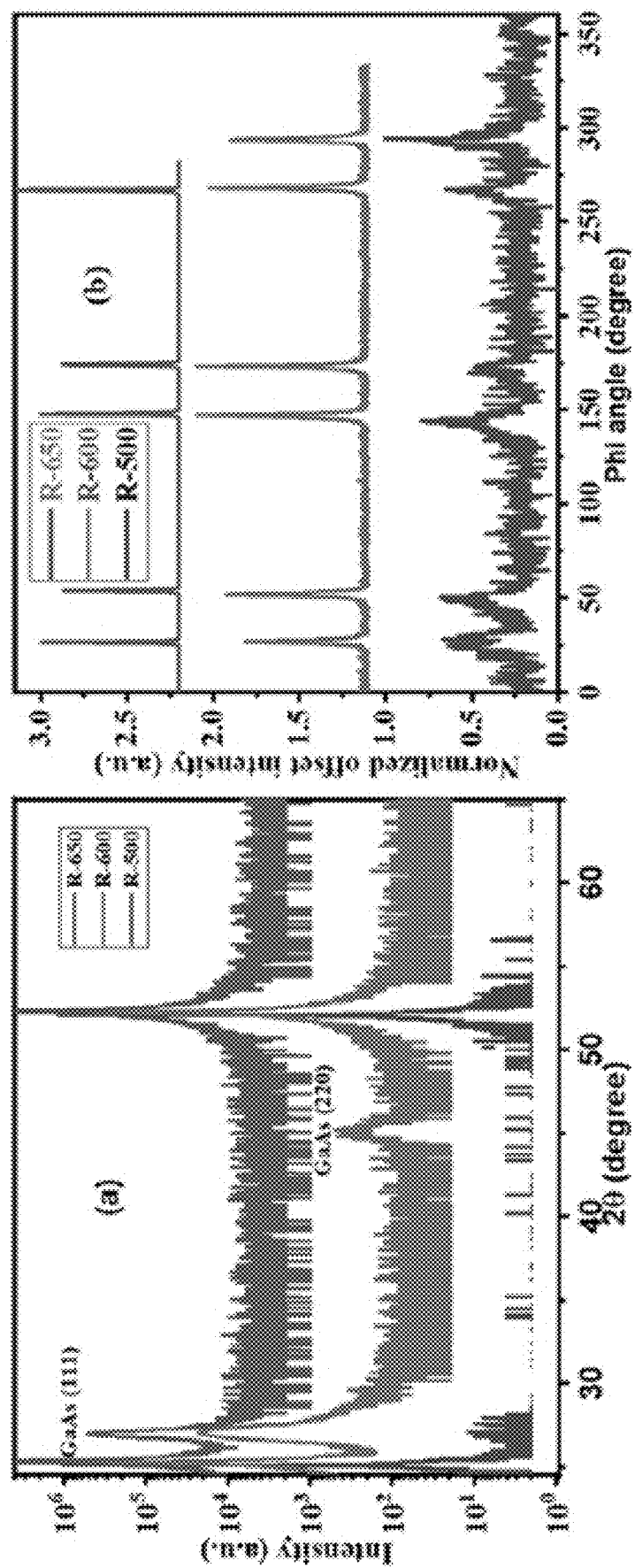

FIG. 53 shows (a) Omega-2theta scan of R-500, R-600 and R650; (b) phi-scan of R-600 and R-650 according to certain embodiments of the invention.

Figure 54:
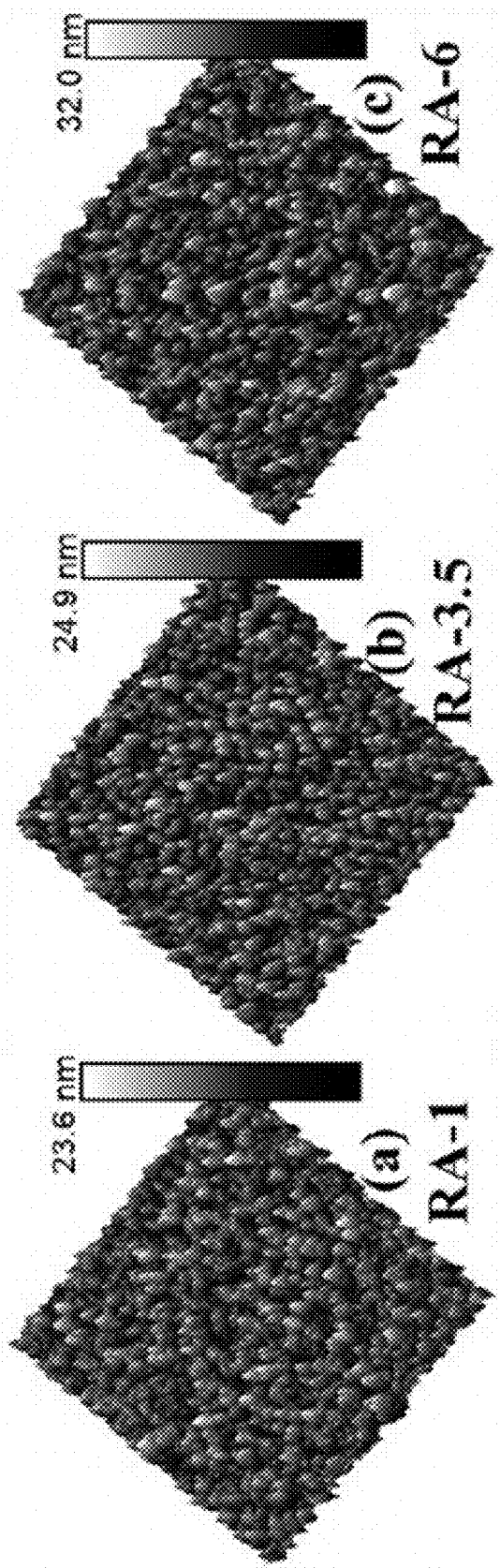

FIG. 54 shows AFM surface morphology of (a) RA-1 (b) RA-3.5 (c) RA-6 according to certain embodiments of the invention.

Figure 55:
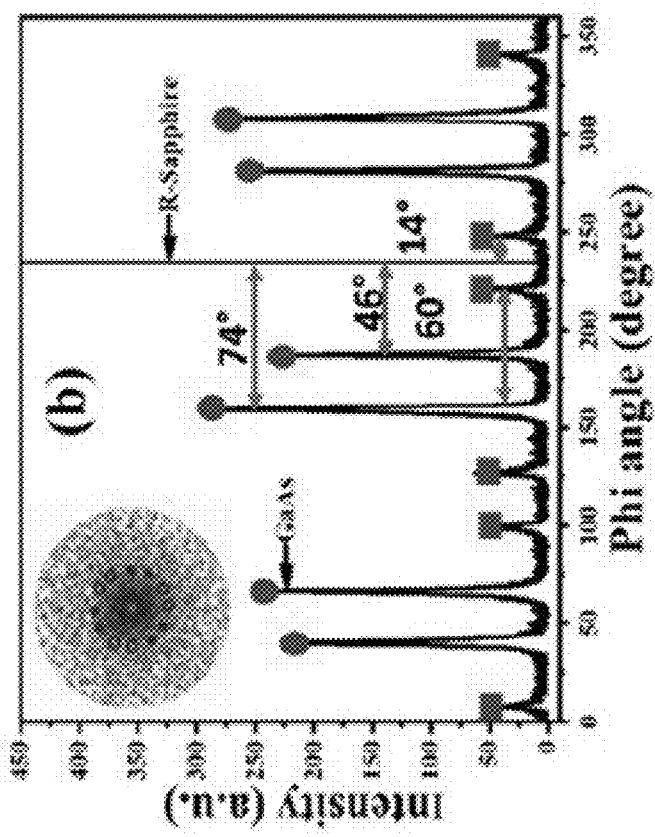
Figure 55:
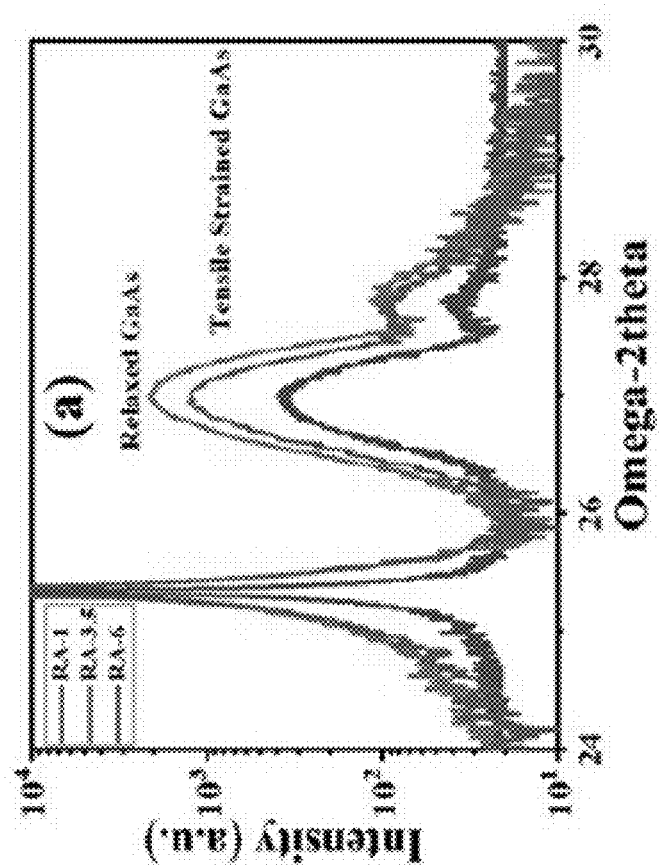

FIG. 55 shows (a) Omega-2theta scan and (b) phi-scan of RA-1 according to certain embodiments of the invention.

Figure 56:
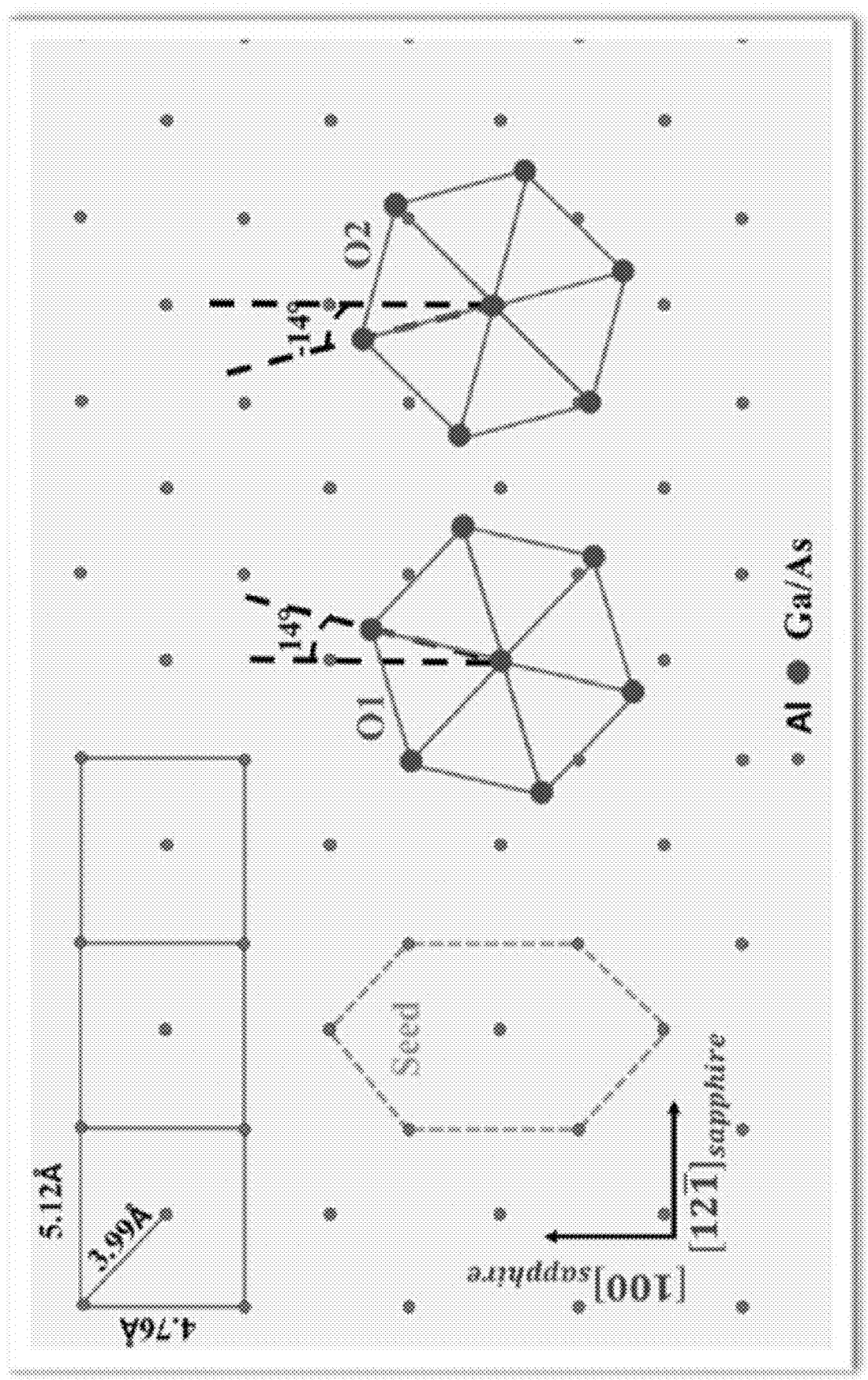

FIG. 56 shows arrangement of Al atoms in r plane sapphire (blue dots) and two possible in-plane orientations of GaAs separated by approximately 28° according to certain embodiments of the invention.

DETAILED DESCRIPTION OF THE INVENTION

The invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this invention will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

One of ordinary skill in the art will appreciate that starting materials, biological materials, reagents, synthetic methods, purification methods, analytical methods, assay methods, and biological methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the invention has been specifically disclosed by preferred embodiments and optional features, modification and variation of the concepts herein disclosed may be resorted to by those skilled in the art, and that such modifications and variations are considered to be within the scope of this invention as defined by the appended claims.

Whenever a range is given in the specification, for example, a temperature range, a time range, or a composition or concentration range, all intermediate ranges and subranges, as well as all individual values included in the ranges given are intended to be included in the invention. It will be understood that any subranges or individual values in a range or subrange that are included in the description herein can be excluded from the claims herein.

It will be understood that, as used in the description herein and throughout the claims that follow, the meaning of "a", "an", and "the" includes plural reference unless the context clearly dictates otherwise. Thus, for example, reference to "a cell" includes a plurality of such cells and equivalents thereof known to those skilled in the art. As well, the terms "a" (or "an"), "one or more" and "at least one" can be used interchangeably herein. It is also to be noted that the terms "comprising", "including", and "having" can be used interchangeably.

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It will be further understood that the terms "comprises" and/or "comprising", or "includes" and/or "including", or "has" and/or "having", or "carry" and/or "carrying", or "contain" and/or "containing", or "involve" and/or "involving", "characterized by", and the like are to be open-ended, i.e., to mean including but not limited to. When used in this disclosure, they specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

As used in the disclosure, "around", "about", "approximately" or "substantially" shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated.

As used in the disclosure, the phrase "at least one of A, B, and C" should be construed to mean a logical (A or B or C), using a non-exclusive logical OR. As used herein, the term "and/or" includes any and all combinations of one or more of the associated listed items.

Embodiments of the invention are illustrated in detail hereinafter with reference to accompanying drawings. The description below is merely illustrative in nature and is in no way intended to limit the invention, its application, or uses. The broad teachings of the invention can be implemented in a variety of forms. Therefore, while this invention includes particular examples, the true scope of the invention should not be so limited since other modifications will become apparent upon a study of the drawings, the specification, and the following claims. For purposes of clarity, the same reference numbers will be used in the drawings to identify similar elements. It should be understood that one or more steps within a method may be executed in different order (or concurrently) without altering the principles of the invention.

Figure 1:
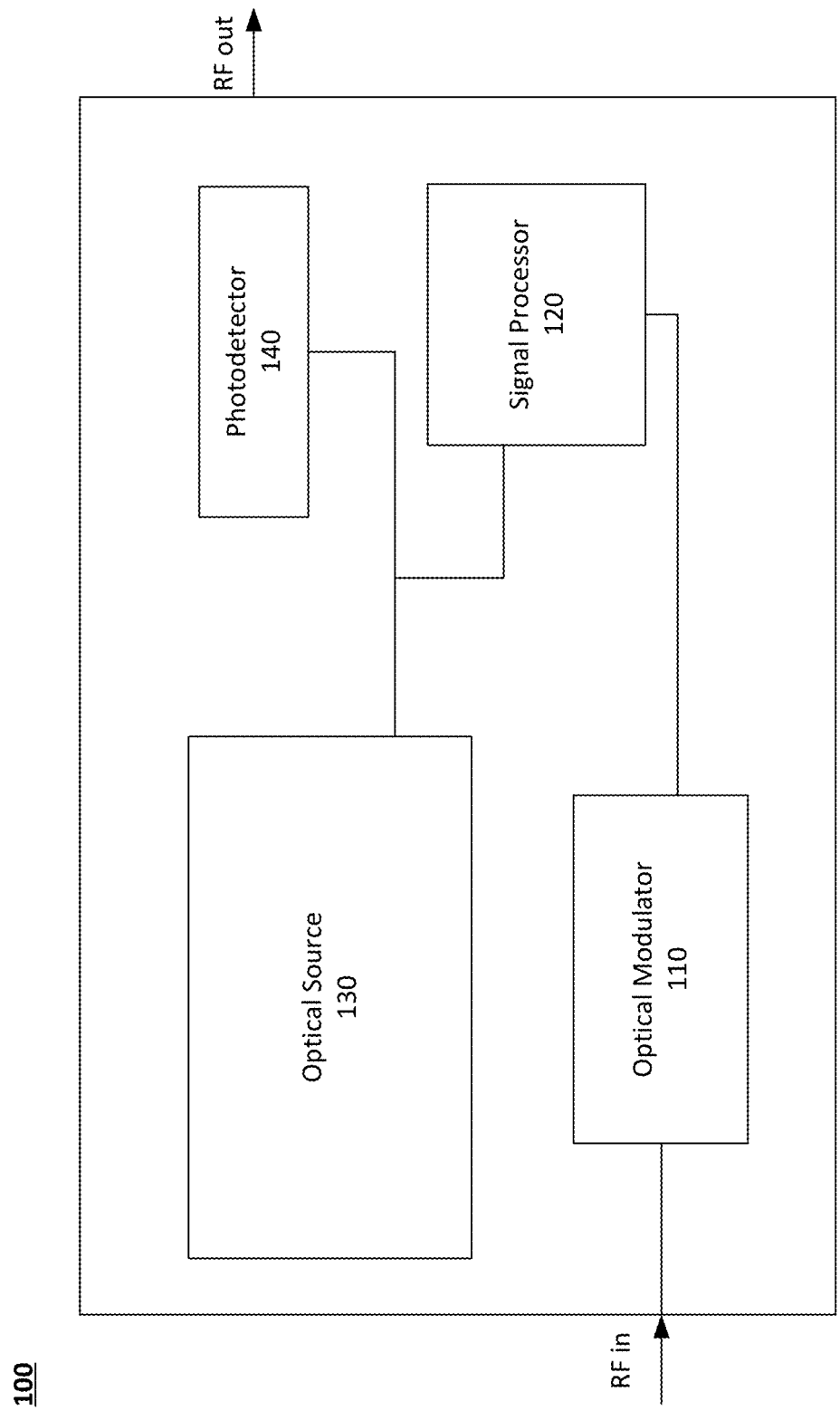
FIG. 1 shows schematically an IMWP system according to certain embodiments of the invention.

As discussed above, the IMWP integrates optoelectronics and passive like Triplex™ technology in monolithic or hybrid photonic circuits, which reduces footprint, complexity and improves the light-matter interaction due to the small mode volume by the nonlinear optical process. For example, FIG. 1 shows schematically an IMWP system according to certain embodiments of the invention, where a modulator converts an RF wave to an optical signal and a continuous wave laser is modulated according to the RF wave. The modulator is connected with an optical signal processor by a waveguide where the processing task is being executed. Then the processed signal is transferred to a photodetector and converted into an electrical signal. An RF receiver, which is not shown in FIG. 1, extracts the information from the electrical signal.

In the last ten years, mainly three key platforms have been focused for the monolithic integration of MWP circuits:

Indium Phosphide (InP), silicon-on-insulator (SOI), and silicon nitride (Si3N4). Every platform has its strengths and weaknesses. InP is a desirable and complex platform because it is the only platform where monolithic integration of active and passive components, including lasers, modulators, tunable devices, optical amplifiers, and photodetectors, is possible. However, the propagation loss in InP optical waveguides is relatively high of the order of 1.5-3 dB/cm. Si photonics compatibility with Complementary Metal Oxide Semiconductor (CMOS) fabrication process and the high refractive index contrast between Si and $SiO_2$, which offer strong optical confinement give the real possibility of electronic-photonic co-integration. Si photonics have matured optical components such as optical modulators, waveguides, and photodetectors. The main hurdle for Si photonics is its poor light emission property. Triplex™ is a well-known technology for low loss passive components like waveguide fabrication. The alternating well defined and highly stable silicon nitride $Si_3N_4$ and $SiO_2$ are used in Triplex™ technology. The CMOS compatible $Si_3N_4$ and $SiO_2$ waveguide are gaining popularity because of ultra-low loss operation and low-cost volume production. TriPleX™ technology provides low loss on silicon and glass substrates in the broad wavelength range between 405 nm up to 2.35 μm. For the integration optical sources, modulators, amplifiers, and detectors integration TriPleX™ platform relies on InP. However, individual platforms are still not matured enough for the full integration of IMWP. Therefore, researchers have been looking for a suitable and alternate platform where a hybrid or monolithic integration is possible.

Therefore, the inventors propose highly resistive and optically transparent from UV to IR sapphire as a 3D IMWP platform, where laser source, modulator, waveguide, photodetector, and RF circuits can be monolithically fabricated by utilizing current technology to form an IMWP apparatus.

Figure 2:
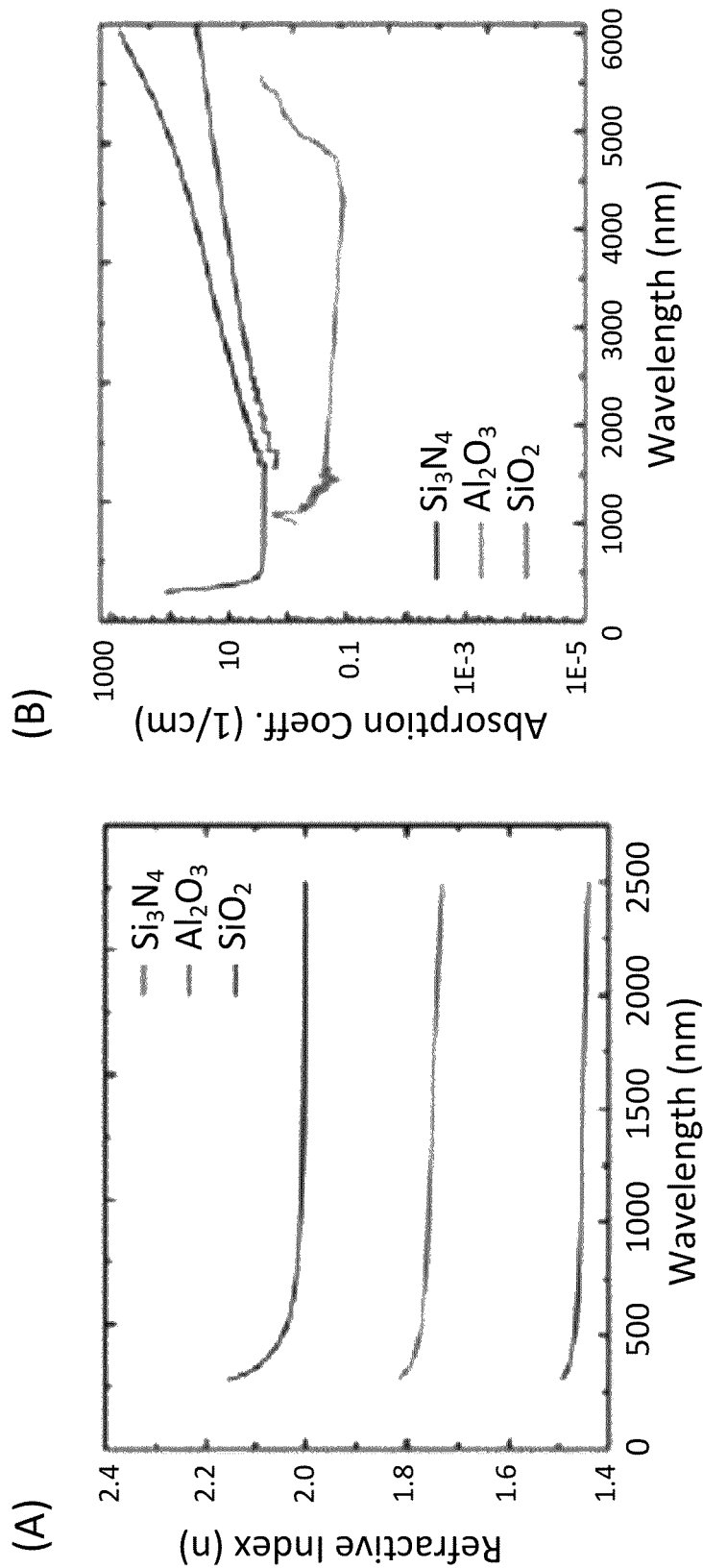
FIG. 2 shows comparisons of (A) refractive index and (B) absorption coefficient for $Si_3N_4$, sapphire (Al2O3) and $SiO_2$ according to certain embodiments of the invention.

There are several reasons for the consideration of sapphire as a platform for IMWP. The CMOS compatible Si on sapphire (SOS) is a matured technology, which can embrace all the features of Si photonics and RF high-frequency circuit technology featuring low power consumption. TriPleX™ is also a technology for the low loss (0.1 db/cm down to 0.1 db/m) passive components which covers a wide wavelength range and is widely used in MWP, visible light applications, and sensors. The high refractive index contrast and the low material absorption is prerequisite for optical confinement and low loss passive components. In both cases, sapphire substrates can be a good competitor for the quartz substrates in TriPleX™ technology. The comparison of refractive index and absorption coefficient for $Si_3N_4$, $SiO_2$, and sapphire is shown in FIG. 2. As shown in FIG. 2, the refractive index difference between sapphire and $Si_3N_4$ is 0.3, which is sufficient for building a tightly confined waveguide. For optical loss, sapphire is a transparent material, and its absorption coefficient is very low.

For optoelectronics, the sapphire platform relies on III-V monolithic growth. The growth of III-V, especially GaAs and GaSb on sapphire, is a challenging task because of high lattice mismatch and different crystal structures (GaAs, GaSb-Zinc blende, and sapphire-hexagonal). For the high-quality crystal growth, a similar thermal expansion coefficient of film and substrate is significant because it does not give any extra crack or defects during the cooling of the film. The thermal expansion coefficient of GaAs (5.73E-6 $K^{-1}$) and GaSb (7.75E-6 $K^{-1}$) is closely matched to sapphire (6.66E-6 $K^{-1}$ parallel to the optical axis and 5E-6 $K^{-1}$ perpendicular to optical axis). With a sophisticated crystal growth technique, it could be feasible to grow high lattice mismatch III-V thin film on foreign substrates.

Figure 3:
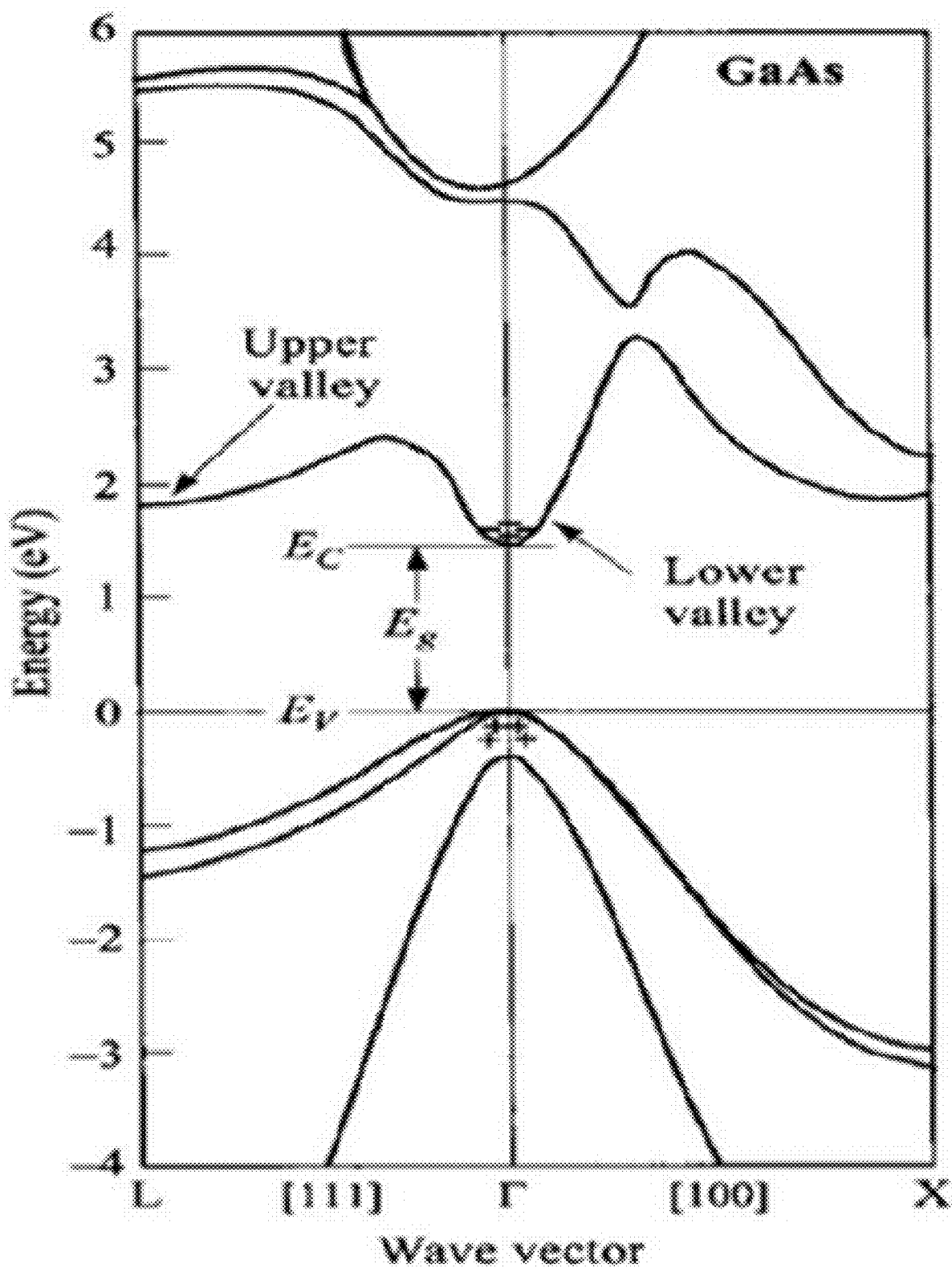
FIG. 3 shows an energy band diagram of GaAs according to certain embodiments of the invention.

GaAs, which was first created in the 1920s is a compound semiconductor consisting of gallium (Ga) and arsenic (As) elements. GaAs has a cubic sphalerite (zinc blende) crystal structure, and the lattice constant is 5.656 Å. GaAs has a face-centered cubic (FCC) translational symmetry. The coordinate of one atom is (0,0,0), and the other atom is (1/4,1/4,1/4). GaAs is a direct band gap material. Higher electron mobility and wider direct band gap make it as an essential material for optoelectronic devices, light-emitting sources, photovoltaic devices, high power microwave, and millimeter-wave devices. The E-K diagram of GaAs direct band gap is shown in FIG. 3. The valance band's maximum energy and the lowest energy of the conduction band are at the same value of momentum. The value of the GaAs bandgap at room temperature and under normal atmospheric pressure is 1.42 eV. The bandgap value is true for high purity GaAs, and band gap becomes smaller with doping materials. The bandgap is also a function of temperature and can be written as Equation (1):

$$E_g(T) \approx E_g(0) - \frac{\alpha T^2}{T + \beta} \qquad (1)$$

where $E_g(0)$, α, β are materials constants. At T=0 K, the bandgap energy of GaAs approaches 1.52 eV. The optical properties of GaAs can be changed by incorporating materials like In, Al. This allows bandgap tuning and introduces new electrical and optical properties to the materials. For example, ternary alloy Ga1-xInxAs band gap can be adjusted over an energy range to adjust the low attenuation region of many optical fibers.

Figure 4:
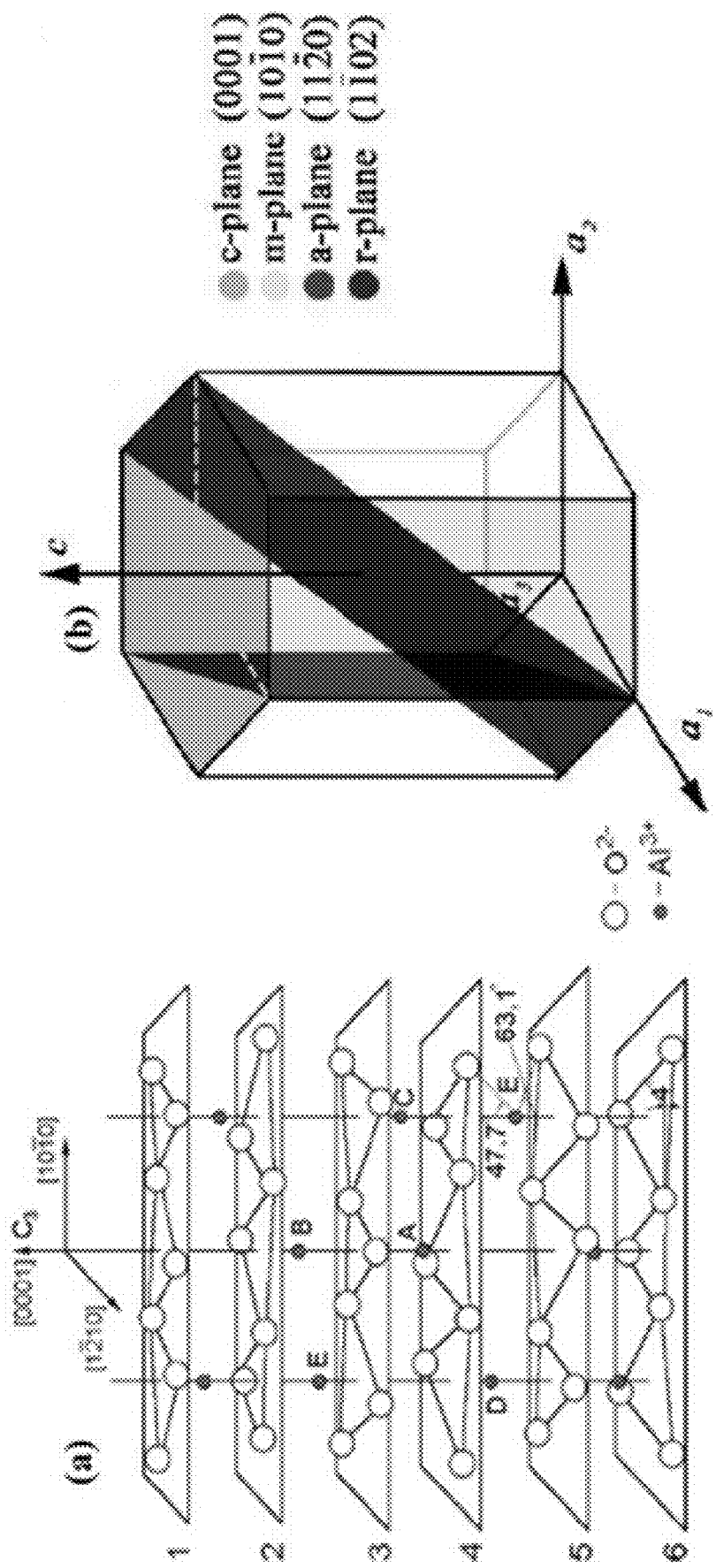
FIG. 4 shows schematically (a) arrangements of $Al^{3-}$ and $O^{2-}$ layers in sapphire and (b) sapphire unit cell and different crystal planes according to certain embodiments of the invention.

The sapphire crystal lattice is formed by $Al^+$ and O2-ions. The coordination numbers of $Al^{3+}$ and $O^{2-}$ are 6 and 4, respectively. Single crystal sapphire belonging to the space group of R3C has a hexagonal/rhombohedral crystal structure. The hexagonal unit cell of sapphire is formed by alternating close-packed planes of oxygen with a hexagonal array of aluminum planes. Due to crystal lattice distortions, $Al^{3+}$ cations are in a crystalline field that has no symmetry center. It lies in the octahedral hollows between the closely packed $O^{2-}$, filling two-thirds of these hollows as shown in FIG. 4(a), such that 2/3 is the stoichiometric ratio of Al/O in sapphire. Along the [0001] direction the aluminum atoms and vacancies have a threefold symmetry. Due to the high optical transmission, mechanical strength, insulating nature, sapphire is popular as a substrate in the semiconductor industry for thin film growth and device fabrication, e.g., high-power-radio-frequency applications, high power, and high-frequency CMOS integrated circuits. The thermal expansion coefficient of a substrate is significant for the thin film growth. For sapphire along an axis, the thermal expansion coefficient is 6.2×$10^{-6}$ $K^{-1}$, while that along c-axis is 7.07×$10^{-6}$ $K^{-1}$. The unit cell of sapphire and different crystal planes is shown in FIG. 4(b). For the IMWP optical source, we have been growing GaAs on both c and r plane sapphire substrates.

The c plane is the sapphire substrate's basal plane, and the r plane is inclined 57.5667 degrees to the optic axis. The c plane and r plane sapphire have hexagonal and rectangular crystal structures, respectively. Octahedral hollows are present for c-plane sapphire, and the distance between the hollows is 4.756 Å. The c-plane sapphire has three-fold rotational symmetry about its normal. The oxygen sublattice is 30 degrees rotated with Al sublattice along with the [0001] direction. The distance between Al—Al sublattice is 2.747 Å. In r plane sapphire, Al—Al sublattice distances in [1101] and [1120] direction is 5.1272 Å and 4.756 Å, respectively. and the r-plane sapphire has one-fold rotational symmetry about its normal.

The functionalities and potential of GaAs film on the sapphire substrate for MWP, optoelectronics, and electronics motivated us to work on GaAs/sapphire system. As a substrate, the sapphire has an immediate advantage like silicon on sapphire (SOS) is a matured technology or electronic components and an existing body of work on $Si_3N_4$ on sapphire for passive components and waveguides. The thermal expansion coefficient is an important factor for the growth of crack-free epitaxial film, which is nearly equal to the III-V semiconductor and sapphire. Therefore, III-V growth on a semiconductor can create the possibility of monolithic integration of III-V semiconductor light sources, modulators, detectors, low loss waveguides, passive devices, CMOS, and RF silicon circuits. Besides, the sapphire substrate's high insulating property, high refractive index contrast between GaAs and sapphire system, and optical transmission of the sapphire substrate near III-As band gap provides the potential for 3D photonic systems. The integration of MWP functionality and electronics on a single chip can dramatically increase speed, bandwidth, processing capability, and dynamic range.

The growth of single-crystalline GaAs 2D film on sapphire (c and r plane) substrates is challenging because of (i) high lattice mismatch; and (ii) dissimilar crystal structure. The large lattice mismatch produces rough surfaces and defects in the epitaxial materials. Since the crystal structure of GaAs and sapphire substrates are different, so the growth film can be [111] oriented on c-plane sapphire substrate because it is a least similar in crystal structure. On the other hand, the rectangular (110) plane of GaAs may align with the rectangular r-plane of sapphire, while the hexagonal nature of the sapphire might force the epitaxial growth of GaAs to be of (111) orientation, or GaAs might take a totally different orientation. Moreover, a third feature must be considered: the chemical bonding at the interface between two materials. For example, high interfacial energy can lead to poor interaction between the two material surfaces. In this case, with a high lattice mismatch, different crystal structure, and unfavorable interface energy, one may expect poor crystal quality for GaAs on sapphire. On the other hand, GaAs may not even wet the sapphire substrate for a thin GaAs layer, and growth may occur by ignoring the high lattice mismatch and different crystal structures.

One aspect of the present invention relates to an IMWP apparatus, which includes: a sapphire substrate having a step-terrace surface; and a III-V semiconductor circuit disposed on the sapphire substrate, comprising a III-V stack layer epitaxially grown on the sapphire substrate. In certain embodiments, the III-V stack layer includes: a first III-V layer disposed on the sapphire substrate; a low temperature (LT) III-V buffer layer disposed on the first III-V layer; a plurality of second III-V layers disposed and stacked on the LT III-V buffer layer, wherein the plurality of second III-V layers are respectively annealed; a third III-V layer disposed on the second III-V layers; a III-V quantum well layer disposed on the third III-V layers; and a fourth III-V layer disposed on the III-V quantum well layer. A growth temperature of the LT III-V layer and a growth temperature of the III-V quantum well layer are lower than a growth temperature of each of the first, second, third and fourth III-V layers.

Figure 5:
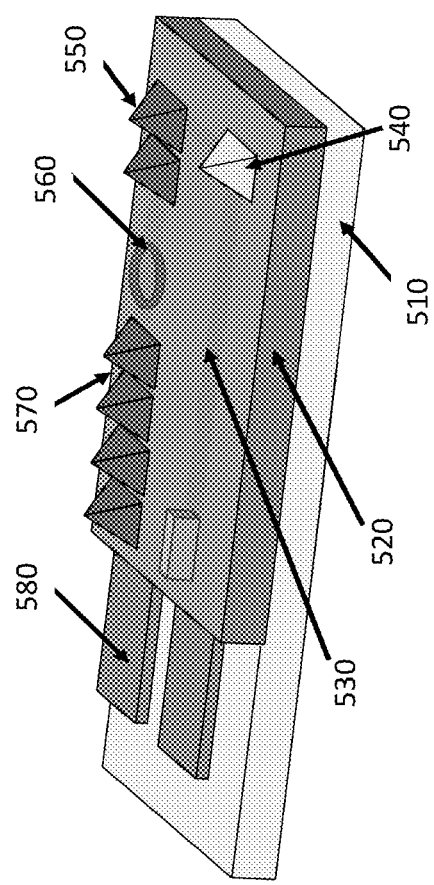
FIG. 5 shows schematically an IMWP circuit on a sapphire platform according to certain embodiments of the invention.

In certain embodiments, The significant intellectual merit of this invention lies in its feasibility for a fully integrated solution to include a complete set of components with light source, analog signal processing, light detection, CMOS control circuit, SOS circuit all-in-one sapphire platform to achieve high-performance low-cost mixed-signal optical links. For example, FIG. 5 shows schematically an IMWP circuit on a sapphire platform according to certain embodiments of the invention. As shown in FIG. 5, the IMWP circuit 500 includes a sapphire substrate 510, on which a III-V stack layer 520 is formed. On the III-V stack layer 520, a III-V low loss waveguide circuitry 530 is formed, including a III-V QD modulator 540, a III-V OD amplifier 550, a III-V ring resonator 560, and a III-V QD laser 570. Other III-V circuitry may include, without being limited thereto, a III-V detector and other integrated photonic components. Further, a silicon on sapphire (SOS) CMOS RF circuit 580 is formed on the sapphire substrate 510.

In certain embodiments, the sapphire platform can support a fully functional device that can enable the highest performance of all the needed components: (i) ready-to-go, high performance silicon on sapphire (SOS) CMOS RF circuits. (ii) high power, high efficiency, and narrow line width optical gain; (iii) thermal expansion match between sapphire and GaAs for monolithic device. (iv) high frequency, high linearity, modulators, better than thin film $LiNbO_3$ (v) high power, high linearity, and high frequency detectors; (vi) high index contrast between sapphire and GaAs and between Si3N4 for low loss passives. The rationale to utilize sapphire as the integration platform is based on integrating the highest performance laser, gain, modulator, detector, and passives; leveraging both existing microwave and III-V technology; and its potential for monolithic integration yielding low loss, low cost, and scalability.

Figure 6:
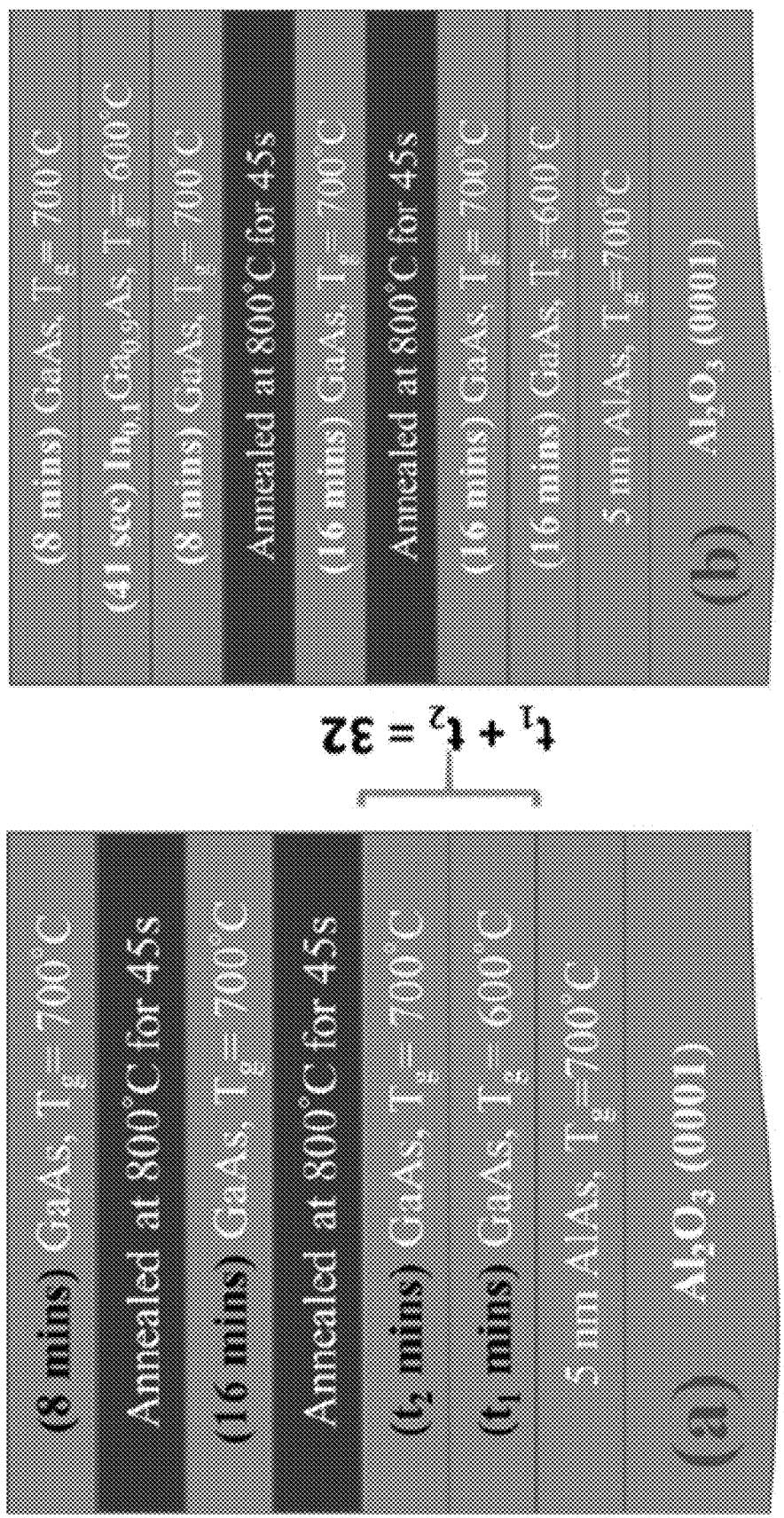
FIG. 6 shows schematically an IMWP apparatus (a) without the III-V quantum well layer and (b) with the III-V quantum well layer according to certain embodiments of the invention.
Figure 7:
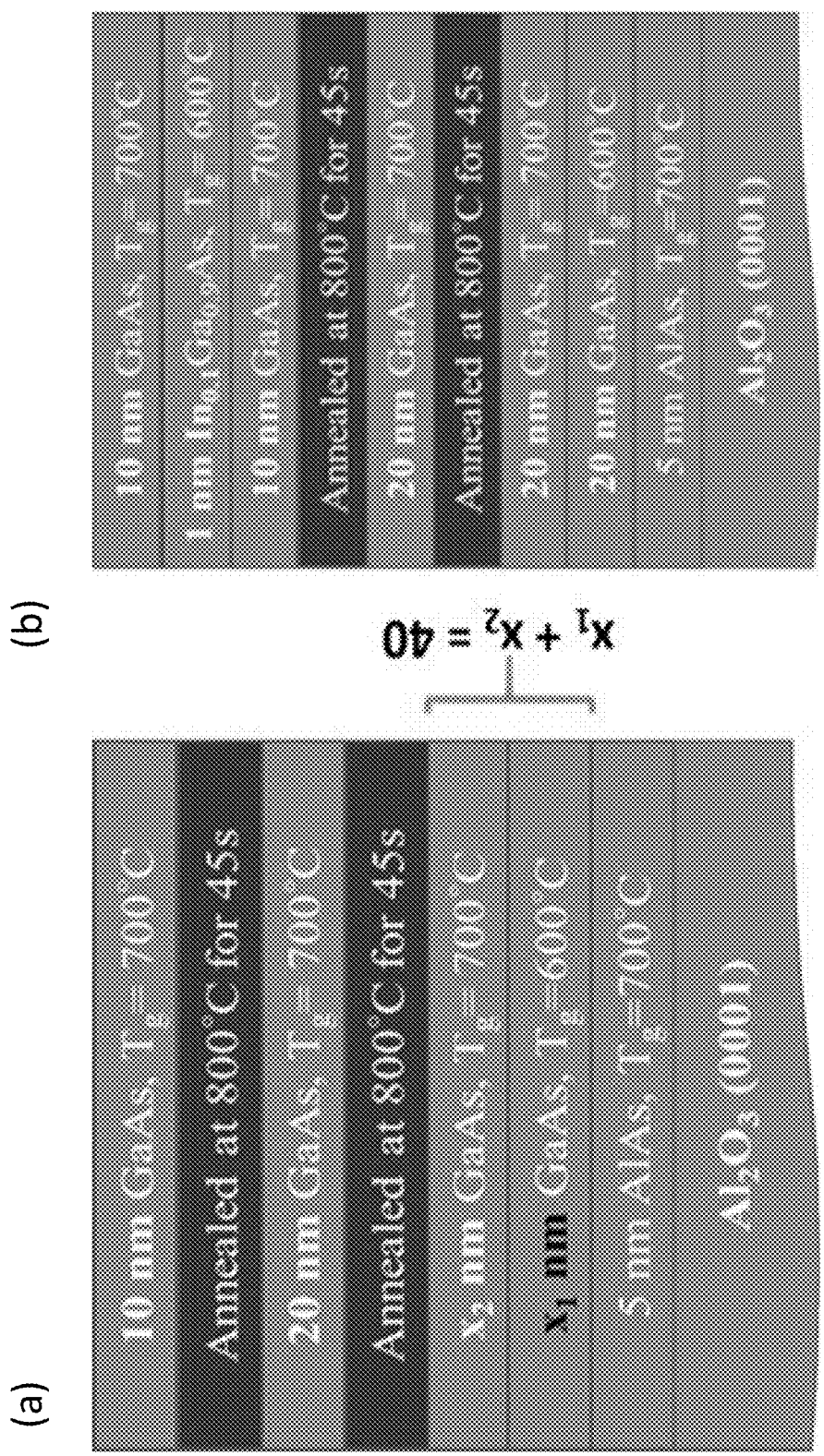
FIG. 7 shows schematically an IMWP apparatus (a) without the III-V quantum well layer and (b) with the III-V quantum well layer according to certain embodiments of the invention.

FIGS. 6 and 7 show schematically IMWP apparatuses according to certain embodiments of the invention. Specifically, in each of FIGS. 6 and 7, the IMWP apparatus is shown (a) as an early grown sample without the III-V quantum well layer and (b) as a full structure with the III-V quantum well layer. As shown in FIG. 6, the IMWP apparatus includes, sequentially upward from the bottom thereof, a sapphire substrate, a first III-V layer disposed on the sapphire substrate; a low temperature (LT) III-V buffer layer disposed on the first III-V layer; two second III-V layers disposed and stacked on the LT III-V buffer layer; a third III-V layer disposed on the second III-V layers; a III-V quantum well layer disposed on the third III-V layers; and a fourth III-V layer disposed on the III-V quantum well layer. Specifically, the first III-V layer is an AlAs layer, the III-V quantum well layer is an InGaAs quantum well layer (in particular, $In_{0.1}Ga_{0.9}As$ as shown in FIG. 6(*b*)), and each of the LT III-V buffer layer and the second, third and fourth III-V layers is a GaAs layer. The growth temperature of the LT III-V layer and the growth temperature of the III-V quantum well layer are 600° C., and the growth temperature of the first, second, third and fourth III-V layers is 700° C. In other words, the growth temperature of the LT III-V layer and the growth temperature of the III-V quantum well layer are lower than the growth temperature of each of the first, second, third and fourth III-V layers. Further, a growth time of the III-V quantum well layer is 41 seconds, a growth time of each of the LT III-V buffer layer and the second III-V layers is 16 minutes, and a growth time of each of the third and fourth III-V layers is 8 minutes. Thus, the total growth time of the LT III-V buffer layer and the immediately adjacent one of the two second III-V layers is $(t_1+t_2)=32$ minutes. Moreover, the two second III-V layers are respectively annealed at an annealing temperature of 800° C. for an annealing time of 45 seconds.

The IMWP apparatus as shown in FIG. 7 has a similar structure to that as shown in FIG. 6, with the only difference being that the layers are defined by their corresponding thicknesses instead of growth time. As shown in FIG. 7, a thickness of the first III-V layer is 5 nm, a thickness of the III-V quantum well layer is 1 nm, a thickness of each of the LT III-V buffer layer and the second III-V layers is 20 nm, and a thickness of each of the third and fourth III-V layers is 10 nm. Thus, the total thickness of the LT III-V buffer layer and the immediately adjacent one of the two second III-V layers is $(X_1+X_2)=40$ nm.

Another aspect of the present invention relates to a method of forming an IMWP apparatus, which includes: providing a sapphire substrate having a step-terrace surface; and forming, by epitaxial growth, a III-V stack layer grown on the sapphire substrate by: forming a first III-V layer on the sapphire substrate; forming a low temperature (LT) III-V buffer layer on the first III-V layer; forming one second III-V layer on the LT III-V buffer layer; performing first annealing to the second III-V layer; forming another second III-V layer on the one second III-V layer; performing second annealing to the stacked second III-V layer; forming a third III-V layer on the second III-V layers; forming a III-V quantum well layer disposed on the third III-V layers; and forming a fourth III-V layer disposed on the III-V quantum well layer; wherein a growth temperature of the LT III-V layer and a growth temperature of the III-V quantum well layer are lower than a growth temperature of the first, second, third and fourth III-V layers. The IMWP apparatus as disclosed above may be utilized in a variety of applications. In a further aspect of the present invention, an electronic device having the IMWP apparatus as disclosed above or having the IMWP apparatus formed by the method as disclosed above is provided.

The inventors have conducted research on different aspects of the IMWP apparatus and the method of forming the same, including: the direct growth of GaAs on sapphire (c and r plane); direct growth of GaAs on sapphire (c and r plane) but after an initial thin AlAs nucleation layer; the effect of the pre-growth c plane sapphire substrate surface treatment on GaAs growth, the role of the growth temperature and post growth annealing on GaAs growth on sapphire, as well as the importance of two-step growth to reduce misfit and threading dislocations. The nucleation layer, annealing, and two-step growth provides a highly relaxed, smooth, active surface that produces high-quality photoluminescence at low temperature and room temperature.

EXAMPLES

Crystal Growth and Growth Techniques

Crystals are periodic arrangements of atoms, molecules, or ions in all three dimensions. Crystalline materials have a huge impact in research, industry, optoelectronic devices, and biosensors. Their demands are increasing day by day. The epitaxy is an excellent way for the growth of high-quality crystal materials. Different epitaxial systems, growth modes, and growth techniques are hereinafter discussed.

Epitaxy

The growth of crystal film with a specific orientation on the top of a crystalline substrate is known as epitaxy. The film is called an epitaxial film or epitaxial layer. The epitaxial growth can result in a 1D, 2D and 3D crystal growth. There are different techniques for the growth of crystal by epitaxial methods such as (i) molecular beam epitaxy (MBE); (ii) chemical vapor deposition; (iii) liquid phase epitaxy; and (iv) vapor-phase epitaxy. Based on the substrate and layer material, there are two types of epitaxial systems: (i) homoepitaxial system, and (ii) heteroepitaxial system.

Homoepitaxial and Heteroepitaxial Systems

Figure 8:
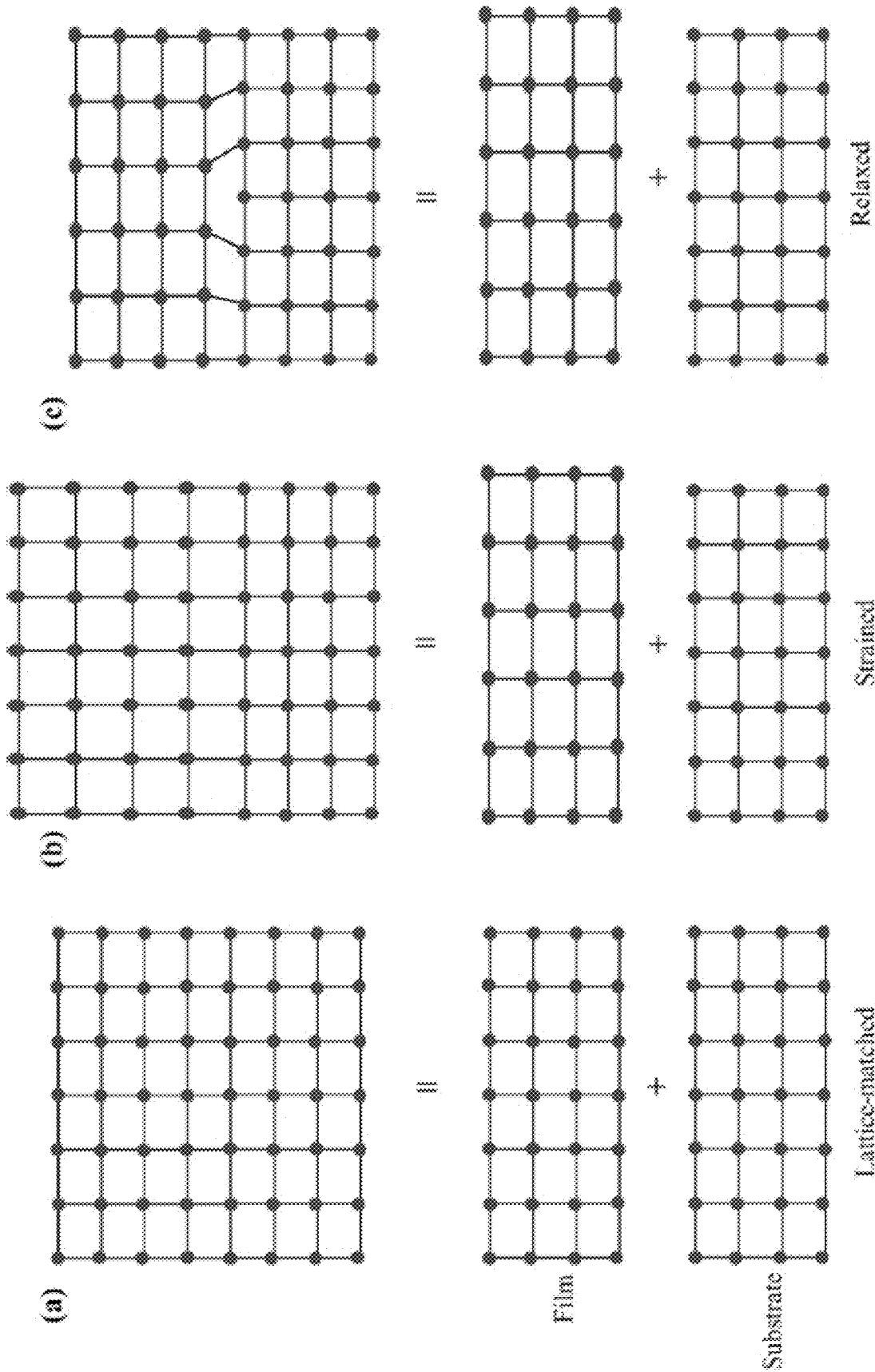
FIG. 8 shows schematically representations of (a) lattice-matched, (b) strained and (c) relaxed (misfit dislocation) epitaxial growth according to certain embodiments of the invention.

In the homoepitaxial growth, the film and the substrate are of the same material, so there is no lattice mismatch. In the heteroepitaxial system, the grown film and the substrate are of different materials, having different lattice constants but usually having the same crystal structures. Therefore, the strained or fully relaxed epitaxial film can be grown on the substrate depending on the interfacial conditions, lattice parameters, and thickness of the film shown in FIG. 8, which shows schematically representations of (a) lattice-matched, (b) strained and (c) relaxed (misfit dislocation) epitaxial growth according to certain embodiments of the invention. The heteroepitaxial system is the most interesting to explore their extraordinarily rich interaction, unknown bonding at their interfaces, and unexpected novel properties. For example, one can imagine semiconductors' growth on semiconductor, semiconductor on insulator, or semiconductor on ferroelectric. The key point is that the degree of coupling at the interface can create systems with remarkable properties, such as geometry-dependent excited-state lifetimes and magnitude of fluorescence, tailored index of refraction and dispersion, non-reflective materials, and control over carrier mobility and coherence. To succeed at the growth of dissimilar materials, conventional wisdom has generally required that the two materials have the same or similar crystal structures, for example, AlAs on GaAs, which is zinc-blende on a zinc-blende substrate. Another common example is GaN on sapphire, which is wurtzite (hexagonal) on a trigonal (hexagonal) substrate.

Thin Film Growth Modes

Figure 9:
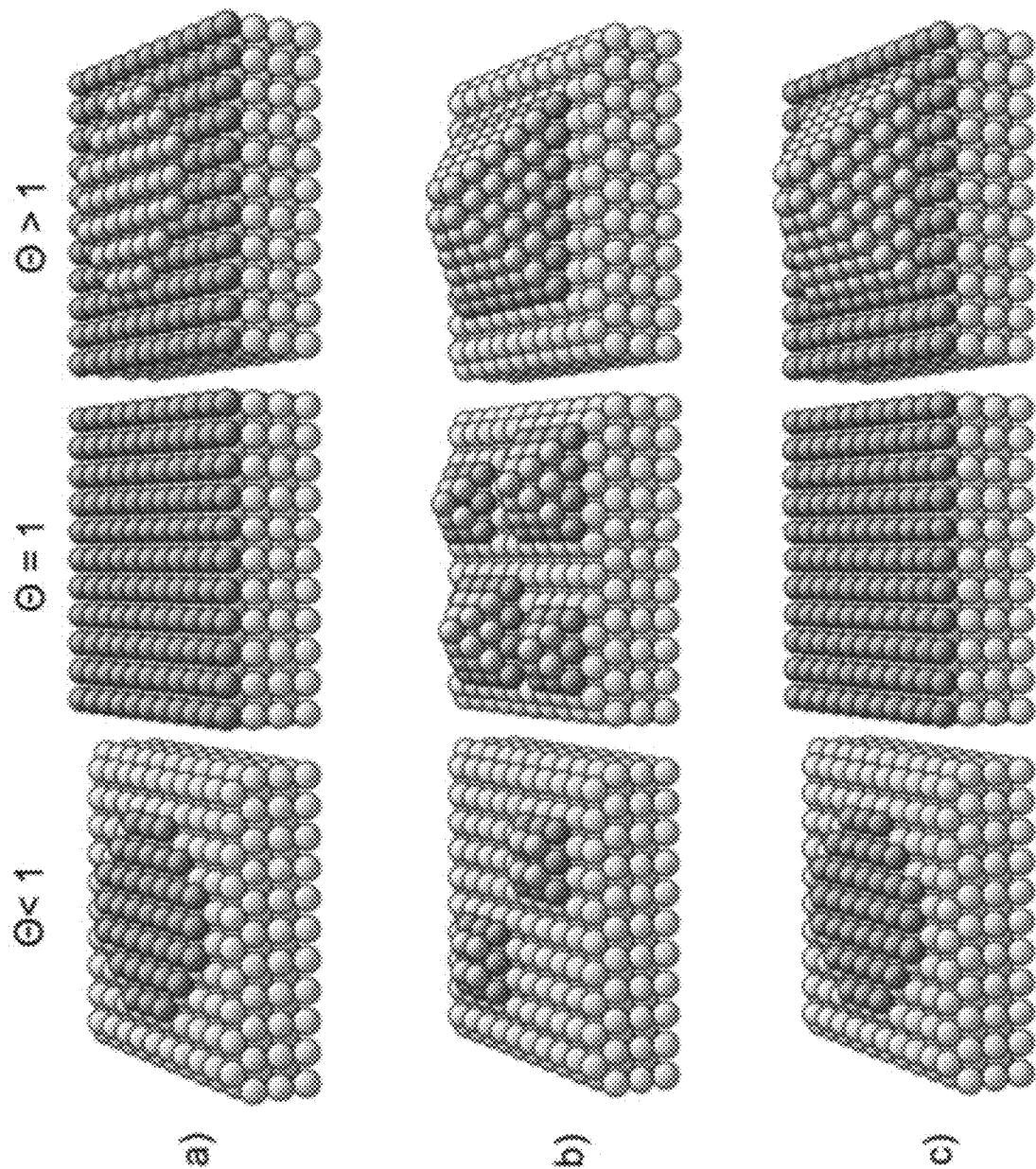
FIG. 9 shows schematically illustrations of (a) Frank-van der Merwe (F-M), (b) island growth or Volmer-Weber (V-W), and (c) mixed growth or Stranski-Krastanov (S-K) according to certain embodiments of the invention.

For the thin film growth, the atoms are transported to the substrate, and the adatoms (deposited atoms) diffuse on the surface to find nucleation sites like edge, kink, or clusters to minimize energy. The affinity of adatoms to the substrate or each other determine the film morphology on the substrate. There are three types of growth modes, these are (i) layer-by-layer growth or Frank-van der Merwe (F-M), (b) island growth or Volmer-Weber (V-W), and (c) mixed growth or Stranski-Krastanov (S-K) as shown in FIG. 9. Specifically, as shown in FIG. 9, $\theta$ represent the amount of deposited material ($\theta=1$ represent one monolayer deposited atom on substrate atom). In the F-M mode, adatoms are strongly attached to the substrate, which promotes the wetting of the substrate surface and two-dimensional film growth. It usually occurs in the semiconductor and oxide materials growth. When the interaction within adatoms is stronger, 3D islands are formed on the substrate, the growth mode is known as V-W. The size of islands increases by different coalescence phenomena like Ostwald ripening, sintering and cluster ripening until a film of different grains is obtained. The V-W growth mode typically occurs during the growth of metal and semiconductor (i.e., group IV, III-V, etc.) on oxide or rock salt substrate. The S-K growth mode is a mixture of F-W and V-M growth mode. In this mode, film grows layer by layer until it reaches a critical thickness and 3D islands start to grow. Islands grow on a wetting layer rather than directly on the substrate as in V-W growth mode. The heteroepitaxial systems with small lattice mismatch mainly follow the S-K growth mode.

Molecular Beam Epitaxy (MBE)

Molecular beam epitaxy (MBE) is an advanced technology for high-quality epitaxial material growth. In MBE, the basic concept of crystal growth can be described as follows. The energetic atoms are directed towards a growth surface or substrate. The heated substrate provides sufficient energy for the adatoms' diffusion to find a favorable lower energy site and become incorporated into the crystal lattice. The ultra-high vacuum (UHV) ($10^{-10}$-$10^{-11}$ torr) inside the chamber reduces the scattering of incident atoms before reaching the growth surface and the possibility of the incorporation of unwanted impurities. The capability of precise control over growth parameters like growth temperature, growth rate, film thickness, and atomic impingement flux make MBE an ideal system for electronics, optoelectronics, and photovoltaic device materials growth. In-situ RHEED allows the real-time crystal growth study, atomically flat substrates surface preparation with specific surface reconstruction. Using MBE, we can grow two-dimensional material with an atomically flat surface from the low lattice-matched (<2-3%), and three-dimensional islands with entirely confined structure from the high lattice mis-matched systems.

In the inventors' research, a Riber MBE 32 is dedicated to arsenide like GaAs, InAs, InGaAs, etc., materials growth at the University of Arkansas. It is connected with the other two chambers by a transfer line. For the other two chambers, one is used to grow oxide materials, and another is for group IV materials. The arsenide chamber's connection to other chambers opens the possibilities for integrating materials of having different properties such as semiconductors on ferroelectrics material.

The ultra-high vacuum in the MBE was achieved by several pumps such as rough pump, turbo pump, and ion pump. Cryopanels is surrounded inside the growth chamber. During growth, liquid nitrogen ($LN_2$) was supplied through cryopanels, which also acts as a pump by trapping atoms. Cryopanels also provide the temperature isolation between cells. Generally, the effusion cell or Knudsen cell (K-cell) is used for source materials reservoir and heated by electron bombardment or resistance heaters. For Knudsen cell's crucible, they are made of different materials, such as tungsten, stainless steel, nickel, graphite, pyrolytic boron nitride (PBN), quartz, etc., depending on the investigation.

Thermocouples are connected with the cell crucible for the temperature measurements. The cell temperature controls the amount of flux to be emitted. For the $As_2$ source, the flux is controlled by a combination of the source temperature and the cracker valve position. The temperature controller and automated shutters were used for growth control. Each effusion cell has a dedicated shutter, for example, during GaAs growth gallium, and arsenic cells shutters were opened. The indium shutter was opened in addition to arsenic and gallium shutters during $In_xGa_{1-x}As$ growth.

The in-situ characterization facility of the sample during growth makes MBE a unique growth technique. Our MBE system is equipped with a RHEED, an ion gauge for beam flux monitor, a growth gauge for chamber pressure measurement, a quadrupole gas analyzer (RGA) for the residual gas analysis and leak detection, and optical bandgap thermometry for substrate temperature measurement. All the instruments were valuable for the growth of GaAs on sapphire substrates.

Reflection High Energy Electron Diffraction (RHEED)

Since the early days of MBE, RHEED has been a well-established and useful in-situ technique for structural analysis. It can be used to determine the real time growth information such as three growth modes, crystal stoichiometry and quality, chemical composition, growth rates, surface reconstruction, V/III flux ratio, and growth temperatures. A finely collimated high-energy electron beam with energy 10-100 keV is used in RHEED for the surface analysis. The electron beam glances on the growth surface at a low angle (<3°), and after reflecting, it strikes a phosphor screen where it makes a diffraction pattern. For a specific diffraction condition, the glancing angle is critical. It should be finely adjusted by inclining the sample to the electron beam or deflection coils one and two. The electron beam penetrates only one or two monolayers of the sample surface making the RHEED be a highly surface sensitive technique. For the real-time growth study of GaAs, the RHEED was operated at a voltage of 20 keV and current 1.5 A. A charged coupled device (CCD) camera interfaced with a computer was used to record the diffraction pattern on the phosphor screen. The KSA 400 software was used to analyze the surface reconstruction, growth rate, and the intensity oscillation of the spots during growth.

Substrate Temperature Measurement

During the growth of self-assembled quantum dots, low-temperature material growth, high-quality crystal growth, and the prevention of dopant segregation, accurate substrate temperature measurements are crucial in MBE. There are different ways on how to measure the substrate temperatures, such as a thermocouple, pyrometer, RHEED, and band edge thermometry. The thermocouples are reliable for giving a repetitive growth temperature, although the substrate thermocouple is mounted between the heater and the sample holder. As a result, the substrate thermocouple's temperature measurements always differ from the actual growth surface temperature. On the other hand, a pyrometer is mostly used for the temperature measurement of a distant object. It measures the temperature from the radiation emission of an object. The temperature measurements by pyrometer are influenced by viewport coating and stray light within the system. Pyrometers are not efficient at low-temperature measurements, and it also depends on the emissivity of the materials which is difficult to find out. The substrate temperature can also be measured from the RHEED. The surface reconstruction of the substrate gives an idea about the surface temperature. Sometimes it is challenging to distinguish surface reconstructions and temperature measurements. The bandgap is a fundamental property of a semiconductor, and it varies inversely to the substrate temperature (Ts). Band edge thermometry (BET) uses the bandgap for the substrate temperature measurement. The band edge thermometry can be employed by two ways, such as (i) reflection mode; and (ii) transmission mode. BET is efficient for small substrates temperature measurements. The viewports coating, radiation from cells do not affect BET temperature measurements. However, BET measurement can generate local heat on the substrates, and make inefficient for doped and/or back side coated substrates.

Sapphire is an optically transmitted substrate from ultraviolet to infrared. The substrate's backside is coated with one-micrometer titanium to prevent the transmission of electromagnetic waves through the substrate from the heater. Therefore, during GaAs growth, the transmission mode of BET of our MBE system could not be put to use. Also, GaAs growth on c plane sapphire is Ga terminated (111) oriented crystal. The (2×2) surface reconstruction of GaAs (111) A is invariant with growth temperature. Hence, it is not possible to get the ideal substrate temperature from the RHEED surface reconstruction image, and the inventors rely on the thermocouple temperature for the substrate surface temperature, and the actual growth temperature can be 80-100° C. less than the thermocouple temperature.

Characterization Method

After GaAs growth on sapphire, the substrate temperature was reduced to room temperature, and the substrate was taken out from the chamber for structural and optical characterizations. The surface morphology was investigated for the surface roughness (film), thickness (3D islands), and density (3D island). The strain, defects, thickness, and lattice constant were studied from the structural analysis. Different structural characterization tools like TEM, XRD, Raman spectroscopy were employed for this purpose. The optical measurement is a great way to study the light emission from the material and to confirm the crystal quality and defects. Both room and low-temperature photoluminescence (PL) measurements were performed for the GaAs crystal quality determination. In this chapter, discussions are focused on the basic principle, working method, and measurement conditions of the techniques that are used for the grown GaAs crystal's structural and optical quality determination. The following sections are focused on the techniques for the structural material measurements and optical measurements techniques.

Structural Material Measurement
Atomic Force Microscopy (AFM)

Figure 10:
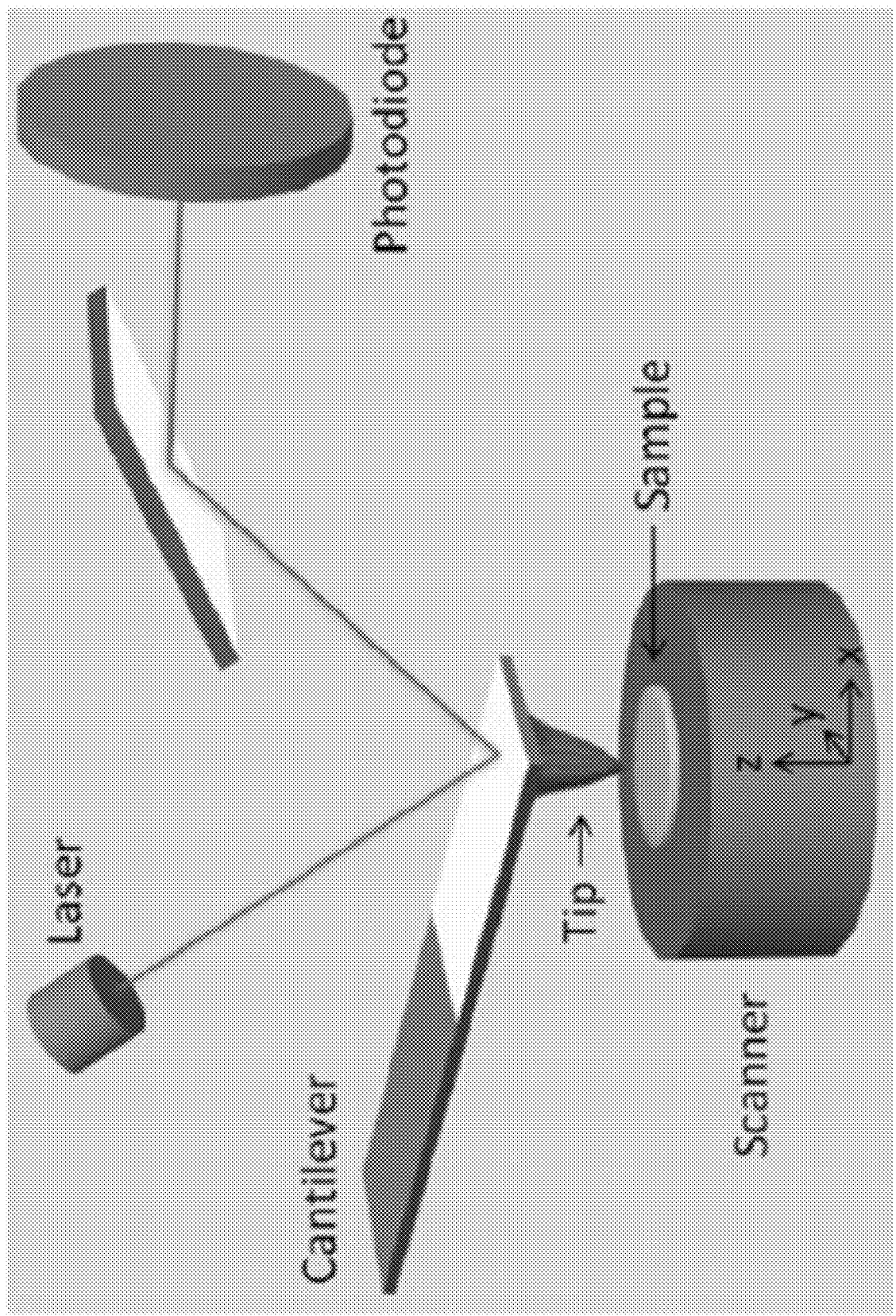
FIG. 10 shows schematically an atomic force microscopy (AFM) system according to certain embodiments of the invention.

Atomic force microscopy (AFM) or scanning force microscopy (SFM) is a powerful surface analysis technique at the nanoscale. It provides qualitative, quantitative, and statistical information on many physical properties, such as surface morphology, texture, size, surface area, roughness, and volume distributions. Typically, a probe, a laser, and a feedback system for collecting data are the main parts of an AFM as shown in FIG. 10. A cantilever with a sharp tip of 10-20 nm diameter is used in AFM to scan the surface. The tip and cantilever are made of silicon and silicon nitride materials. The basic principle of AFM operation is explained and illustrated below. During scanning, the tip as well as the cantilever are deflected by the sample's surface. The cantilever's deflection is measured by a reflected laser light from the back side of the cantilever. The topography or other properties of interest of the material are generated by feeding the deflection information to a computer. There are three measurement modes of AFM: (i) Contact, (ii) Non-contact, (iii) and Tapping mode. In contact mode, the tip touches the surface while scanning, and the cantilever deflection determines the surface morphology. The contact mode can destroy the soft material during the measurements. In non-contact mode, the cantilever oscillates at or close to its resonant frequency just above the surface as it scans. The attractive van der Waals forces, dipole-dipole, or any other long-distance forces between tip and sample are detected, and surface topography is determined from the attractive forces. The tip does not touch the sample surface, and the sample remains fine after measurements.

A liquid layer on the sample surface reduces the accuracy of the noncontact mode measurements. Tapping mode is also known as a dynamic, oscillating, or non-contact mode. The cantilever oscillates at or the near-resonant frequency with a high amplitude (20 nm to 100 nm) and closer to the sample surface than noncontact mode. During oscillation, the tip touches the sample surface at the bottom of its swing. A constant oscillation amplitude is maintained by the PID feedback loop to support a constant interaction between the tip and sample. The intermittent interaction between the tip and the measured surface produces the final image. In this research, the surface morphology of substrates, and the grown epitaxial material was investigated by tapping mode of a Bruker, model number 300-dimension III AFM. Stable and sharp tips made of Si with a tip radius of 10 nm, drive frequency of 300 kHz, and a spring constant of 40 N/m was used.

X-Ray Diffraction (XRD)

X-ray is an electromagnetic wave with wavelength, frequency, and energy ranging from 10 picometers to 10 nanometers, 30 petahertz to 30 exahertz ($30 \times 10^{15}$ Hz to $30 \times 10$ Hz), and 124 eV to 124 keV, respectively. X-ray wavelength lies between UV rays and gamma rays. It was discovered by Wilhelm Conard Röntgen in 1895. X-rays are produced by maintaining a high voltage (20 KV) between an anode and cathode. The tungsten filament and high atomic weight metal are used for a cathode (source of electrons) and anode (target), respectively. High energy electrons are emitted from the cathode, strike the target, and the electron kinetic energy is transferred to produce x-rays. The emission of x-ray radiation by this mechanism is known as collision radiation. The high-energy electrons are deaccelerated by the atoms of the sample, and the kinetic energy of electrons converted into x-rays. This mechanism is known as Bremsstrahlung. A PANalytical X'Pert MRD diffractometer (PANalytical, Almelo, Netherlands) was used for this work. The diffractometer equipped with a CuKα1 x-ray source (k=0.15406 nm), a four-bounce Ge (220) monochromator for a collimated x-ray beam, a multilayer focusing mirror, and a Pixel detector to detect the diffraction.

For the research as discussed, the crystal orientation of grown film was confirmed by out of plane measurements or ω-2θ scan, the crystal quality was confirmed from the full-width half maximum (FWHM) of the rocking curve measurements or ω scan, in-plane registry between film and substrate was confirmed from the phi scan and pole figure measurements. During out of plane measurements, the sample was fixed, x ray tube or source moved by the angle θ, and the detector moves simultaneously by the angle 2θ. This gave the diffraction from crystal planes parallel to the sample surface and information about the preferential growth axes. The spreading of a parallel crystal plane from its ideal position was determined from the ω scan. In ω scan, the source and detector were fixed at a Bragg's angle of a crystal plane needed to be measured, and the sample was rocked with respect to growth axis. For the φ measurement, the source and detector were fixed at a Bragg's angle of a crystal plane needed to be measured, the sample was tilted at χ angle and rotated around the growth direction.

Transmission Electron Microscopy (TEM)

TEM is considered the most popular nondestructive electron microscopy technique. The high energy electron beam is used in TEM to analyze the structure, size, and morphology of a wide range of nanomaterials. The basic structure of TEM consists of an electron emission source, electromagnetic lenses, and a detector. An electron beam is transmitted through a thin sample of thickness less than 100 nm. The interaction of electrons and the sample produce an image. Then the image is magnified and focused onto a fluorescent screen or a layer of photographic film. The TEM image can be used to determine crystal defects, such as misfit and threading dislocation, small precipitates, dislocation loop, stacking fault, twinning, etc. It is also possible to detect the density of defects and small clusters with diameters ~1-2 nm.

The function principle for TEM and optical microscopy are similar; however, the source and lenses are different. In optical microscopy, photons are used as sources, glass lenses are used to control and focus on the optical beam, and images are viewed by eyepiece. On the other hand, in TEM, electrons are used as source, electromagnetic lenses are used to control and focus of the electron beam, and images are viewed on the screen.

There are two modes in TEM for crystal lattice mapping images-(i) high-resolution transmission electron microscope (HR-TEM); (ii) high angle annular dark-field scanning transmission electron microscope (HAADF-STEM). In HR-TEM, the transmission and diffraction occur of the electron beam. The interference between the transmitted and diffracted beam produces the crystal lattice mapping images rather than the actual atomic columns, while the direct crystal lattice mapping images are produced by HAADF-STEM. The TEM advantages are powerful magnification, high quality image, and high spatial resolution for nanoscale materials. TEM's disadvantages are regarded high to buying cost, necessity of UHV to avoid the scattering of the electron beam by gas molecules in the air, and the expertise is needed to run it.

Figure 11:
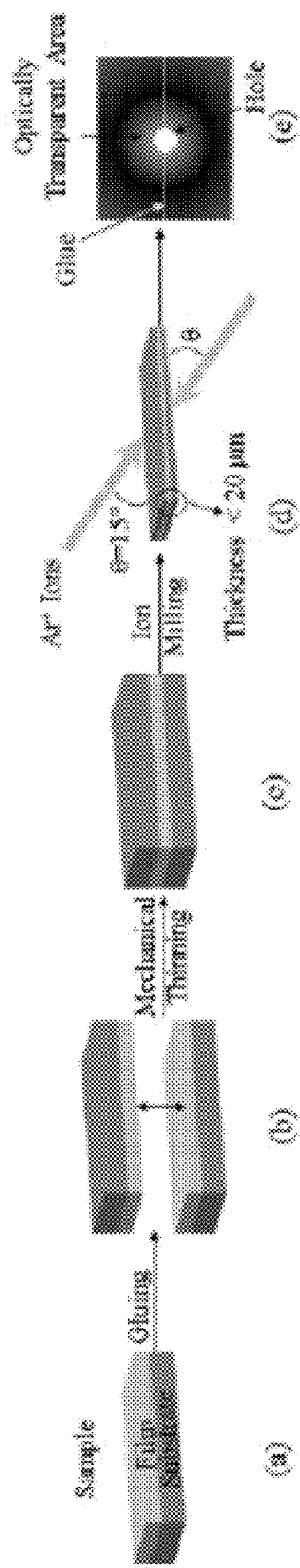
FIG. 11 shows steps of TEM sample preparation according to certain embodiments of the invention.

The sample preparation is the most essential part of a high-quality TEM image. For this TEM image, the sample was cut into two small rectangular pieces and glued face to face, as shown in FIG. 11. Specifically, FIG. 11 shows steps of TEM sample preparation according to certain embodiments of the invention, where (a) shows a small rectangular piece of sample; (b) shows face to face gluing; (c) shows mechanical polishing; (d) shows small hole generation by ion milling; (e) shows birds eye view of the hole and transparent areas around it. After gluing, it was transferred to a hot plate and annealed at 180° C. A clamping vise was used to compress the sample for the well gluiness [86]. The sample was then polished until thickness <20 μm was achieved by using an Allied High Tech Products Inc. polisher. The sample was then placed in a copper grid and then in a Fischione 1010 low-angle ion milling machine for making a hole in the middle of the sample. For our TEM, 50-300 nm thickness of the optically transparent area around the hold is sufficient for high-quality imaging. A Cs corrected Titan 80-300, with a Schottky field emission gun (FEG) that was operated at 300 kV, was used to take cross-sectional high-resolution TEM (HRTEM) images. In addition, A TF20 TEM, with electron source operated at 200 keV was also used.

Optical Characterization

Raman Spectroscopy

Raman spectroscopy was invented by C. V. Raman, is an essential tool in the field of vibrational spectroscopy. It helps to investigate the crystallinity, strain, defects, and composition of the solids. Raman spectroscopy studies the interaction between incident light or photon with lattice vibrations, phonons, or other excitations in the system. When a sample is exposed to a monochromatic light in the visible region, most of the photons are transmitted through the sample, some absorbed, and a very small portion is scattered by the material. The scattered beam is at the right angle of the incident beam and can have either the same frequency or different frequency of the incident beam. Depending on the frequency, the scattering process can be divided into Rayleigh scattering and Raman scattering. In Rayleigh scattering, the scattered beam frequency is the same as the incident beam frequency. If the scattered beam frequency is different from the incident beam frequency, then the scattering process is known as Raman scattering. Therefore, the Raman scattering is based on the inelastic scattering with a transfer energy between the molecule and scattered photon. In Raman scattering, stokes lines and anti-stokes lines are observed when the scattered light loses or gains energy, respectively.

Figure 12:
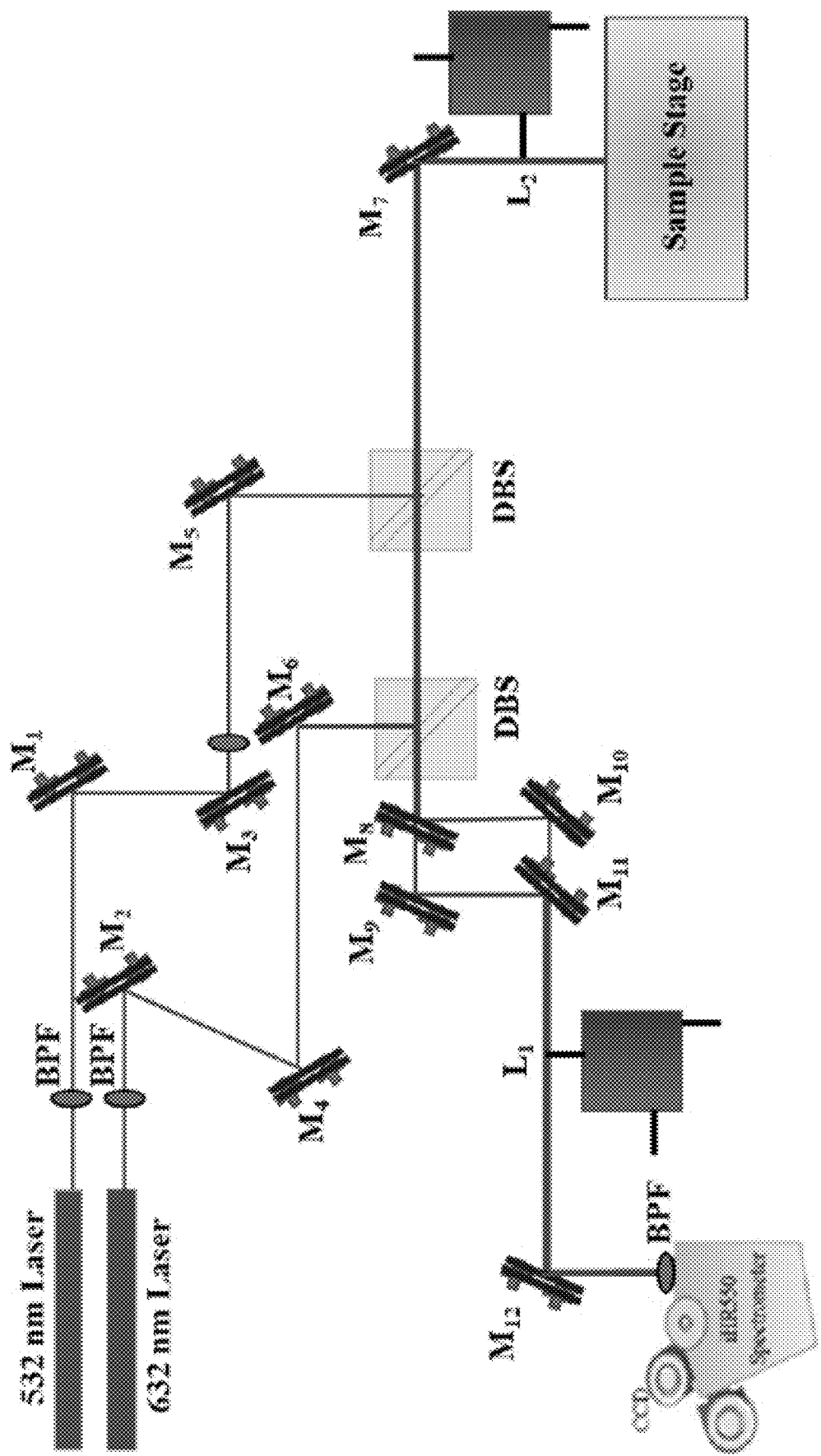
FIG. 12 shows schematically the Raman setup with 532 nm and 632 nm lasers according to certain embodiments of the invention.

In this research Raman spectroscopy was used to confirm the crystallinity from the shape of the peak and strain from the shift wave number. In the Raman system, monochromatic light source either 532 nm green laser or 632 nm red laser could be utilized for the illuminating of the sample. For the GaAs characterization, 632 nm monochromatic light source was used. The diameter of the spot on the sample is around 1 μm and while the intensity is approximately 5 mW. From the schematic diagram of Raman spectroscopy as shown in FIG. 12, the bandpass filters were used for the filtering of the unwanted background. The source light was directed from the source to the sample by aligning specific mirrors. The source beams were split into two directions by double beam splitters. The lenses were used for beam focusing and the reflected light was collected by a liquid nitrogen (LN) cooled charged coupled device (CCD) camera.

Ellipsometry

Figure 13:
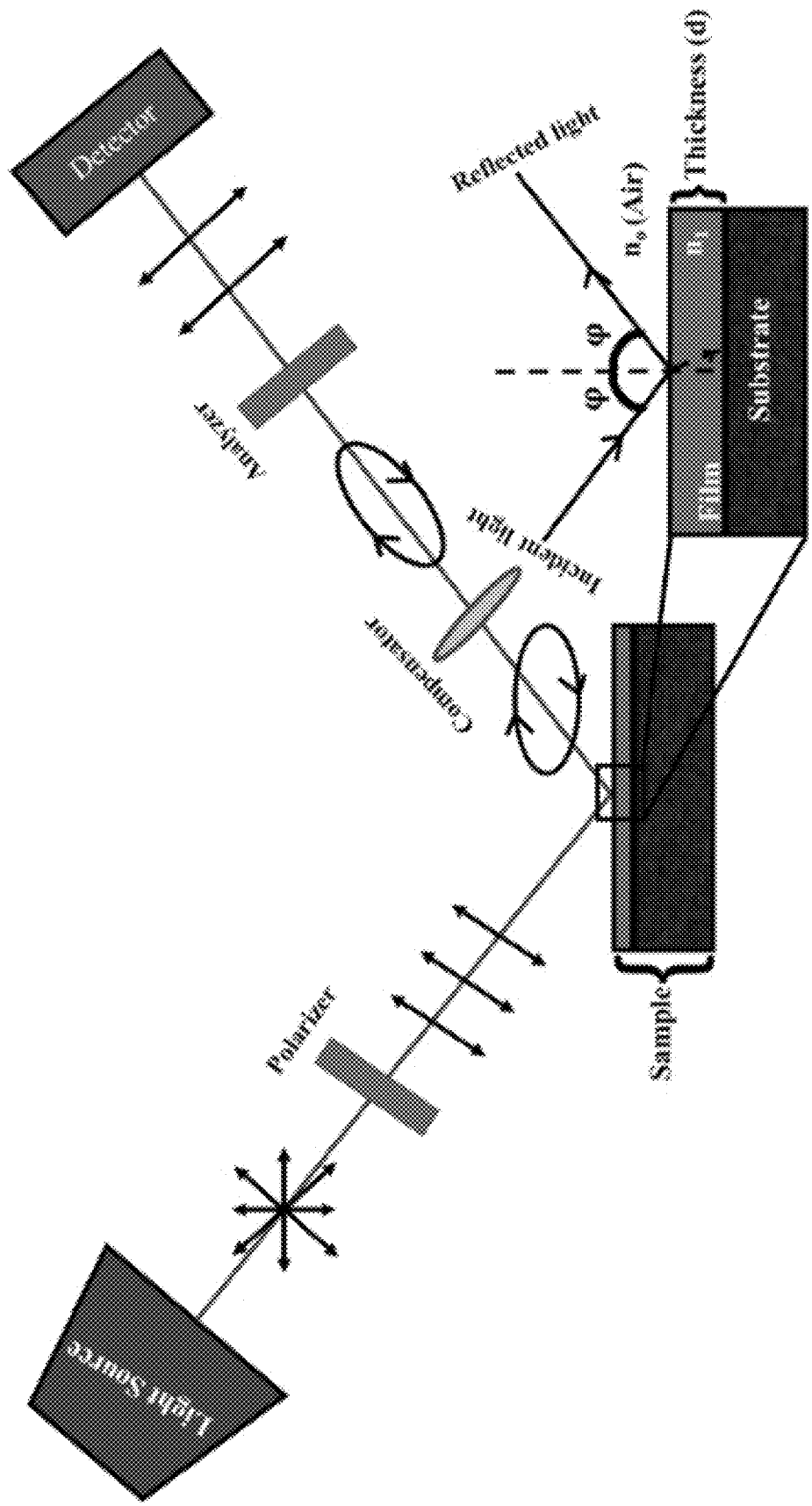
FIG. 13 shows schematically concept of ellipsometry according to certain embodiments of the invention.

When a light reflects or transmits through the sample the polarization of the light changes according to the optical properties and thickness of the sample. Ellipsometry measures the polarization change and helps to characterize crystallinity, roughness, anisotropy, uniformity thickness, doping concentration and other material properties related with a change in optical response. It is a nondestructive, highly accurate and reproducible optical technique. The schematic diagram of an ellipsometry as shown in FIG. 13 shows a light source to illuminate the sample, a polarizer to pass light of specific polarization, a sample to be characterized, an analyzer to send different polarizations light to the detector, and a detector.

In this research, a Variable-Angle Spectroscopic Ellipsometry (WVASE32) was used to characterize the samples. The spectroscopic data was collected in the range of 400-2000 nm (0.619-3.0996 eV) at different angle of incidence (65°, 70° and/or 75°) with a resolution of 10 nm. After measuring, the data were fitted using a built-in WVASE32® software. For minimizing the mean-square deviation $\chi^2$ between experimental and theoretical results a Marquardt-Levenberg algorithm was used.

Figure 14:
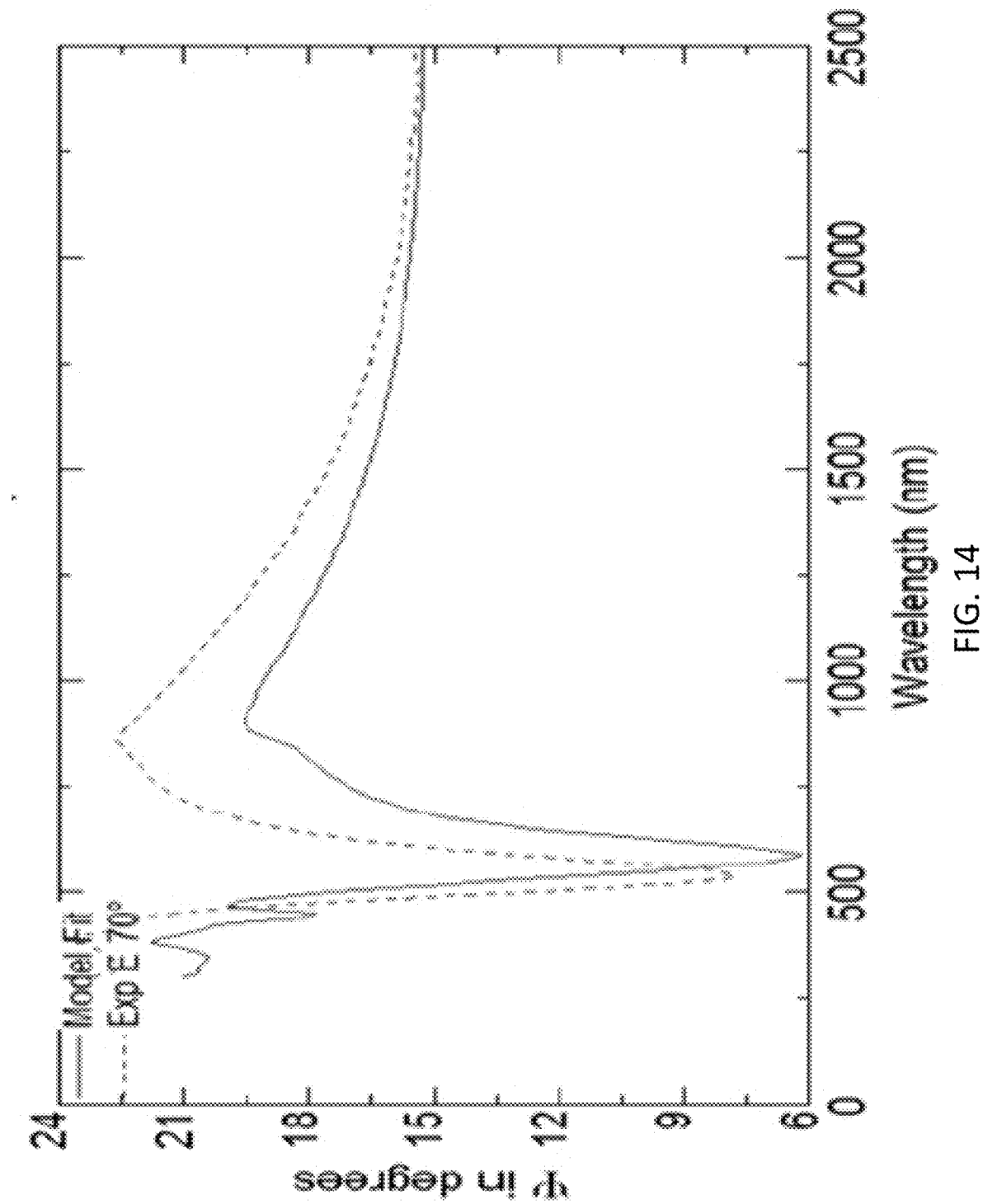
FIG. 14 shows experimental and model fitting ellipsometry data of GaAs/AlAs/sapphire sample according to certain embodiments of the invention.

Most of the time the grown sample was a multiple layer structure of GaAs and AlAs. Therefore, a multiple layer model consisting of sapphire substrate and film was used to analyze each sample. The Johs-Herzinger model was used to describe the dielectric function of each layer. The experimental result of ψ and Δ are compared with the model fit data of sapphire/AlAs/GaAs which are shown in FIG. 14.

Photoluminescence

Photoluminescence (PL) is a noncontact, nondestructive measurement technique. It is used to study the electronic and optical properties of the material. The bandgap, composition, carrier lifetimes, defects and quality of the material can be confirmed by analyzing the spectral distribution emitted by a semiconductor. The basic mechanism of PL operation is explained below. A photon with energy equal or higher than the bandgap of the material, is absorbed by the material. The interaction of the photon and electron excites electrons to the higher energy state and creates a hole in the valence band [95]. The electron-hole pair is known as exciton. The exciton can recombine mainly in three different ways (i) Radiative or band-to-band recombination; (ii) Shockley-Read-Hall (SRH or RHS) recombination; and (iii) Auger recombination. The radiative recombination occurs in the direct band gap semiconductor. In this process, the electron momentum is conserved, and the emitted photon has the energy equal to the bandgap energy of the material. The Shockley-Read-Hall recombination is also known as defect associated or trap assisted recombination. This recombination occurs in two-step process. In the first step, an electron is trapped by an energy state which is generated by foreign atoms or structural defects. In the second step, the recombination occurs if the hole moves up to the same energy state of the electron before the electron re-emitted to the conduction band. Auger recombination is a nonradiative process and three carriers are involved in this recombination. At first an electron-hole pair combines in a band-to-band transition and the excess energy is transferred to electrons or holes that are subsequently excited to higher energy states within the same band instead of giving off photons.

Figure 15:
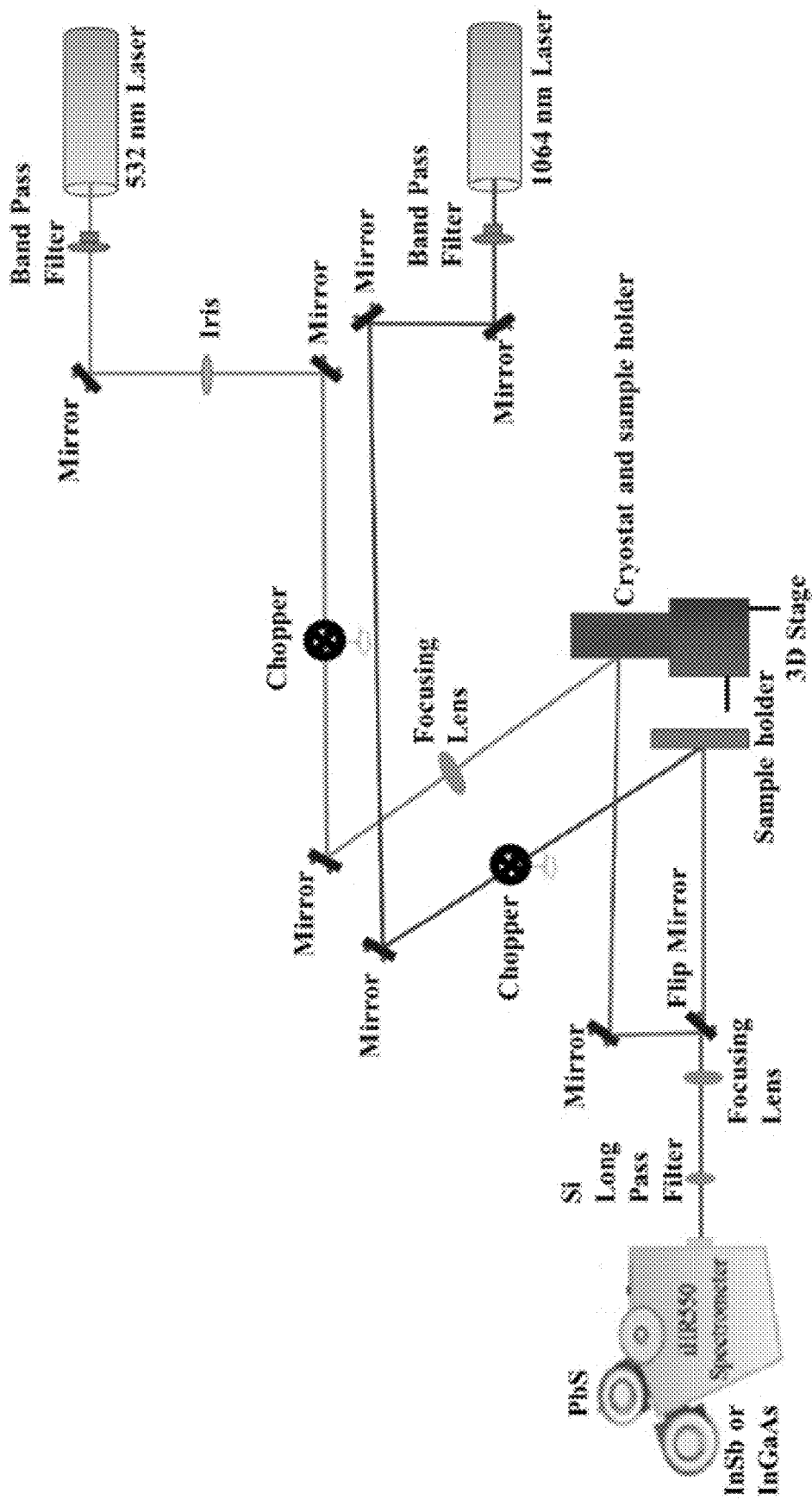
FIG. 15 shows schematically a PL system setup according to certain embodiments of the invention.

In this research, a multifunctional PL system was used where six different light sources, such as 532 nm continuous wave (cw), a 1064 nm cw, 1550 nm cw, 2000 nm cw, 780 nm pulse Ti-sapphire, Nd:YAG, and a fempto second laser were available to illuminate samples. Different measurements like off-axis PL and micro-PL at both low temperature and room temperature can be performed using separate collection paths. Detection of a wide range of wavelengths was facilitated with three different detectors, namely. PbS, InSb, and InGaAs. GaAs on sapphire system was studied by using a 532 nm continuous wave laser. The laser spot size was 65 μm in diameter and the average pumping power was 500 mW. The light source was modulated by an optical chopper as shown in the schematic diagram of FIG. 15. The alignment of the laser beam to the sample was done by a set of pin holes, mirrors and the focusing was performed by a CaF2 plano-convex lens with focal length of 10 cm. The planoconvex lens can transmit 90% of the incident light in the wavelength range of 500-5000 nm. A Horiba IHR 320 grating-based spectrometer was used to collect the PL emission from the sample and sent it to liquid nitrogen cooled InGaAs detector with the wavelength detection cutting-off at 2.3 To amplify the electrical signal a lock in amplifier system with a chopper was used.

Device Fabrication

GaAs Microdisk Fabrication on $Al_2O_3$

Figure 16:
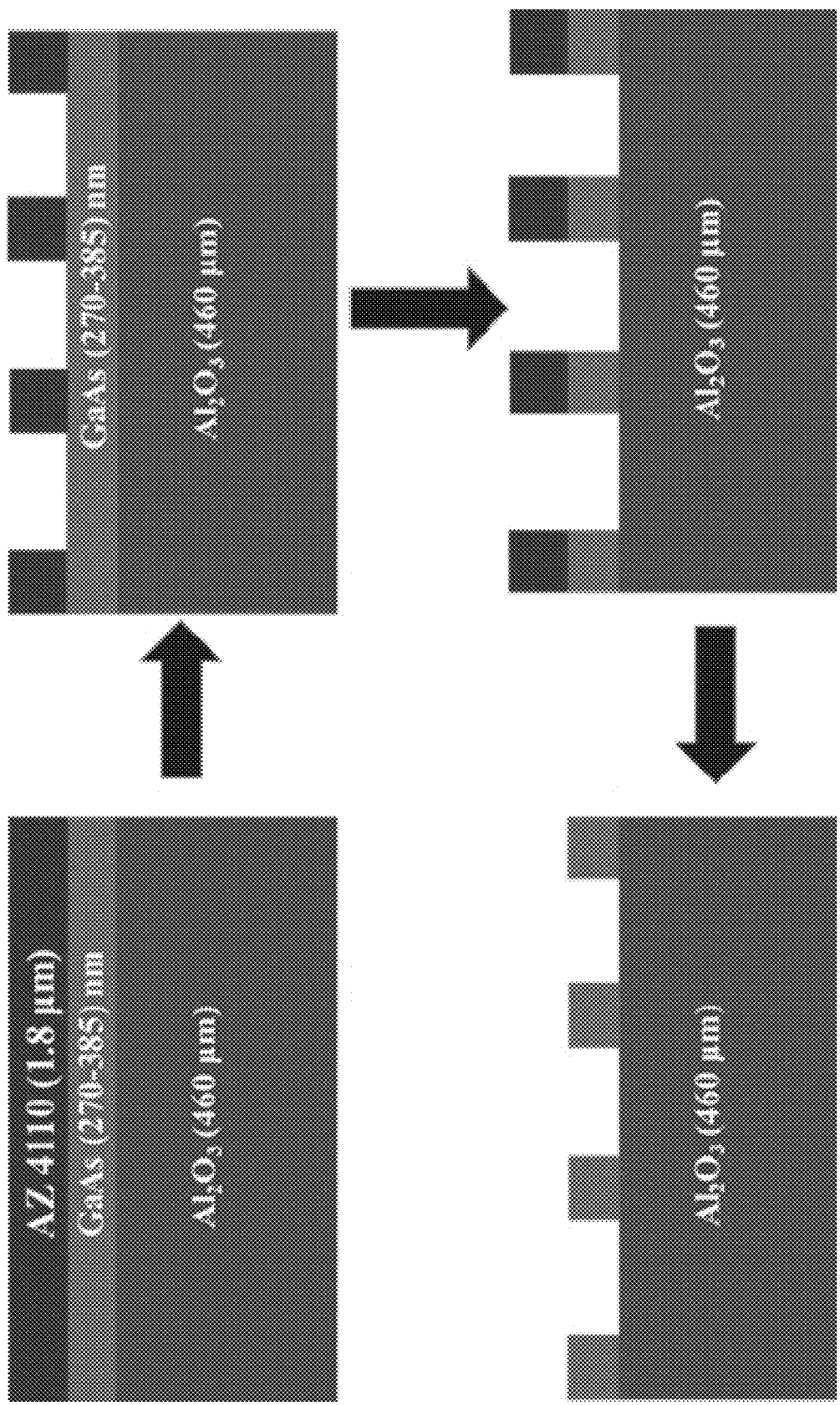
FIG. 16 shows schematically steps of GaAs microdisk laser fabrication on a sapphire substrate according to certain embodiments of the invention.
Figure 17:
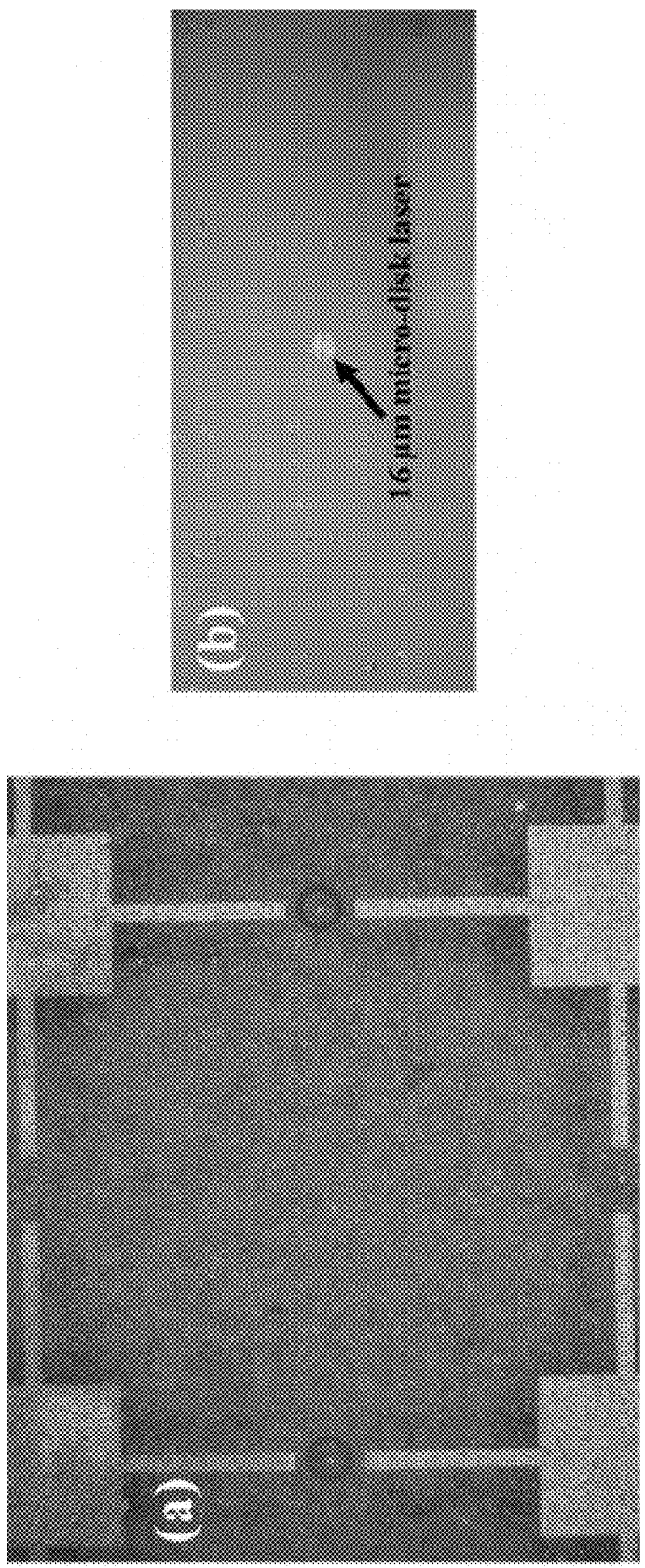
FIG. 17 shows optical images of (a) a small surface area after fabricating 16 μm micro disk lasers, where red circles indicate the position of the disk, the rectangular boxes and long arms are for finding the position of the disks during measurements; and (b) a 16 μm micro disk laser according to certain embodiments of the invention.

The process of GaAs microdisk laser fabrication on c plane sapphire can be outlined into four main steps as shown in FIG. 16. Specifically, as shown in FIG. 16, at first, each sample was sonicated with acetone and isopropyl alcohol. Then with the help of a spin coater machine a nominal 1.8 μm thick AZ4110 photoresist was placed on top of the GaAs film which allowed to settle microdisks. We have already confirmed from our trial experiments that 1.8 μm thickness is sufficient to withstand any wet chemical etching. Using a standard UV lithography with intensity 4.52 mW/cm$^2$, the chromium or glass mask pattern was transferred to the photoresist. The UV exposed regions of photoresist were developed by using a developer AZ300 MIF for 45 second. Then the GaAs etching was performed by an acid solution of $H_2SO_4:H_2O_2:H_2O=1:5:8$ at room temperature. The etching target was to reach sapphire substrate to remove the background contributions of GaAs to the responsivity measurement. The etching time was 1.18 s and etching depth was 89 nm. After the etching, the photoresist was removed by acetone cleaning. The optical imaging of the GaAs 16 μm micro disk lasers are shown in FIG. 17.

GaAs Growth on c Plane Sapphire

Heteroepitaxy is essential for introducing foreign properties on the epitaxial layer. In heteroepitaxy, the epitaxial material and substrate are different in lattice constant from each other but have the same crystal structure, such as cubic silicon, In(Ga)As on cubic GaAs. On the other hand, in dissimilar epitaxy, both crystal structure and lattice constant of grown materials are different from the substrate, such as cubic SiGe and GaAs on the trigonal sapphire substrate.

Figure 18:
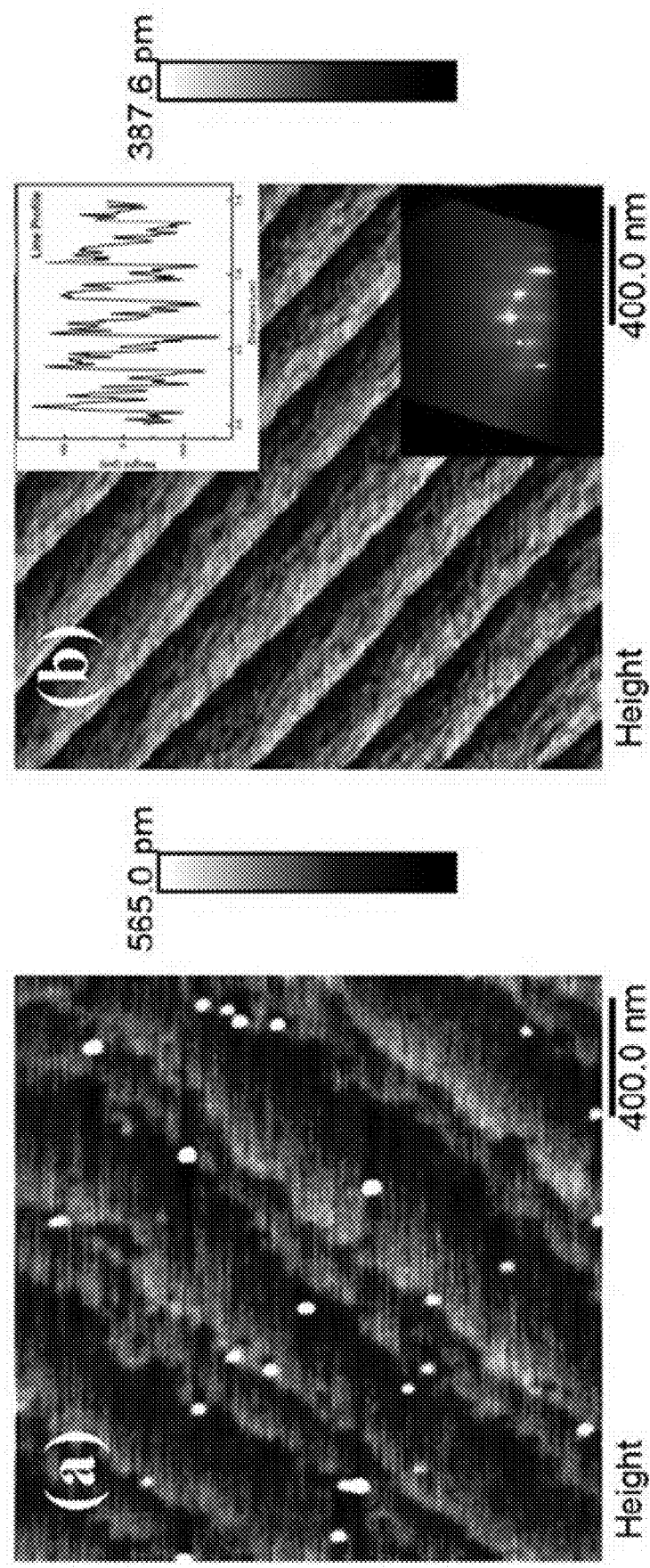
FIG. 18 shows (a) an AFM image of annealed sapphire substrate with prominent steps and terraces and (b) line profiles of the image according to certain embodiments of the invention.

As discussed, all samples were grown by using a Riber-32 molecular beam epitaxy (MBE). Before the growth, substrates were annealed in air at 1200° C. for 4 hours for the atomically smooth surface preparation. FIG. 18(a, b) shows the 2 μm×2 μm AFM images of sapphire substrate as received and after annealing. After annealing, the substrate surface is atomically flat and clean where steps and terraces can be seen. The surface has step heights of 1 monolayer (~0.216 nm) and terrace widths around 200-300 nm. The unintentional miscut of substrates used was less than 0.1°, as calculated from FIG. 18(b). A line profile of the surface along the perpendicular direction of steps is shown in the top right inset of FIG. 18(b), where one monolayer high step can be easily seen. Bottom right inset of FIG. 18(b) shows the RHEED from the sapphire substrate just before the growth. Narrow streaks and Kikuchi lines validate the cleanliness of the prepared substrate. After annealing each substrate backside was coated with 1 μm Ti by electron beam evaporator. The coating was done for a specific reason. Sapphire is an insulating material with high band gap (~9 eV). During heating it transmits most of electromagnetic waves. Therefore, to absorb for efficient heating the substrate backside was Ti coated. Afterwards, substrates were inserted into the load lock chamber and heated at 200° C. for two hours to evaporate water vapor. Then substrates were transferred to the degassing chamber and annealed at 850° C. for six hours to remove organic contaminates.

In the growth chamber to get a clean and free from unwanted materials substrates were heated to 900° for 3 hours. Before starting the growth, the substrates were exposed with arsenic flux of $2×10^{-6}$ torr at 650° C. for half an hour. Then the substrate temperature was fixed at growth temperature. The substrate temperature was measured by a thermocouple, and it was not in contact with substrates. Therefore, there can be 80° C. to 100° C. difference between measured temperature and thermocouple temperature. The growth rate of GaAs and AlAs was 0.75 and 0.2 ML/s respectively. The growth rate corresponds to homoepitaxial growth rate, and the V/III ratio was 15. The real time growth was studied by RHEED. In the following Table 1, details of the growth materials, growth temperature and substrate surface are listed.

TABLE 1

Structural details and growth parameters of samples

| Sample ID | A1A nucleation layer (NL) | | GaAs layer | | Substrate surface |
|---|---|---|---|---|---|
| | Growth temperature (° C.) | Thickness (nm) | Growth temperature (° C.) | Thickness (nm) | |
| C1 | NA | NA | 600 | 1 | Corrugated |
| C10 | NA | NA | 600 | 10 | Corrugated |
| C50 | NA | NA | 600 | 50 | Corrugated |
| S1 | 700 | 5 | 600 | 10 | Corrugated |
| S2 | 700 | 5 | 600 | 10 | Weak step-terrace |
| S3 | 700 | 5 | 600 | 10 | step-terrace |
| T1 | 750 | 5 | 600 | 10 | Weak step-terrace |
| T2 | 750 | 5 | 550 | 10 | Weak step-terrace |
| T3 | 750 | 5 | 500 | 10 | Weak |

TABLE 1-continued

Structural details and growth parameters of samples

| Sample ID | AlA nucleation layer (NL) | | GaAs layer | | Substrate surface |
|---|---|---|---|---|---|
| | Growth temperature (° C.) | Thickness (nm) | Growth temperature (° C.) | Thickness (nm) | |
| S50 | 700 | 5 | 600 | 50 | step-terrace Corrugated |
| S50-annealed | 700 | 5 | 600 | 50 | Corrugated |

Direct Growth of GaAs/Sapphire

Figure 19:
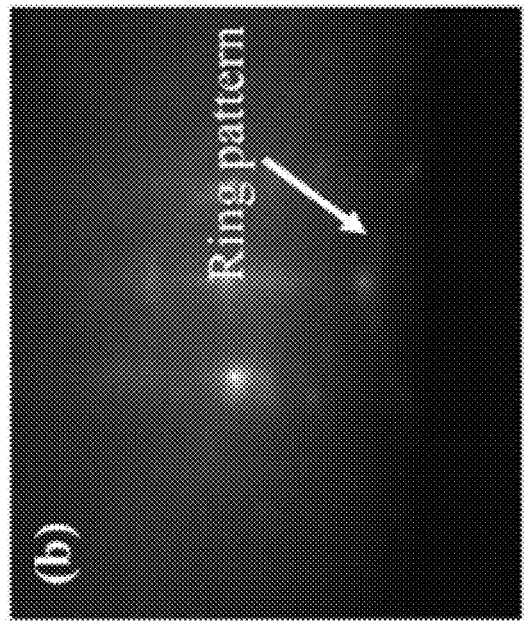
FIG. 19 shows RHEED images (a) from atomically flat sapphire substrate; after (b) 1 nm, (c) 10 nm, and (d) 50 nm GaAs deposition according to certain embodiments of the invention.
Figure 19:
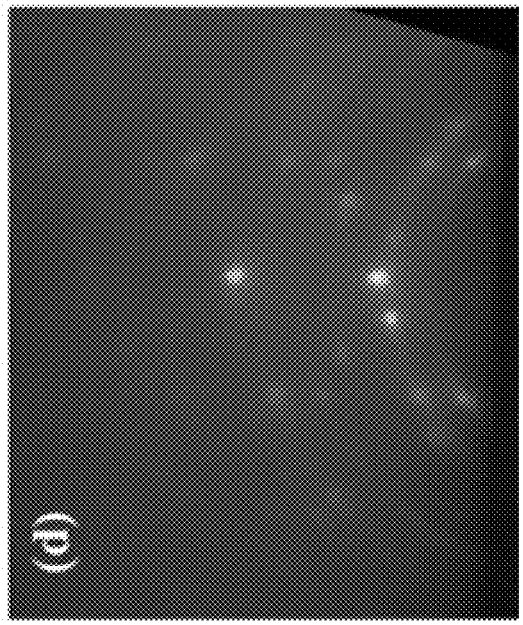
Figure 19:
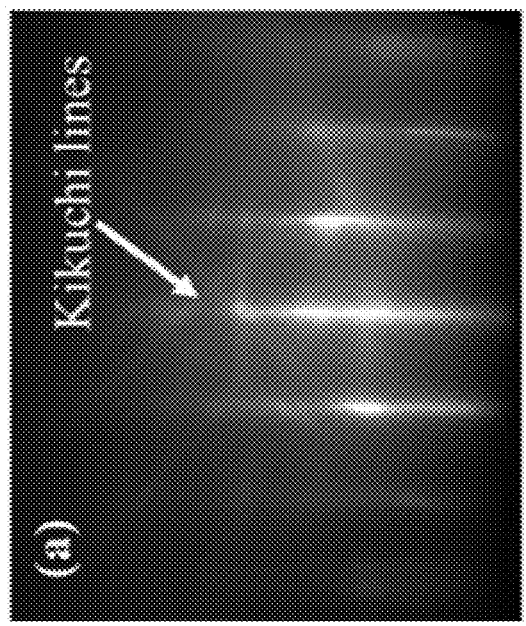
Figure 19:
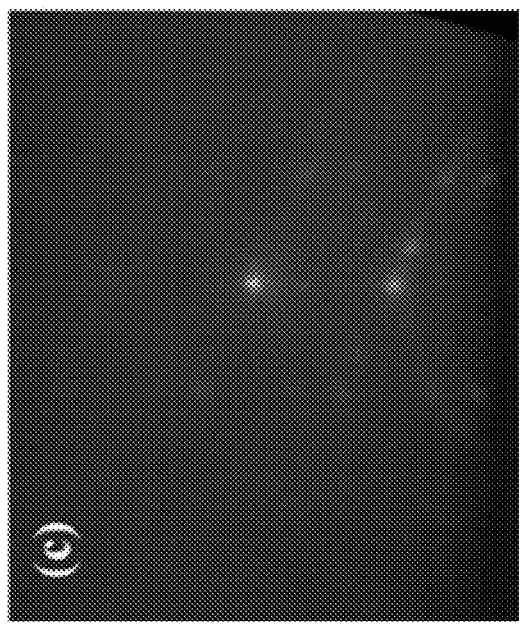

For the direct growth of GaAs on thermally cleaned c plane sapphire, the inventors have grown three samples of thickness 1 (C1), 10 (C10), and 50 (C50) nm. The growth temperature was 600° C. RHEED images at different stages of growth are shown in FIG. 19. It shows a streaky RHEED pattern from atomically flat sapphire substrate as shown in FIG. 19(a). The kikuchi lines indicate the surface is clean and smooth. After introducing 1 nm GaAs on clean and smooth substrate, the intensity of the streaks is reduced; ring patterns and spots are observed as shown in FIG. 19(b).

The Kikuchi lines are still observed which indicate that most of the substrate surface are uncovered. With increasing thickness, the streaky lines are disappeared, ring pattern and spotty features become prominent as shown in FIG. 19(c, d). The ring patterns indicate the weak in plane correlation between film and substrate, whereas the spotty pattern indicates the 3D growth mode. From the starting of the GaAs growth, spotty features are observed which indicate the direct growth of GaAs that follows Volmer-Weber (VW) growth mode. This happens due to large lattice mismatch, relatively small surface energy of the sapphire substrate with respect to GaAs, and high interfacial energy. The 3D islands growth with little attachment to the sapphire substrate and by light brushing the GaAs islands could be easily knocked off from the growth surface. Hence, growth is not commensurate in its strict sense. Interface bonding so weak due to dissimilar crystal structure that overgrown layer merely feel the underlying substrate, somewhat like van der walls epitaxy.

Figure 20:
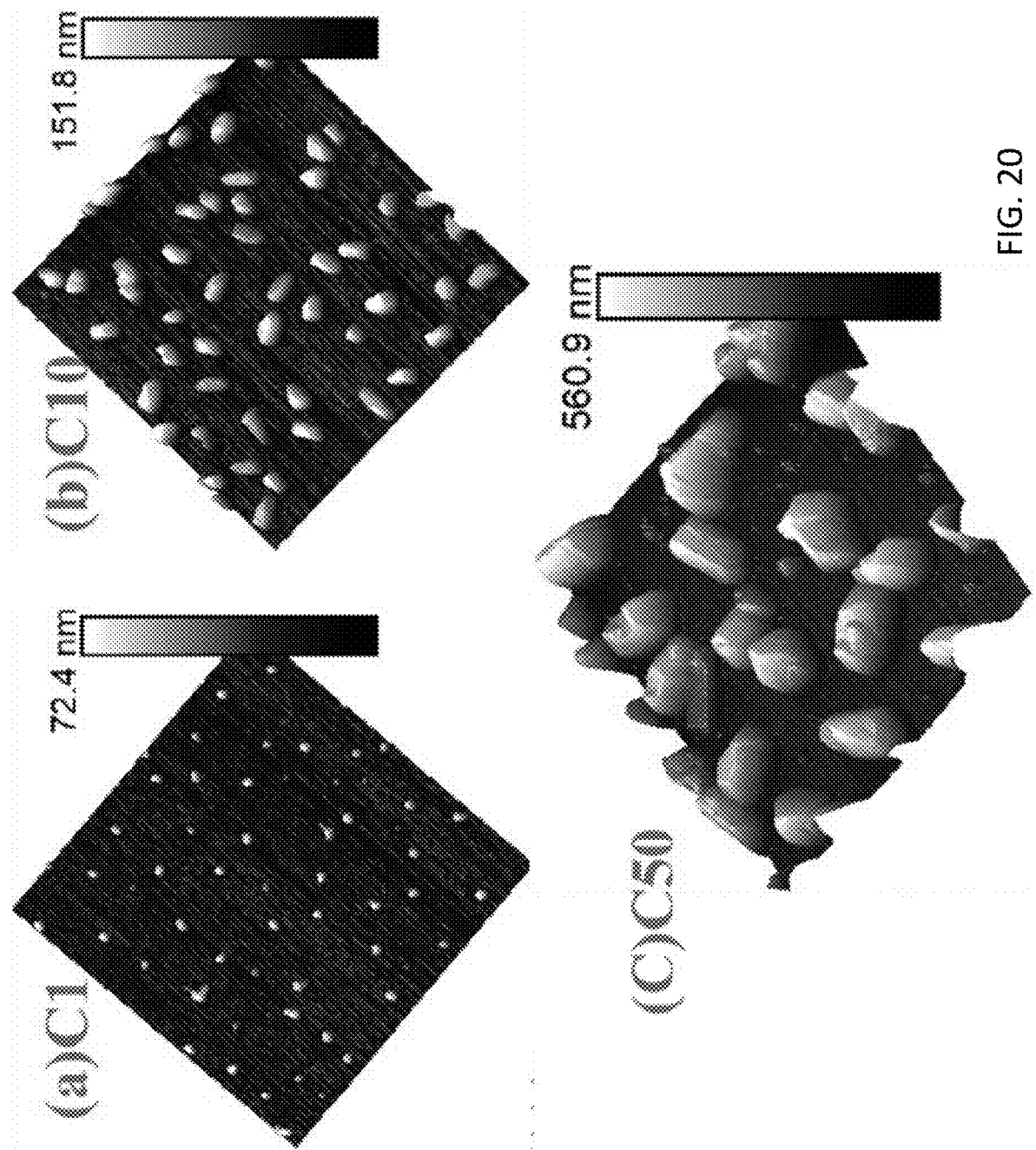
FIG. 20 shows AFM images of samples (a) 1 nm GaAs, (b) 10 nm GaAs, and (c) 50 nm GaAs according to certain embodiments of the invention.

FIG. 20 shows the 5 μm×5 μm AFM images of GaAs islands of three different thicknesses. The height and average lateral size of GaAs islands increases with increasing deposition while the density of islands was decreasing. These values are listed in Table 2. These follows the nucleation theory where Ostwald ripening, and coalescence reduce density and increase islands height due to the increased growth time. The facets of the islands from the AFM image indicate the crystallinity of the materials.

TABLE 2

GaAs island size, density, and percentage surface coverage with a deposition amount.

| GaAs nominal thickness (nm) | Density (cm$^{-2}$) | Height (nm) | Average lateral size (nm) | Island coverage (A) |
|---|---|---|---|---|
| 1 | 2E8 | 63.15 | 186.4 | 20 |
| 10 | 2.56E8 | 117.8 | 225 | 50 |
| 50 | 7.5E7 | 173 | 475 | 80 |

To confirm the growth direction, the inventors performed the XRD ω-2θ scan for all three samples. Due to the small amount of the C1 and C10 samples, the inventors could not get any diffraction. For the C50 sample, the growth direction is along [111] with a small peak (220), as shown in FIG. 20(a). The sharp peak intensity is observed from the substrate. The rocking curve or omega scan is a useful way to investigate the crystal quality. The small FWHM of the rocking curve indicates the less deviation of crystal planes from their ideal position. It is highly sensitive to the defects like mosaicity, dislocations, strain, and curvature because it disrupts crystal planes perfect parallelism. The FWHM of the rocking curve for the (111) plane versus the GaAs thickness is plotted in FIG. 20(b). The PL was done at 10K as shown in FIG. 20(c), where free exciton emission is observed at 1.514 eV. The emission also supports the high-quality GaAs islands growth, with the lower energy peaks likely due to defect states, possibly at the interface.

To find the in-plane correlation between film and substrate, the inventors have done the asymmetric (220) phi scan of GaAs. As shown in FIG. 22(b), six broad peaks indicate the weak in-plane correlation between film and substrate. Since GaAs has a cubic crystal structure so it should show three-fold symmetry in 360° φ rotation. However, FIG. 22(b) shows six peaks are 60° separated from each other. The extra three peaks are twin domains of GaAs (111) crystal which are separated by 120°.

Figure 21:
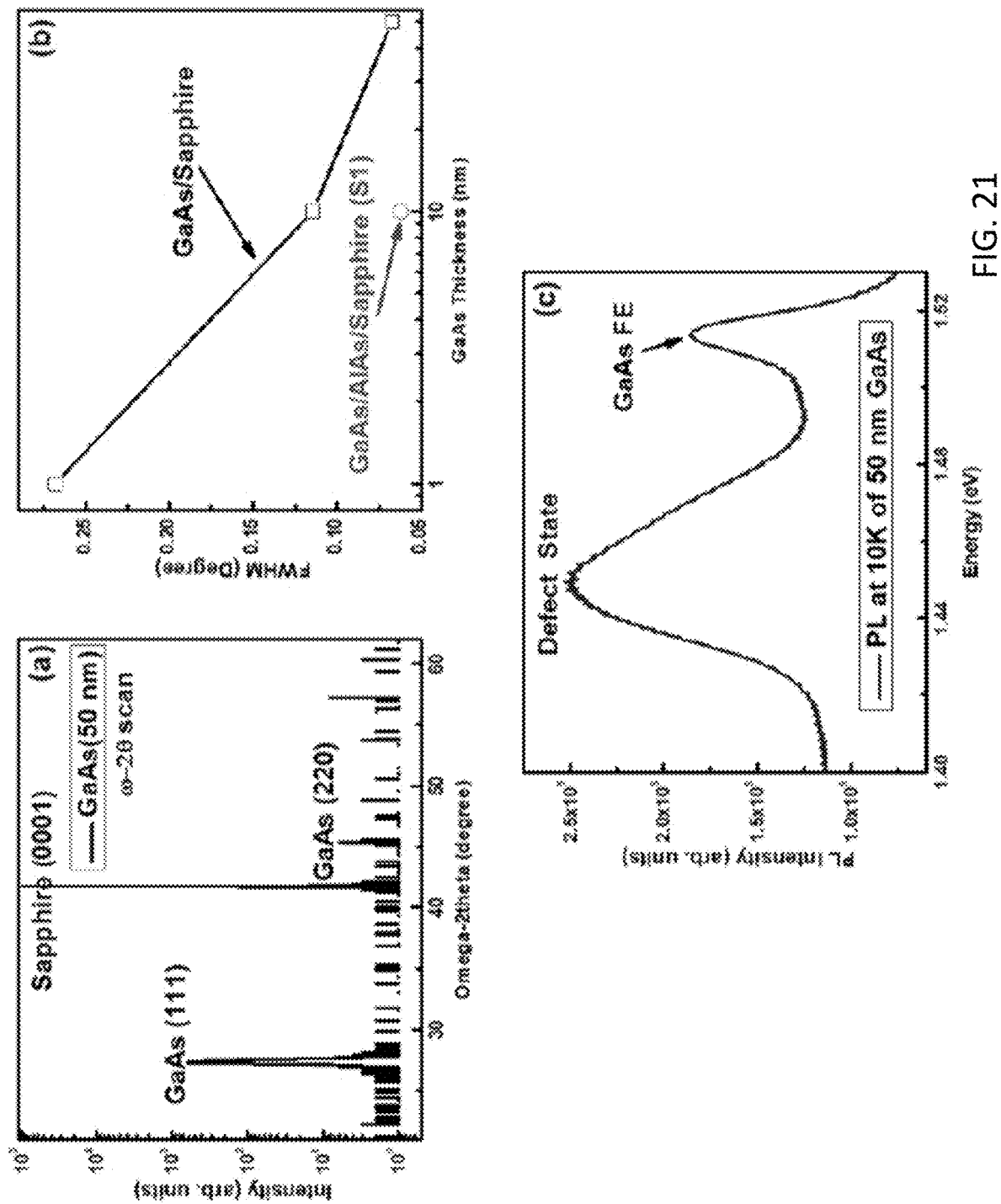
FIG. 21 shows (a) out of plane measurements of 50 nm GaAs (b) FWHM of (111) rocking curve versus GaAs thickness (c) Low-temperature PL from 50 nm GaAs (C50) according to certain embodiments of the invention.

The inventors assume the high-quality 3D islands of GaAs and random twin distribution are due to the weak correlation with the sapphire substrate. For example, very often during growth of semiconductor on oxide substrate with high lattice mismatch and interface energy promotes misfit dislocations at the interface as soon as critical nuclei form. After generating misfit dislocations, the growth materials become relaxed, and the subsequent materials grow at their bulk lattice with low levels of strain. Since the misfit dislocations are confined at the interface and do not propagate through the film, the result can be high-quality GaAs islands as shown by XRD images in FIG. 21(b). Therefore, based on the lattice mismatch and the weak chemical interaction, the sapphire acts as a compliant substrate in these early investigations.

Introduction of Thin AlAs Nucleation Layer

Figure 23:
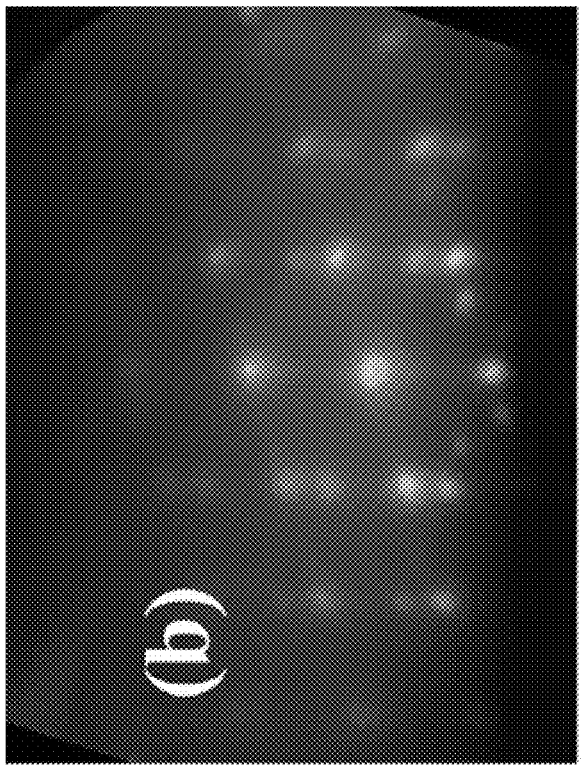
FIG. 23 shows real time growth study from sample Si during (a) AlAs growth, (b) GaAs growth on sapphire (original phase is referred by "O" whereas twin phase is referred by "T"), and (c) different RHEED spots identified for corresponding crystal planes of GaAs (111) growth according to certain embodiments of the invention.
Figure 23:
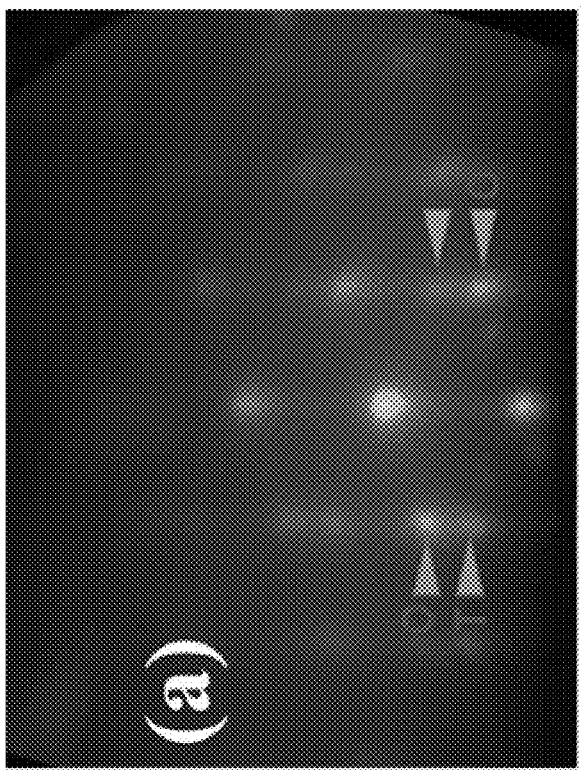
Figure 23:
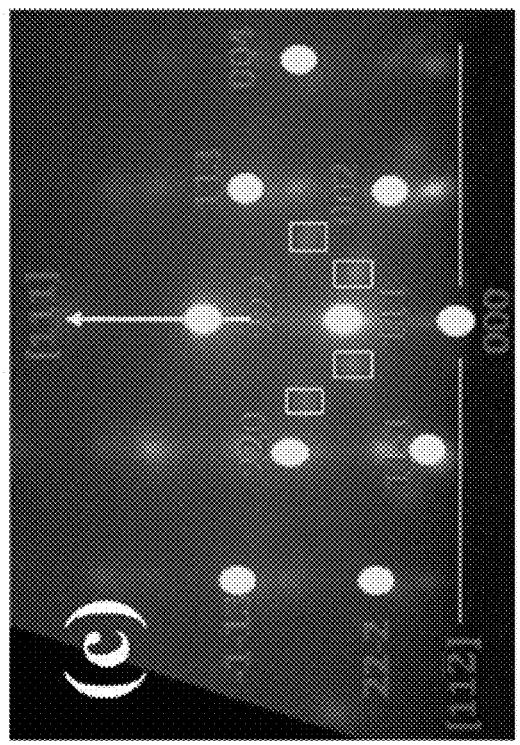

The direct growth of GaAs on c-plane sapphire produces high-quality materials. However, substrates surface coverage was low where GaAs islands had 50% twining defect, weak interfacial correlation, and more than one growth direction. To overcome the GaAs/sapphire system's structural difficulties, we introduced a thin (5 nm) AlAs as a nucleation layer between the GaAs and sapphire substrate. The almost same lattice constant of AlAs and GaAs motivated us to choose AlAs as a nucleation layer. FIGS. 23(a) and (b) show the real-time growth images of direct growth of the AlAs on sapphire and GaAs growth on top of AlAs/sapphire system. For the AlAs growth, after opening the aluminum cell shutter, a spotty pattern was observed with a gradual disappearance of sapphire substrate streaks. The instant in-plane relaxation of the AlAs was observed from the spot's position different from the sapphire substrate streak. RHEED images show two spots are very close to each other, and one has a higher intensity than another. These spots arise from a single plane and indicate the formation of one original preferential phase with a suppressed twin phase ("O" represents the original phase and "T" represents the twin phase in FIG. 23(a). The surface morphology of these structures is studied by AFM, as shown in FIG. 24, depending on the starting substrate.

Figure 22:
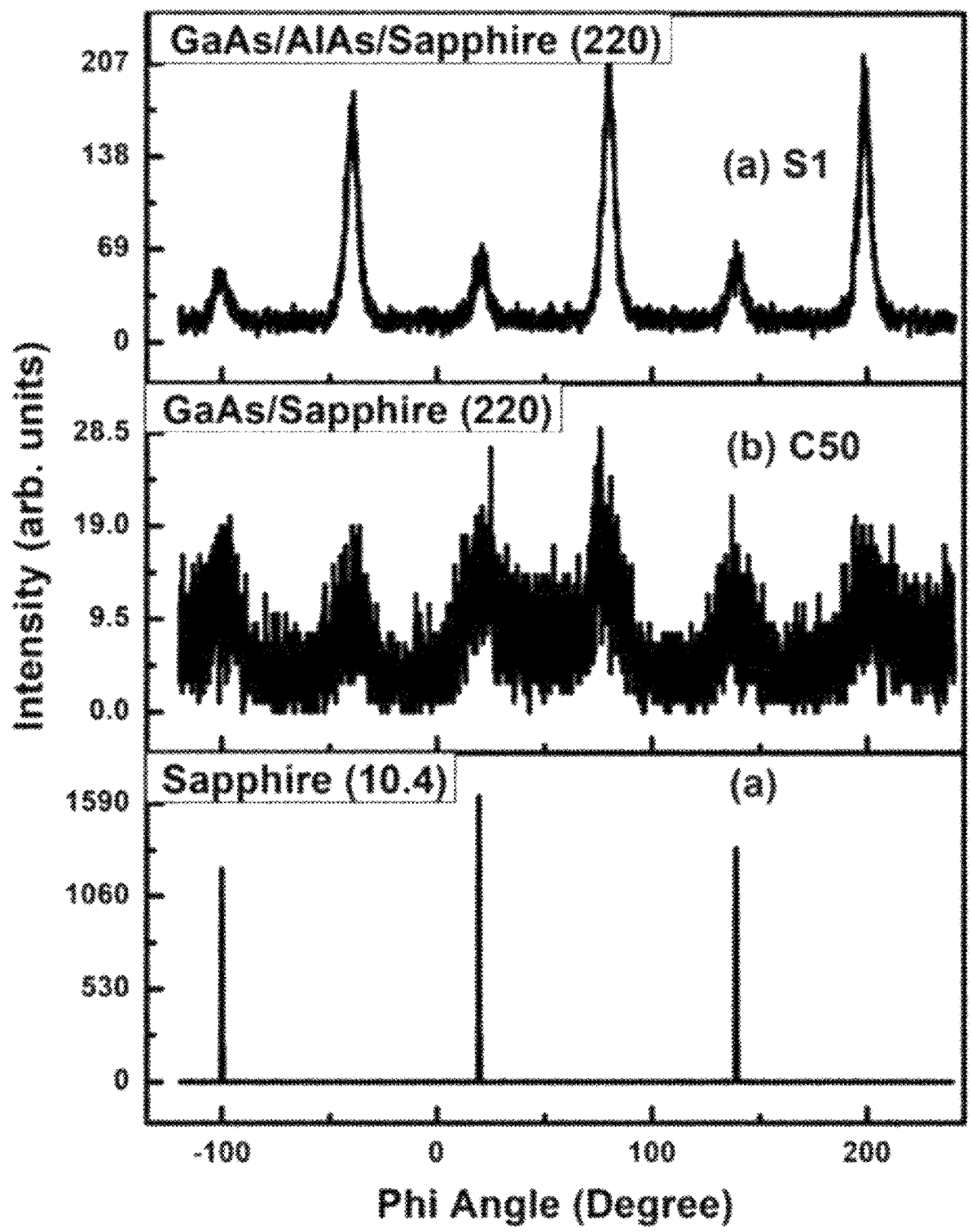
FIG. 22 shows phi scan of (a) (10.4) plane of sapphire and (b) (220) plane of GaAs/Sapphire (C50) and (c) GaAs/AlAs/Sapphire (Si) according to certain embodiments of the invention.
Figure 24:
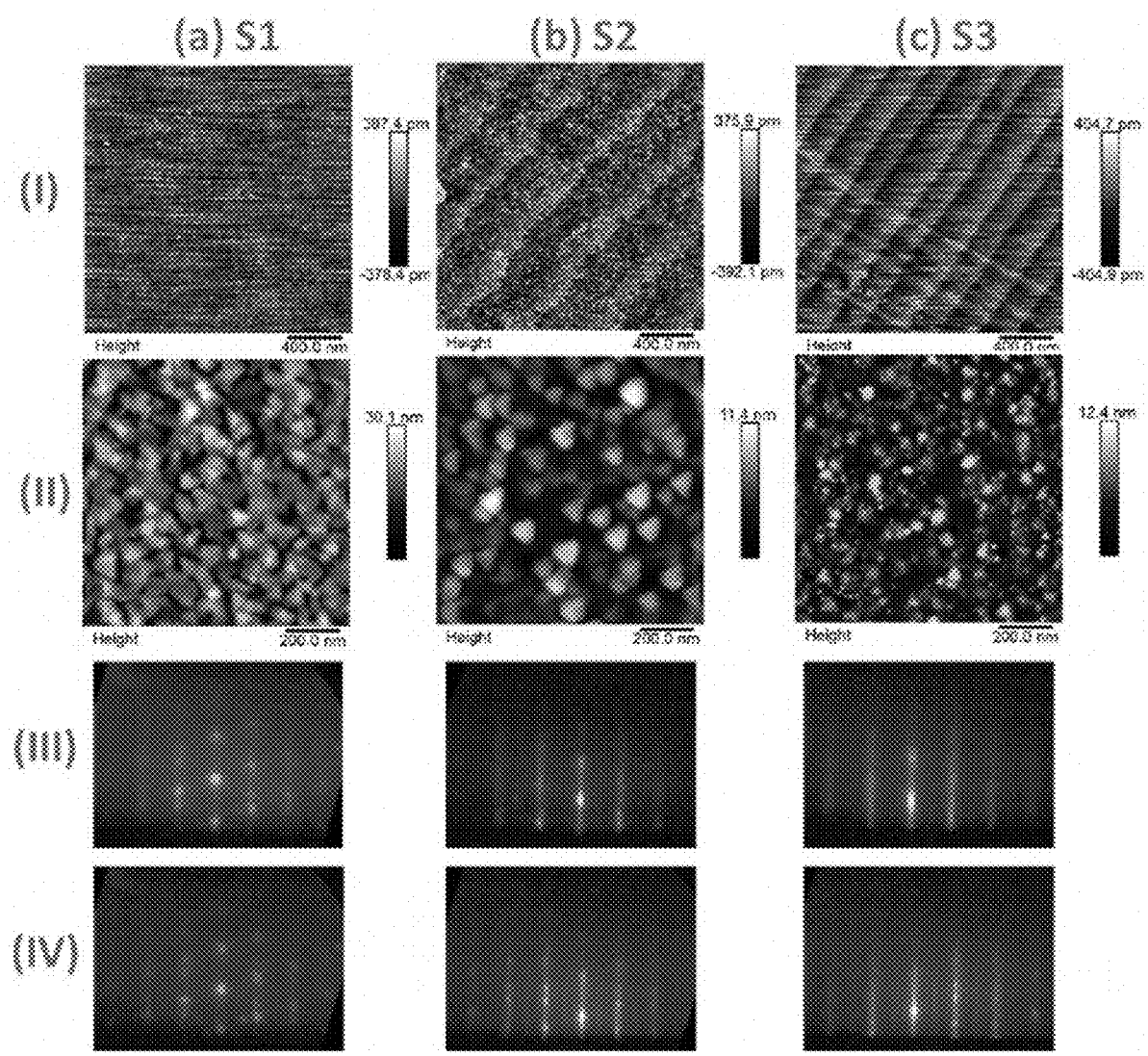
FIG. 24 shows the data for (a) corrugated surface sample, (b) weakly defined step-terrace surface sample, and (c) well-defined step-terrace surface sample according to certain embodiments of the invention, where Row (I) is an AFM image of the initial sapphire substrate; Row (II) is an AFM images of the GaAs film; Row (III) is the RHEED pattern after AlAs growth, while Row (IV) is the RHEED pattern after GaAs growth.

FIG. 24(row (II) column (c)) shows a smooth surface for sample S3. Therefore, it is evident that AlAs wets the substrate surface better than GaAs directly. The possible reason for the better surface coverage is the higher bond strength of Al—O than Ga—O. Bond strength for Ga—O, As—O, and Al—O are 374, 484 and 502 kJ/mol, respectively [114]. We already know that the direct growth of GaAs/sapphire gives two growth directions but the gonio scan of AlAs/GaAs/sapphire structure give only one out of plane orientation. However, RHEED shows spots corresponding to (111) orientation, twin orientation, and some other orientation (probably (220) orientation), which is marked by rectangle in FIG. 23(c), during growth of AlAs and GaAs. These orientations could not contribute to the x-ray diffraction due to the small volume. With the presence of AlAs, the FWHM of GaAs grown on sapphire is as low as 220 arcsec (shown in FIG. 21(b)). From the phi scan, as shown in FIG. 22, we have observed the twining of GaAs/AlAs/sapphire system is less than GaAs/sapphire system. A better in-plane correlation between substrate and film was also observed in GaAs/AlAs/sapphire system. The reduction of twining after AlAs nucleation layer insertion could be related to the wetting and coalescence of AlAs islands. The twining during direct growth of GaAs on sapphire can be related to the individual's islands and their equal probability of being any twin phases without preference. Therefore, we have seen 50% twining in the case of GaAs/sapphire system. For the AlAs nucleation layer, small islands coalescence, and wet the substrate during the early stage of growth. The reduction of twin could happen during the coalescence of 3D islands, where one twin phase can dominate to another and expand at the expenditure of another twin phase. This is similar with the case of cubic SiGe growth on trigonal c plane sapphire, where micro-twin lamellas and a significant reduction of twin volume have been reported for thick continuous SiGe layer after island coalescence had been explained by successive gliding of the Shockley partial dislocations (surrounding each twin region) on the adjacent glide planes. Together, these results show that the AlAs nucleation layer in between GaAs and sapphire improves the substrates wetting, twining, in-plane correlation, and results in a better overall quality of GaAs. It should be mentioned that the improvement occurs due to a better chemical interaction between the AlAs and sapphire substrate than the GaAs and sapphire substrate.

Effect of Pre-Growth Substrate Surface Treatment

An atomically flat and clean substrate with step-terraces surface plays an essential role for the improvement of the crystal quality. The substrate preparation before the deposition of epilayer has been effective in reducing twinning. Higher step density enhances the incoming adatoms' nucleation and promotes layer-by-layer growth mode. For example, in heteroepitaxial systems, the step-terraces substrate surface is well-known to control the film's quality and orientation. The inventors have noticed that the sapphire substrate treatment before the growth influences the GaAs film quality. To study the effect of the substrate surface on III-V growth, the inventors have used three different kinds of substrate surface: (a) a corrugated substrate surface with no step-terrace structure (S1); (b) a weakly-defined step-terrace surface (S2), and (c) a well-defined step-terrace surface (S3). The inventors have grown 5 nm AlAs as a nucleation layer followed by 10 nm GaAs on each substrate under the same growth condition. The surface morphologies are investigated by AFM images, as shown in FIG. 24. Substrate surfaces cover deposited materials for all three samples, and the lowest surface roughness is observed for the substrate having a well-defined step-terrace surface. Also, from the comparison of real-time growth as shown in FIG. 24 (row III and IV), the streakier RHEED pattern is observed for the well-defined step-terrace substrate sample. During growth on the step-terrace surface, the surface reconstruction was observed for both AlAs and GaAs. For the GaAs (111) crystal plane, there are two surface reconstructions, GaAs (111)A and GaAs (111)B, which are observed. In GaAs (111)A and GaAs (111)B, the surface is Ga and As is terminated, respectively. Between these the surface reconstruction of GaAs (111)B changes with growth temperature while the surface reconstruction of GaAs (111)A remains invariant. For GaAs (111)B (1×1), (2×2), and ($\sqrt{19}\times\sqrt{19}$) are the usual surface reconstruction but for GaAs (111)A only (2×2) surface reconstruction is observed. During GaAs growth on sapphire, a (2×2) surface reconstructions is observed, and it remains invariant at different growth temperatures, which is similar to the homoepitaxial growth of GaAs (111)A. Therefore, for our grown samples, the orientation of the GaAs layer is (111)A.

Figure 25:
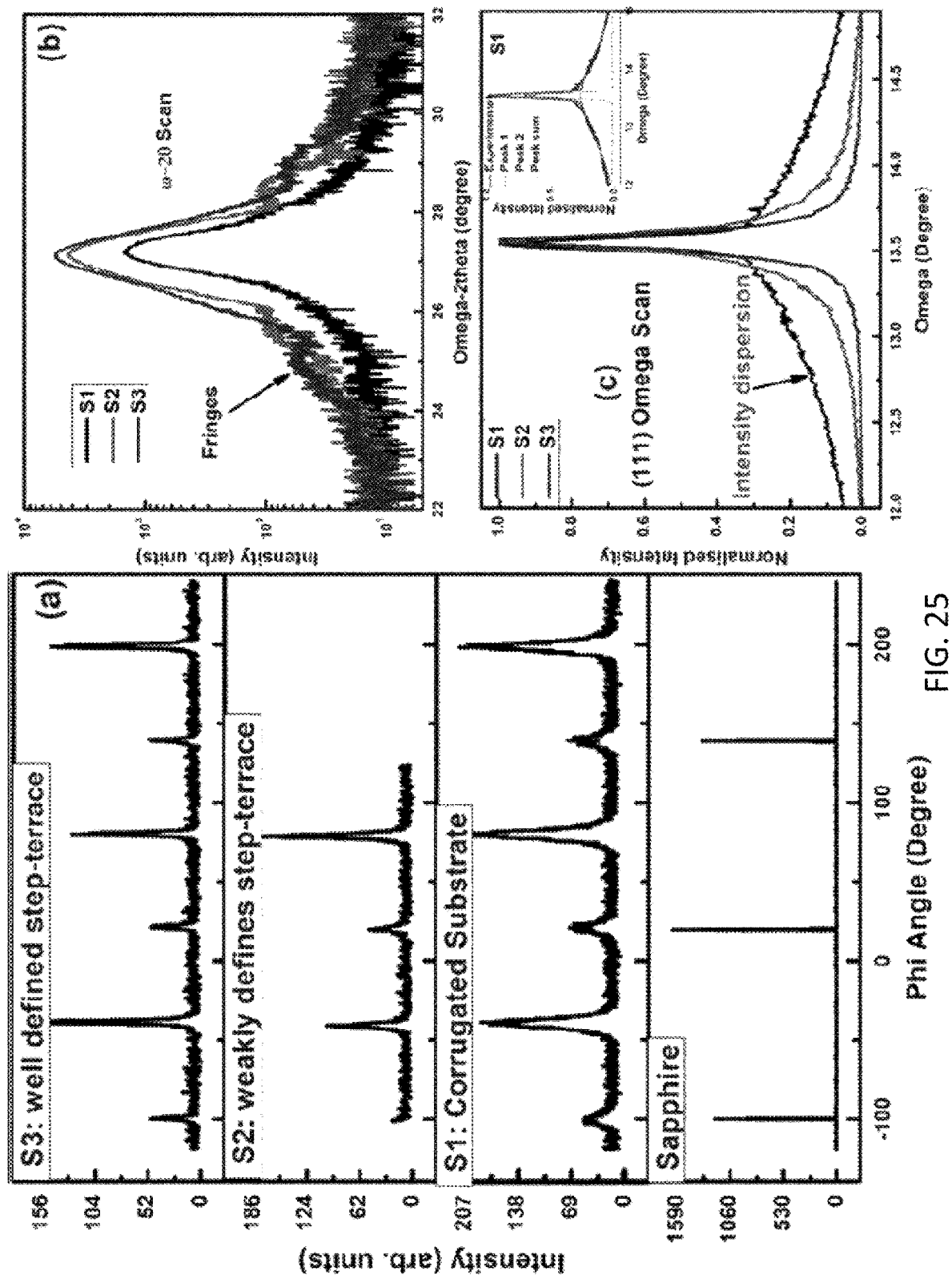
FIG. 25 shows (a) phi-scan, (b) (111) omega-2theta scan, and (c) (111) omega-scan of samples grown on the different starting substrate surfaces according to certain embodiments of the invention.

The twin volume of all three samples of GaAs (220) crystal plane is determined from the phi scan as shown in FIG. 25(a). It shows the twin volume is the same for all samples. Therefore, we can conclude that the twinning of the GaAs/sapphire system does not affect that much by the initial substrate surface. If we closely look at the (220) peak is sharper for the well-defined step-terrace substrate sample than the other two. It indicates a stronger in-plane correlation between substrate and film. This finding also is supported by the $\omega$-$2\theta$ scan of three samples where fringes are observed only for the surface with step-terraces (FIG. 25(b)). Fringes arise from the higher quality heterointerfaces. Rocking curves (FIG. 25(c)) show the intensity dispersion at the base for all three samples. The highest dispersion is observed for GaAs on the corrugated substrate, and the lowest dispersion is observed for GaAs on a well-defined step-terrace surface. Each rocking curve can be fitted with two Gaussian curves: one is having smaller intensity and larger linewidth while the second is having larger intensity and smaller linewidth (shown in the inset of FIG. 25(c) for sample S1). The most reasonable explanation for this behavior is that two peaks arise from two different materials. The broader peak originates from a thin AlAs nucleation layer and a sharp peak from the thicker GaAs. This is difficult to test but the fitting consistently shows a small shift for the broader peak towards large lattice constant. The GaAs on step-terrace substrate shows better in-plane correlation and higher quality heterointerface, which can be explained by nucleation via stronger interaction with the substrate at step edges.

Effect of Growth Temperature

Figure 26:
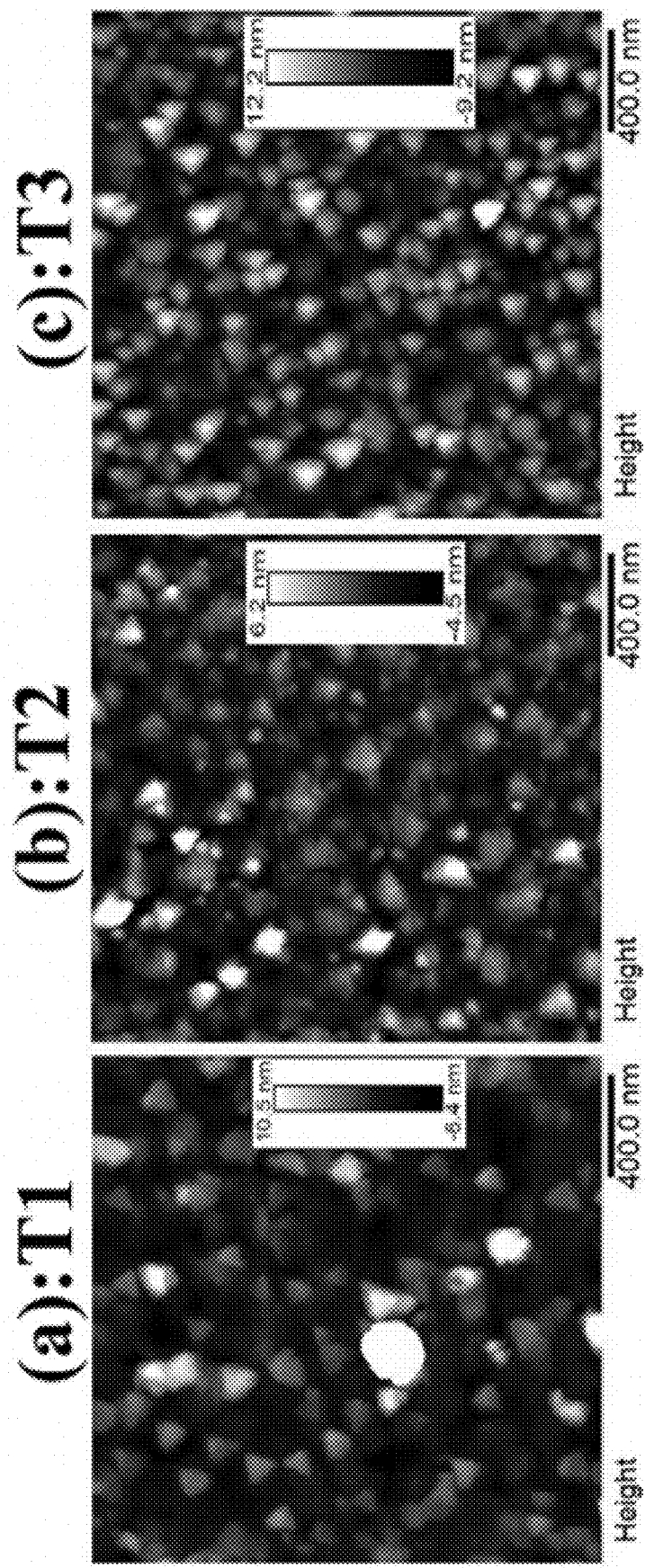
FIG. 26 shows AFM images of GaAs samples grown at three different growth temperature (a) 600° C. (T1), (b) 550° C. (T2) and (c) 500° C. (T3) according to certain embodiments of the invention.

The quality of epitaxial layers is influenced by different growth parameters such as growth temperatures, V/III ratio of beam fluxes, growth rate, and an atomically flat substrate. Early reports of homoepitaxial growth of GaAs (111) give evidence of the importance of growth parameters, predominantly temperature, for the high-quality materials growth. To study the effect of growth temperatures on the GaAs film quality, twinning, surface morphology, and film substrate correlation, 50 nm GaAs on AlAs/sapphire was grown at three different growth temperatures which were chosen: namely, 600° C. (T1), 550° C. (T2), and 500° C. (T3). The 2 μm×2 μm AFM images show the surface morphology of these samples, as shown in FIG. 26. The triangular-shaped hillocks are observed on these samples, which are characteristic of GaAs (111) growth. The root mean square roughness of these samples grows at 600° C., 550° C., and 500° C., are 4.59, 1.7, and 3.72 nm, respectively. Among these samples, the lower density of hillocks and smooth surface is observed for the sample grown at 550° C.

Figure 27:
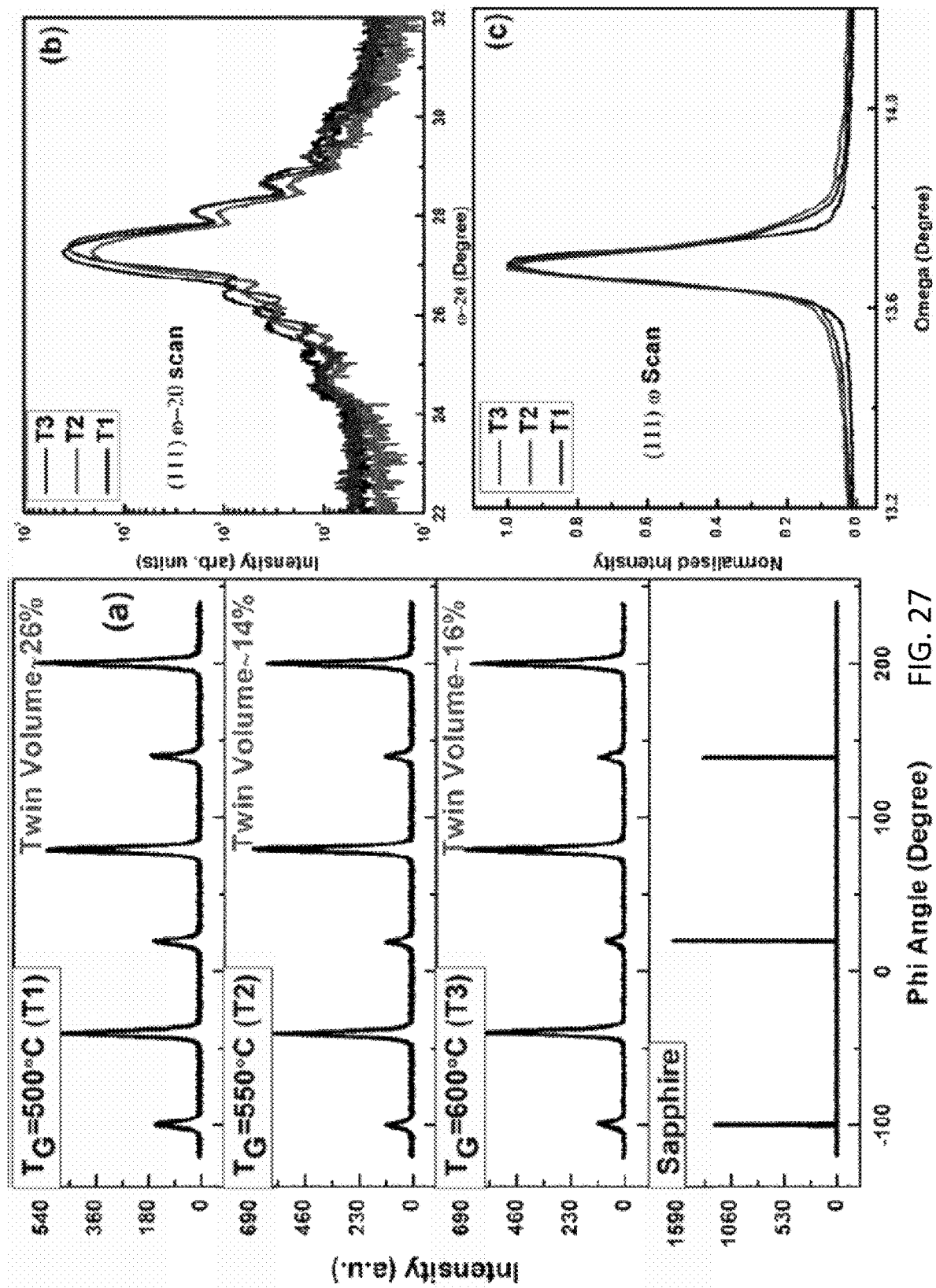
FIG. 27 shows (a) (220) phi-scan, (b) (111) omega-2theta scan, and (c) (111) omega-scan of samples grown on different growth temperatures according to certain embodiments of the invention.

Phi-scans (FIG. 27) show that twinning existed in all three samples, and the growth temperature affect twinning considerably. The highest twin volume is observed for the sample grown at relatively low temperature (500° C.). Out of plane measurements in FIG. 27(b) show only (111) crystal orientation. The abrupt heterointerface can be confirmed in all three samples from the fringes. It is also noted that the fringe spacing decreases with the temperature indicating that the thickness of the GaAs layer is certainly dependent on the growth temperature. The FWHM of the rocking curves (FIG. 27(c)) of GaAs around [111] direction has almost the same value, which indicates that the crystal quality is the same in all three samples.

Effect of In-Situ Annealing

Figure 28:
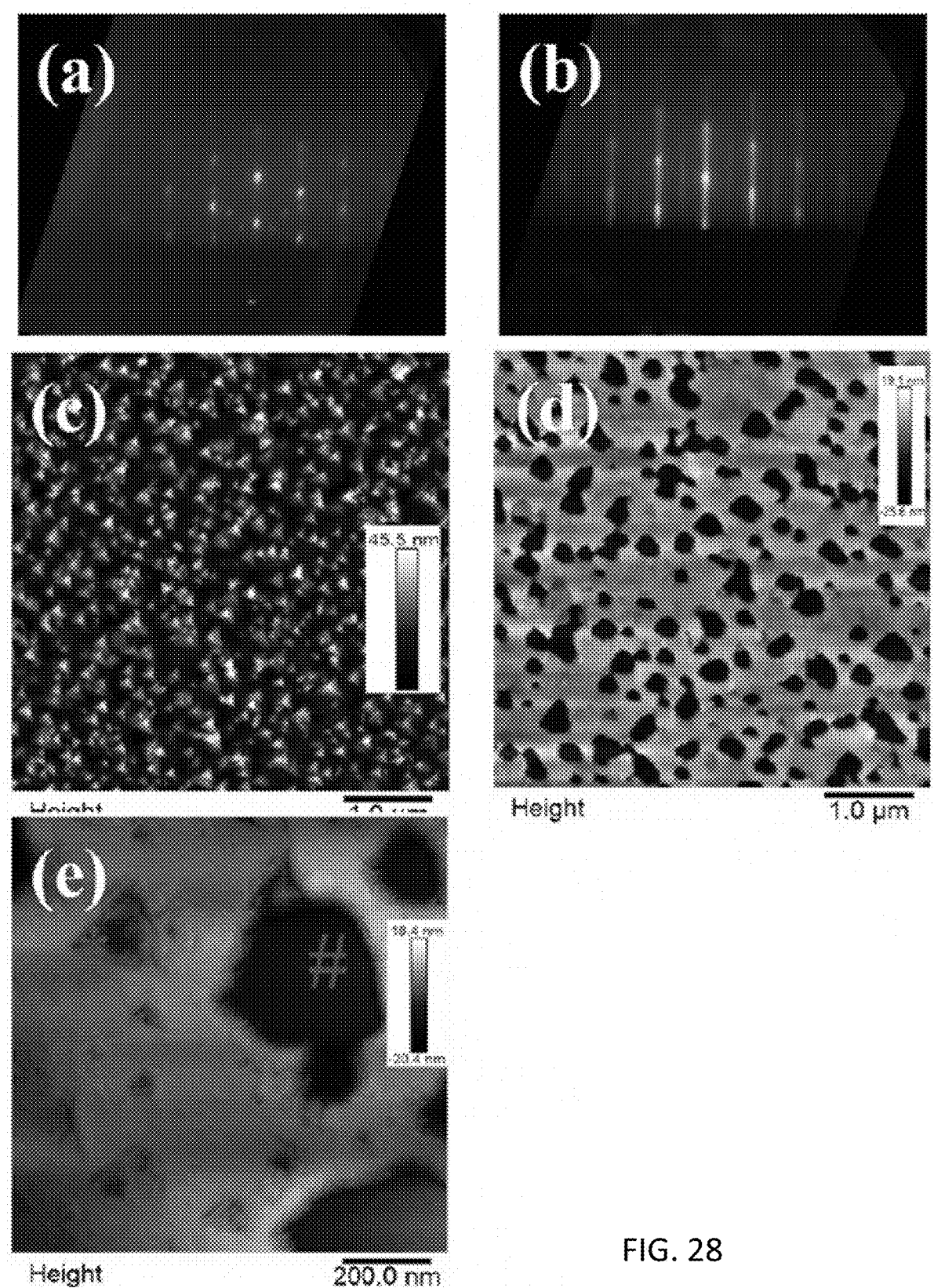
FIG. 28 shows RHEED pattern from sample Al (a) after the GaAs growth and (b) after in-situ annealing; 5 μm×5 μm AFM image of (c) 50 nm GaAs (S50), (d) after in-situ annealed sample (S50-annealed) (e) 1 μm×1 μm AFM images of the in-situ annealed sample according to certain embodiments of the invention, where symbol "*" shows a triangular pit and symbol "#" shows an irregular shape pit.

The annealing can improve both the surface and the bulk of the grown film of heteroepitaxial systems. In this work, in-situ annealing was performed at the end of GaAs (50 nm) growth on AlAs/sapphire under As2 overpressure to investigate its effect on crystal quality, twining, surface, and bulk properties of GaAs. FIGS. 28(a) and (b) show the RHEED patterns before and after in-situ annealing of 50 nm GaAs on the AlAs/sapphire (S50). The annealing was done at 800° C. for 1 minute under arsenic overpressure. The RHEED image shows a spotty and twinning before annealing, while the streaky plus spotty RHEED pattern is observed after annealing. The streaky plus spotty pattern indicates the rough surface with a large flat area. After annealing, no observable twinning is observed in the RHEED pattern, and the reconstruction streaks appear, which indicate a quality smooth surface. AFM image of S50, shown in FIG. 28(c), shows the characteristic pyramidal features. AFM images in FIGS. 28(d) and (e) show the same in-situ annealed samples' surface morphology. The in-situ annealed sample shows the appearance of surface pits with an otherwise smooth surface. Spots in the RHEED for this surface is due to the surface pits.

Triangular (which is small in size) and irregular-shaped (big in size) pits are observed in the AFM images of the S50 annealed sample. The possible reason for the larger irregular pits is the agglomeration of multiple triangular-shaped pits or expansion of these triangular pits laterally due to desorption [23]. The triangular base stacking fault is very common during the growth on GaAs (111)A, and it grows into 3d stacking fault tetrahedron (SFT). Twin features are observed due to these SFTs, and they are thermodynamically unstable possibly due to their small size and defect boundary. As a result, the SFTs region material can be evaporated at the annealing temperature and formed triangular pits. Supporting this explanation, the pits surface area is a similar fraction of the total surface area indicating that the minor twin has evaporated leaving only the original phase behind.

Figure 29:
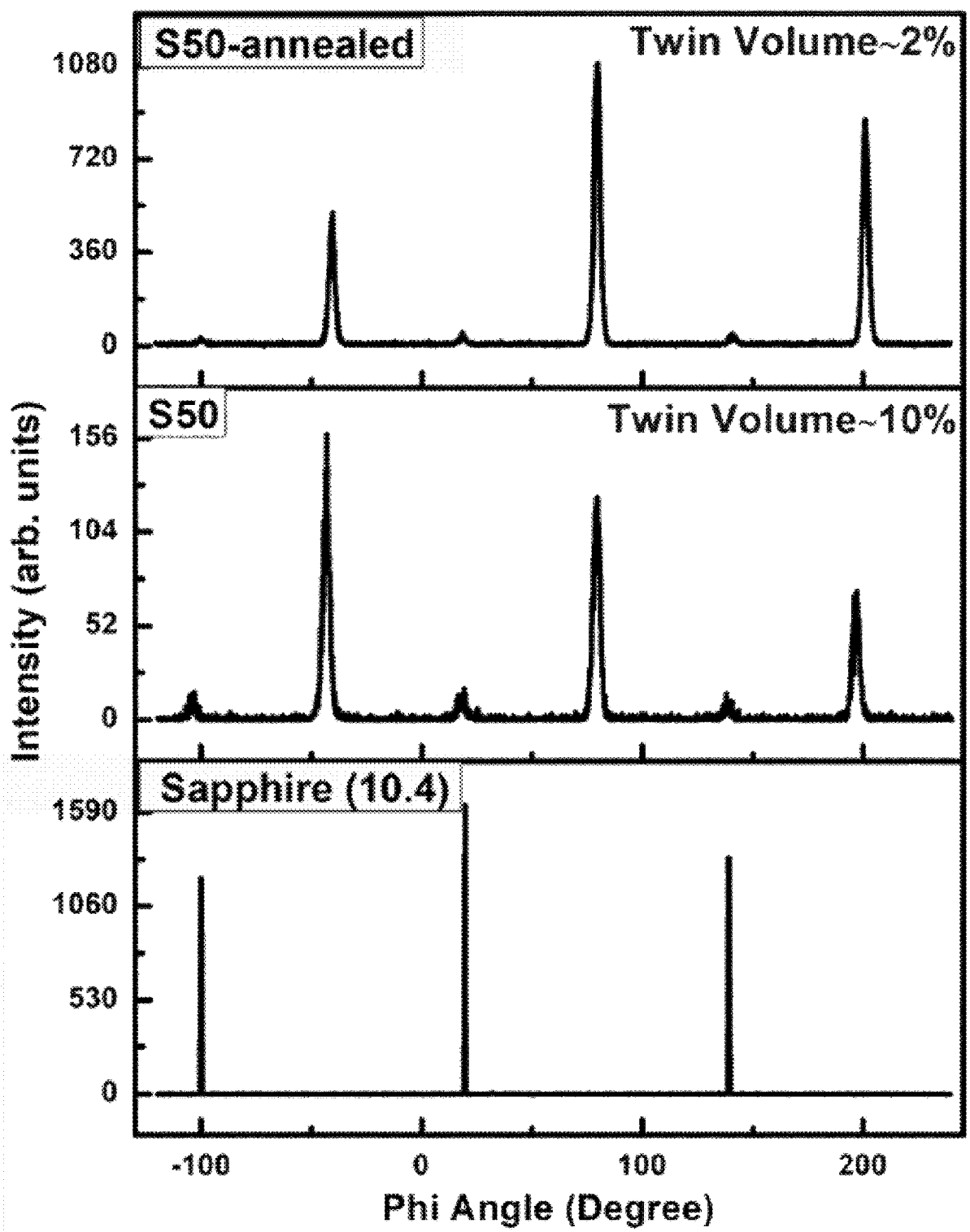
FIG. 29 shows phi scan of (10.4) plane of Sapphire and (220) plane of 50 nm GaAs sample (S50) and in-situ annealed sample (S50-annealed) according to certain embodiments of the invention.

Phi-scan of the in-situ annealed sample (FIG. 29) shows that the twin volume is now less than 2%. This is consistent with our explanation that the triangular shape of the stacking fault can be the reason for the formation of triangular pits. Given that the material from SFTs evaporates during annealing and the in-situ annealed sample shows only one phase remaining, optimization of the annealing temperature and time, can result in a twin free GaAs layer. This can be used as an initial template for high-quality GaAs growth for electronic and optoelectronic applications. Further studies will focus on optimizing growth and annealing parameters for obtaining twin-free GaAs template for device quality GaAs growth.

Two-Step Growth

Figure 30:
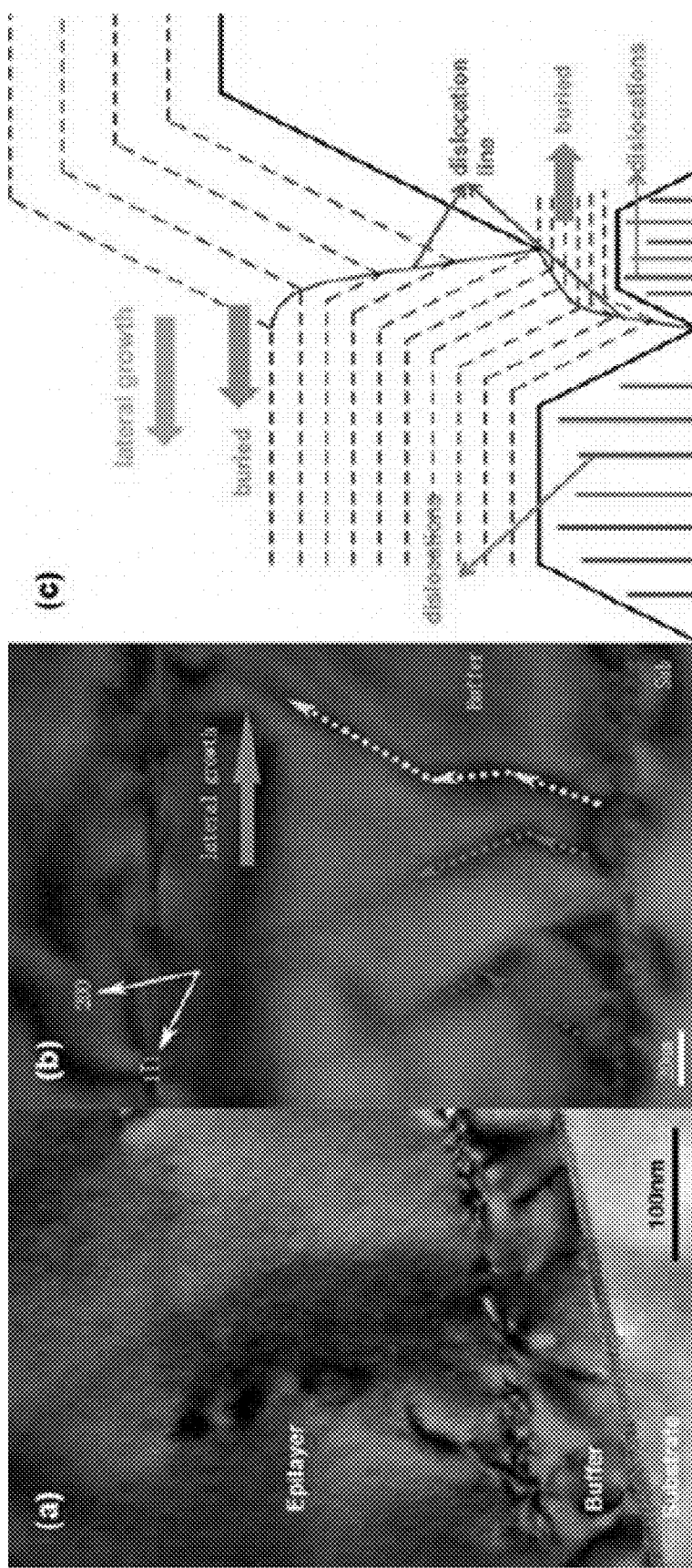
FIG. 30 shows (a) High-resolution cross-sectional TEM image of the $In_{0.78}Ga_{0.22}As/LT$-InGaAs/GaAs interface regions, (b) dislocation bending is shown by green, red and yellow lines, and (c) a brief schematic model of dislocation bending according to certain embodiments of the invention.

It is shown that GaAs direct growth on c plane sapphire follows 3D growth mode with 50% twin formation, poor wetting of the surface, and the weak interaction between film and substrate. The presence of AlAs thin nucleation layer improves the wetting of the surface and reduces twinning. Clean atomically flat sapphire substrate enhances the heterointerface interaction between film and substrate. Likewise, twining and GaAs surface morphology are very sensitive to the growth temperature and in-situ annealing. Until now, the knowledge of the GaAs/sapphire growth system gives us enough confidence that further optimization of growth parameters and annealing parameters (annealing time and temperature) can result in high-quality twin-free GaAs film. Also, for the growth of high-quality film in a high lattice mismatch system, the different growth strategies are familiar such as—(1) two-step growth, multiple annealing, and strained-layer superlattices (SLS). These strategies improve the crystal quality by suppressing defects in the epitaxial layer. In the following section, the discussion will be focused on the importance of two-step growth and growth parameters for the growth of GaAs on c plane sapphire. A low temperature (LT) GaAs layer is used as a first step in two-step growth mode, followed by a higher temperature (HT) growth layer of GaAs. The mechanism of the two-step growth mode to reduce the dislocation density is discussed by different models in the literature. The most familiar model is the bending of dislocation at the interface of LT GaAs and HT GaAs due to the sudden transition in stress. It is known from the literature that low-temperature GaAs has a lattice constant larger than the lattice constant of high temperature GaAs. The excess $As_2$ adsorption at low temperature is the main reason for the lattice parameter difference. As a result, the interface between the low-temperature GaAs and the high-temperature GaAs generates misfit dislocation, suppresses the threading dislocations by bending. The dislocation blocking model states that island coalescence blocks the dislocation in the low-temperature buffer layer, as shown in FIG. 30(a), (b), and (c). FIG. 30(a) shows a high-magnification cross-sectional TEM image of $In_{0.78}Ga_{0.22}As$/LT-InGaAs/GaAs interface region. This image is used to interpret the mechanism for the dislocation density reduction by the LT-buffer. A brief model of dislocation bending is shown in FIG. 30(c) where a large island buries the small island, and the dislocation line bends at the interface back and forth. Therefore, many dislocations of small islands will be blocked down. For example, FIG. 30(b) shows that the red dislocation line bending towards the right and blocks the right neighboring small island. After that, when the former island meets with a larger island that has a faster later growth rate the dislocation line bends towards small island. The large island buries the small island and as well as the dislocations are located in small islands.

Figure 31:
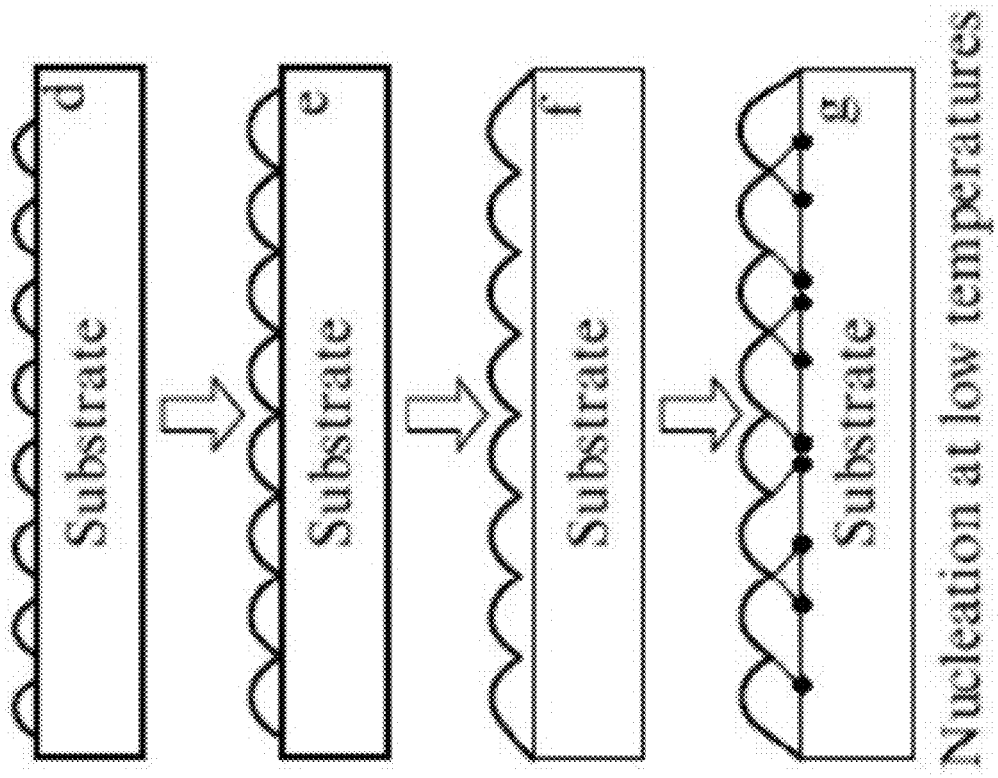
FIG. 31 shows misfit dislocations generation according to certain embodiments of the invention, where the left shows defects are introduced before the island's coalescence, and the right shows defects are introducing after the island's coalescence.
Figure 31:
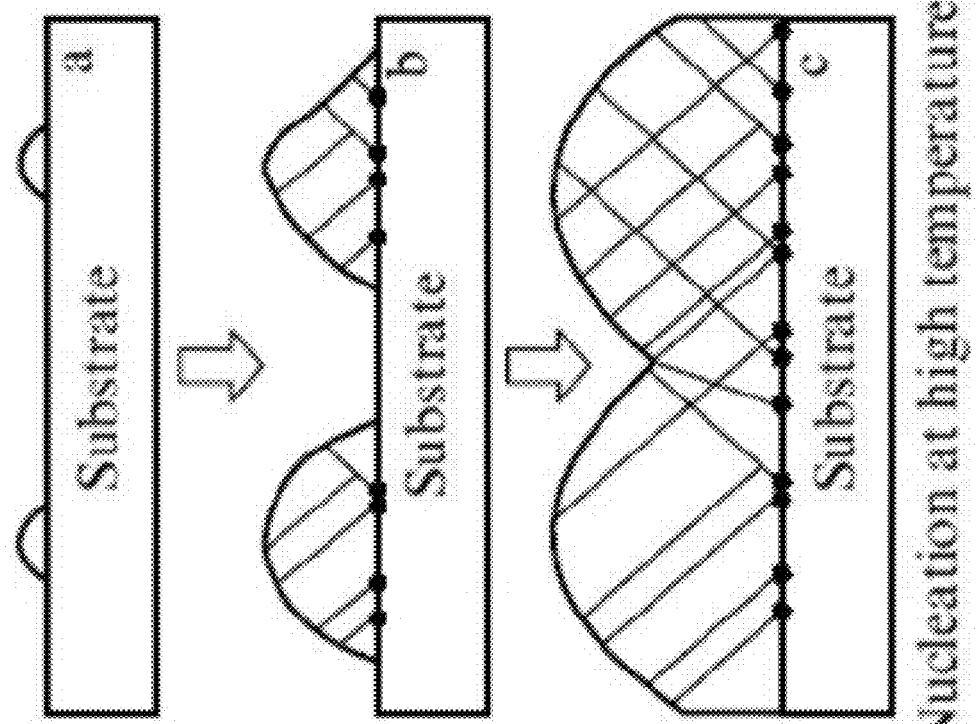

The generation of dislocation model states that the dislocation starts before or after island coalescence as shown in FIG. 31(a-g)]. At high-temperatures, defective islands are formed even before they coalescence, (FIG. 31(b)). Many immobile defects are formed when such islands coalescence (FIG. 31(c)), and difficult to remove such defects by further operations like annealing, the growth of higher-thickness layer, etc. At low-temperatures, many small islands are formed, and defects are introduced during the coalescence of islands, as shown in FIG. 31(d-g). Since at low-temperature case the island density is higher than the high temperature, so the number of defects is higher at low-temperature growth.

From the above knowledge, the inventors were encouraged to investigate the effects of two-step growth, the thickness of the low-temperature layer, and multiple annealing in our GaAs/sapphire system. More specifically, the schematic diagram of the structure is investigated, with a total growth time of about 1 hour, is shown in FIG. 6. Three different samples with different thicknesses corresponding to the growth time of 16 minutes (S1), 8 minutes (S2), and 0 minute (S3) are grown to study the effectiveness of the added growth of an LT GaAs layer. The low-temperature GaAs layer growth temperature is 600° C., and the subsequent GaAs layer growth temperature is 700° C.

Surface Characterization

Figure 32:
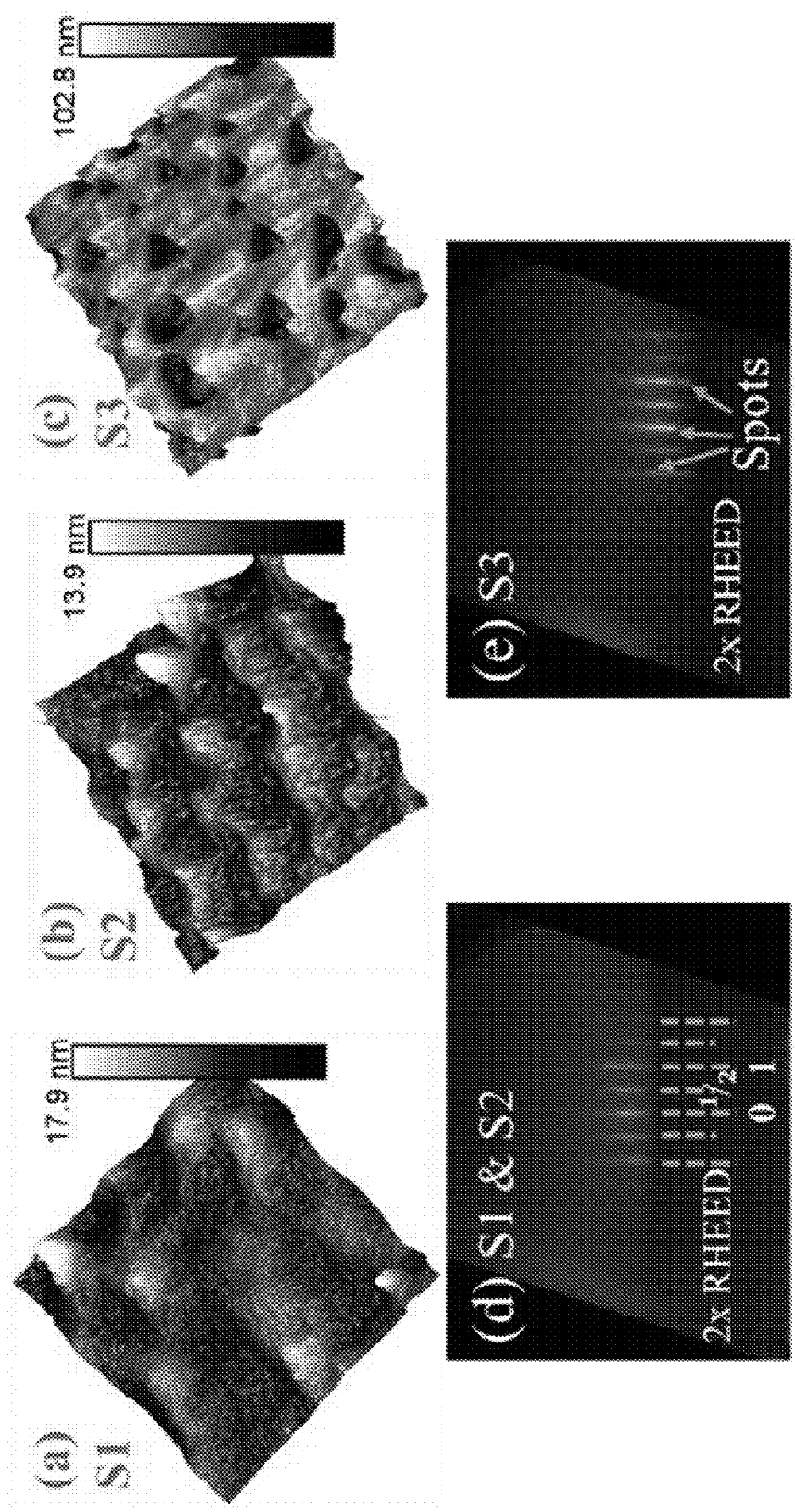
FIG. 32 shows AFM images (5 μm×5 μm) of (a) S1, (b) S2, (c) S3; RHEED images along [11̄0] direction of GaAs (d) after growth of entire structure of S1 and S2, 0th, ½th and 1st order RHEED streaks are marked, longer broken lines show the integer-order RHEED streaks whereas shorter broken lines show fractional-order RHEED streaks; and (e) after growth of S3, spots riding on streaks can be seen, few spots are shown by arrows, according to certain embodiments of the invention.

The surface morphology of these samples is shown in FIG. 32(*a-c*). Pyramidal hillocks are present on the surface of all samples. For the sample without an LT layer (S3), random-shaped large and deep pits are also observed. The penetration depth of these pits is up to 60 nm of GaAs film. The RHEED images shown are taken, at the end of the growth of these samples (FIGS. 32(*d*) and (*e*)). A streaky RHEED pattern with clear spots on the streaks, is observed for the sample without LT layer GaAs growth or t1=0 (S3) sample. The (2×2) streaky RHEED patterns after the growth for samples with LT layer (S1 and S3) indicate a smooth surface compared to the rougher surface for S3. The root mean square surface roughness of samples S1, S2 and S3 is observed from the 5 μm×5 μm AFM images are 1.76 nm, 1.55 nm, and 9.46 nm, respectively. Therefore, the LT GaAs layer's presence improves the surface morphology which is confirmed from both AFM and RHEED images. Even though, the RMS roughness value of S1 is higher than S2, the pyramidal hillock density is the smallest in S1.

Figure 33:
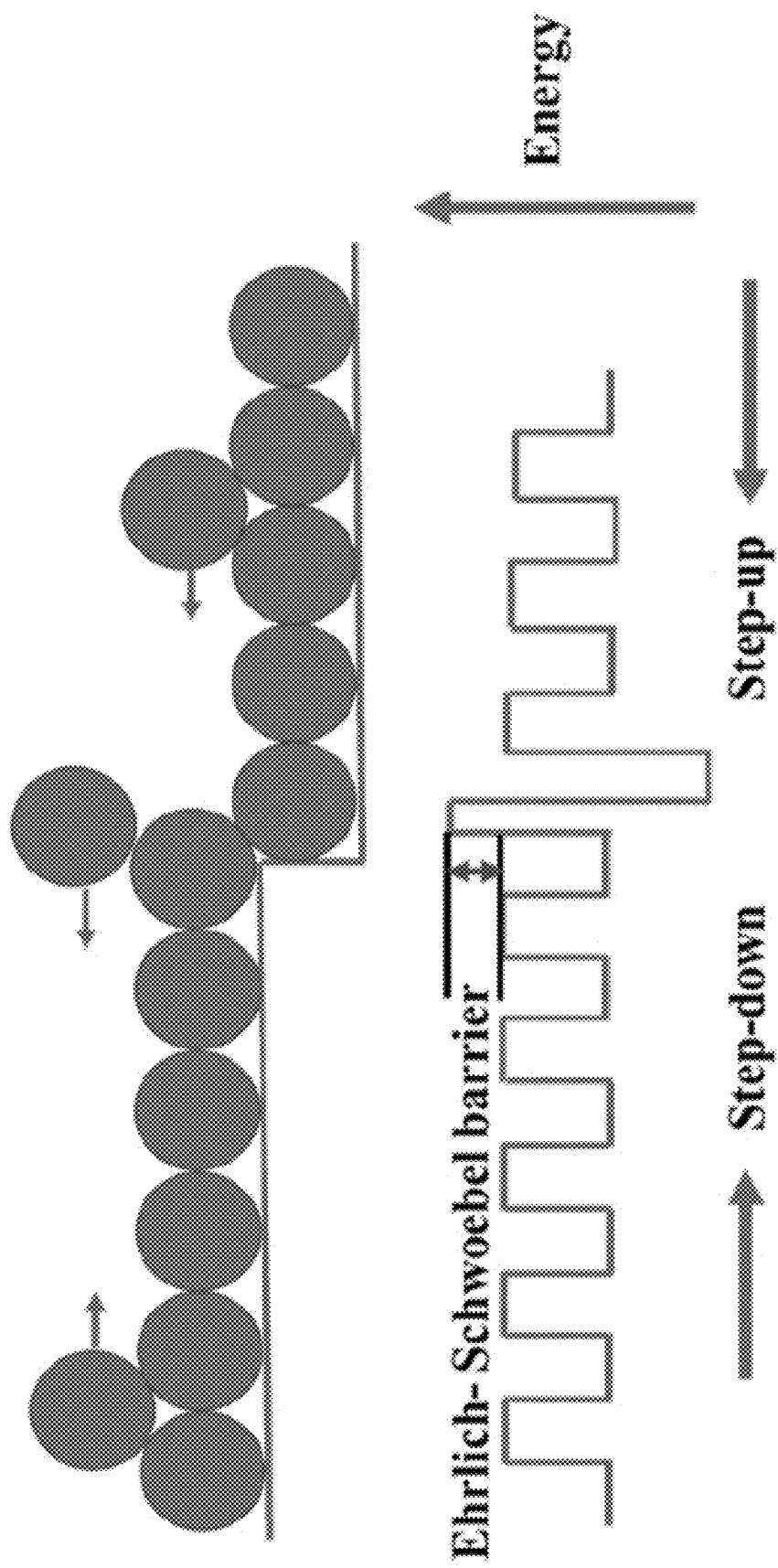
FIG. 33 shows Ehrlich-Schwoebel barrier shows the high-energy barrier at the step according to certain embodiments of the invention.

The pyramidal features of GaAs (111)A are related to the Ehrlich-Schwoebel (ES) barrier or by adatom motion in the presence of stacking faults. According to the ES barrier, when an adatom diffuses from step to edge, it experiences a high energy barrier due to fewer neighbor atoms. At low temperatures, adatoms reflect from the high-energy barrier and grow like 3D growth mode. On the other hand, high temperature helps to overcome the high-energy barrier and grows like 2D mode as shown in FIG. 33.

Surface pits are unusual for the homoepitaxial GaAs (111)A growth. It likely has a different origin than hillock formation. It has been reported that on GaAs (111), surface etch pits are formed due to thermal or chemical etching. It is well known that these etch pits are related to defects in the crystalline film. For the sample with no LT GaAs (S3), the pits on the surface indicate high defect density in the film during growth and pits' formation by etching during the growth and/or annealing processes. For example, during growth, Ga droplets can be formed due to the low sticking coefficient of arsenic on a GaAs (111)A surface which can etch on the epitaxial film. The thickness of the samples is calculated from the XRD and ellipsometry. The lower sticking coefficient of As on GaAs (111)A surface compared to GaAs (100) surface is responsible for the lower actual thickness than the nominal thickness. The low As incorporation to GaAs (111)A crystal plane can be explained in terms of dangling bonds.

Figure 34:
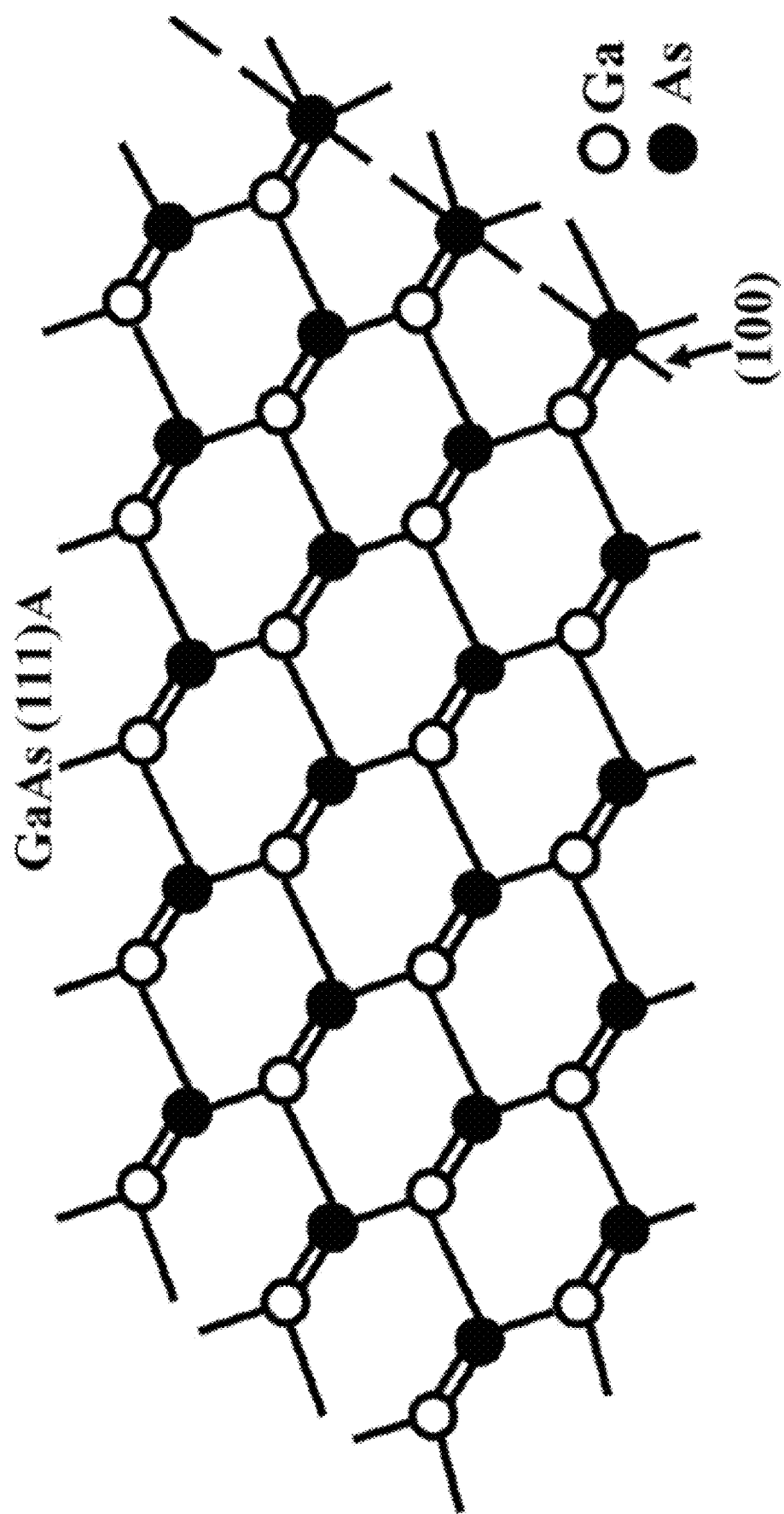
FIG. 34 shows a side view of GaAs (111)A surface according to certain embodiments of the invention.

FIG. 34 shows the side view of GaAs (111)A, where the surface Ga makes three bonds to the bulk GaAs in the GaAs (111)A and two bonds to the bulk GaAs (100). Therefore, each Ga atom on the surface has only one dangling bond in GaAs (111)A and two dangling bonds in GaAs (100). The smaller number of dangling bonds of Ga atoms on GaAs (111)A surface is responsible for the low sticking coefficient of As. For each sample, the thickness is obtained around 70 nm, far less than the nominal thickness we expected. Thickness values for samples S1, S2 and S3 are listed in Table 3.

TABLE 3

Thickness of III-As film on sapphire.

| Measurement method | S1 | S2 | S3 |
|---|---|---|---|
| XRD | 71 nm | 72 nm | NA |
| Ellipsometry | 61 nm | 69 nm | 62 nm |

The pits' depth in the S3 sample is almost the same of GaAs thickness. The observed pits in the AFM image of S3 may have penetrated down to the thin AlAs nucleation layer. This could happen either due to the weakly bonded atoms near defected regions, which evaporates during annealing and/or a lower growth rate on top of the defected region.

Structural Characterization

Figure 35:
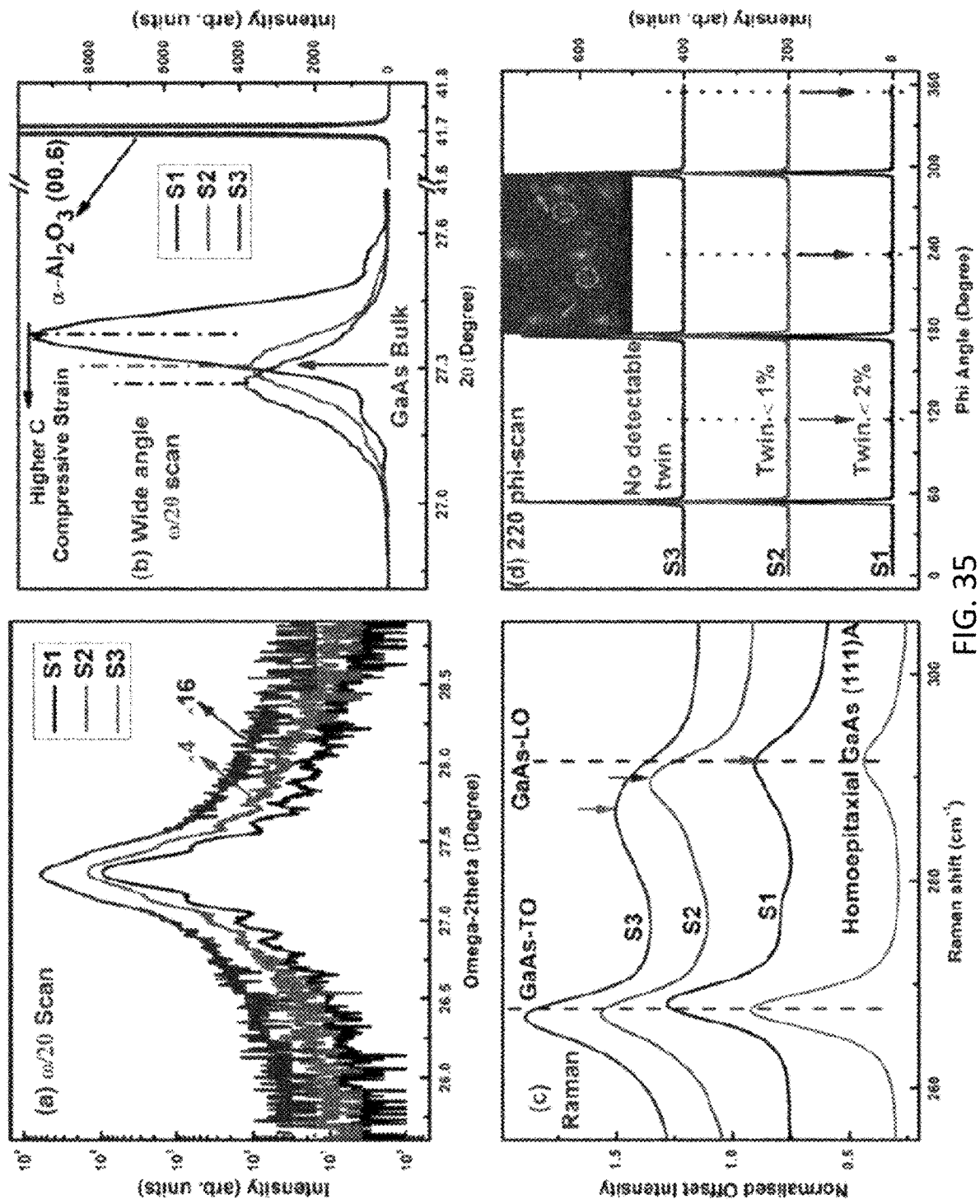
FIG. 35 shows (a) Omega/2theta scan of samples grown with three different LT layer thickness', GaAs peak is centered at same 2θ angle to show the shape variation and fringes of GaAs (111) plane diffraction peak in three samples; (b) (111) symmetric Omega/2theta scan showing the shift of GaAs (111) peak with respect to sapphire (0006)

Only (111) crystal orientation was observed from out-of-plane measurements of all three samples, as shown in FIG. 35(*a*, *b*). As shown in FIG. 35(*a*), thickness fringes are observed for samples with the LT GaAs layer (S1 and S2). Fringes arise due to the interference of the diffracted beam from smooth surfaces. The absence of fringes for sample S3 indicates the rougher surface morphology with nonuniform thickness. If we compare the fringes nature of sample Si and S2, then prominent fringes are observed for sample Si than the sample S2, although the RMS roughness of S1 is higher than S2. This could be due to the low density of pyramidal hillocks or, in other words, S1 has a larger surface area of high smoothness. Importantly, the thickness was calculated from the fringes of both samples and listed in Table 3.

Samples show the peak shift from the bulk GaAs peak position, as observed in FIG. 35(*b*). Such peak shift can happen either due to strain or crystallographic tilt in an epitaxial film. Hence, it is difficult to conclusively state that the strain in GaAs film from these w-2θ scans. Raman spectroscopy is used to measure the strain in thin films. FIG. 35(*c*) shows the longitudinal optical (LO) peak and transverse optical (TO) peaks of Raman spectroscopy of samples S1, S2, and S3 along with GaAs (111)A substrate. The LO peak position of Si sample and GaAs (111)A substrate, is almost the same. For S2 and S3, the LO peaks are shifted towards the left. The highest peak shift and the lowest phonon frequency for the GaAs LO peak is observed for sample S3. These results suggest that Si has the least strain, whereas S3 is the most tensile strained among all three samples.

Phi-scans of sapphire (10.4) plane and GaAs (220) plane have been done as shown in FIG. 35(*d*). Three arrow signs correspond to three sapphires (10.4) crystal planes, which are separated 120° degrees from each other. This indicates trigonal space symmetry of sapphire substrate. In-plane epitaxial relationship between the sapphire substrate and GaAs is confirmed from the phi scan (and also from RHEED), and it is found to be $[11\bar{2}0]_{sapphire} \| [1\bar{1}0]_{GaAs}$. From the phi scans, almost no twinning is observed for all three samples. A slight hump is observed in the phi scan of sample S1 which indicates the presence of twinning. This can be explained as due to the low growth temperature, during LT GaAs growth, a large amount of twins are generated which can be seen in the RHEED image (shown in the inset of FIG. 35(*d*). The RHEED image shows a rough surface and the presence of twinning. However, the higher intensity of emitted photons in PL measurements and the small linewidth of the diffracted beam in RC measurements indicates that the top GaAs layers are free from twinned materials. This also confirms the effectiveness of the annealing steps to suppress twins.

The HRTEM was used to investigate the interface between the GaAs film and sapphire substrate. FIG. 36(a) shows the HRTEM image of sample S1 near the interface. The high-quality sapphire substrate is confirmed from the sharp film/substrate interface. As expected, the highly defective interface of film/substrate is observed. Broken lines in the image indicate the stacking fault. It is important to closely observe that most of the defects are confined at the film/substrate interface, and such defects do not propagate to the top GaAs layer. As a result, high-quality GaAs is obtained after only 70 nm of GaAs growth. This proves the high effectiveness of the LT GaAs layer to confine defects within itself. FIG. 36(c) shows the effect of defect propagation on the films' surface to cause a pit at the surface.

The RC measurements of these three samples are shown in FIG. 36(b). It is a great way to assess the quality of the crystal materials. More specifically, the lower FWHM of the rocking curve indicates the less deviation of the crystal planes from the growth direction. Each RC curve shows a sharp peak with broadening at the base, suggesting that the curve is the sum of two effects. Two Gaussian curves are fitted with each RC curve: one with a lower linewidth and the other with a higher linewidth. The Gaussian fittings results of each sample are listed in Table 4. The highest ratio of integrated intensity between the broader and sharper peak is observed for the sample with no LT layer (S3), while the lowest ratio is observed for sample S1. The most likely reason for this RC base broadening is the presence of point defects in GaAs. The point defects in the epitaxial layers often contribute to the broadening of the peak. A second possible explanation is two different regions of different GaAs quality that making-up the film constructs these two curves. We have observed from the HRTEM image that the material near the film-substrate interface has poorer quality than the region away from the interface. In S3, the higher integrated area of the broader peak with respect to the sharper peak indicates that this sample has either a higher volume of low-quality GaAs or simply has more point defects. Both sharper and broader peaks of the S1 sample indicate that the LT layer improves the crystallinity of GaAs. Judging from HRTEM, GaAs' higher quality in Si might be related to efficient bending of dislocations along the LT GaAs/GaAs interface to form misfit dislocations (MDs). This is reasonable since there is higher stress accumulation at the interface due to the higher thickness of the LT layer in S1.

TABLE 4

Linewidth and integrated intensity ratio of broader and sharper curves from Gaussian fitting of RC for samples S1, S2, and S3

| Sample ID | Linewidth of sharper peak (arcsec) | Linewidth of broader peak (arcsec) | Integrated intensity ratio of broader to sharper peak |
|---|---|---|---|
| S1 | 187.2 | 1195 | 1 |
| S2 | 187.2 | 1710 | 5.2 |
| S3 | 212.4 | 1364 | 6.6 |

Photoluminescence (PL)

The PL measurements of three samples are also performed to investigate the crystal quality as shown in FIG. 37(a). The highest PL peak intensity among three samples is observed for sample S1. This indicates the highest quality GaAs material for Si sample which is consistent with the result of AFM and XRD. From the images for all three samples the PL peak does not occur at the same energy. This may occur due to the background noise, especially in the case of S3.

In summary, the S1 sample has the narrower PL, RC linewidths and a higher PL intensity, indicating that near the top GaAs layer of the S1 sample has less defect density, and it would be the best candidate to grow active device layers on it. With this in mind, on top of the S1 sample, a 10 nm wide In0.1Ga0.9As/GaAs QW ((S1-QW) is grown. The composition and thickness values of the QW are nominal. To compare it with the homoepitaxial system, we also grew the same QW on a GaAs (111)A substrate (p-InGaAs-QW). The comparison of PL spectra of homoepitaxial QW and the QW on the Si sample is shown in FIG. 37(b). Theoretical PL peak position for electron energy level to heavy-hole energy level is near 1.37 eV. However, in this case, the observed PL peak position of QW occurs at 1.49 eV. It has been observed the small actual thickness of the GaAs compared to the nominal thickness, likely due to the different sticking co-efficient. In Table 5, the PL linewidth, peak position, and integrated intensity of both samples are listed. The InGaAs QW's PL intensity on sapphire is of the same order as observed for the QW on the GaAs substrate. However, the QW peak broadening in the case of GaAs on sapphire is higher. This can be due to the surface roughness and/or higher defect density resulting from the substrate and film material properties mismatch. Both can be improved and is the focus of our future work. While more research is required, the inventors have presented the potential to realize an integrated microwave photonic chip on a sapphire platform.

TABLE 5

Integrated intensity, linewidth, and peak position of QW PL peak from both QW samples.

| Sample ID | Integrated intensity (arb. units) | Linewidth (meV) | Peak position (meV) |
|---|---|---|---|
| S1-QW | 550 | 32.52 | 1491.2 |
| p-InGaAs-QW | 192 | 9.12 | 1494.4 |

Thickness Optimization

Growth Temperature Variation

As discussed, grown GaAs' actual thickness on the c-plane sapphire substrate is less than the nominal thickness. The low As2 incorporation on the GaAs (111)A crystal plane, higher growth temperature, and annealing temperature can be the reasons of thickness reduction reasons. The thickness improvement is essential for the GaAs/sapphire system due to the higher thickness improves the crystal quality and the light emission property of material. To improve the thickness, we have reduced the growth temperature from X=700° C. (S1) to X=650° C. (S2). FIG. 38 shows schematically a sample structure according to certain embodiment of the invention.

The AFM (5 μm×5 μm) and RHEED images are shown in FIG. 39. Streaky RHEED pattern is observed for sample S1, indicating the smooth surface. Streaky plus spotty pattern is observed for sample S2, indicating the rough surface. The (2×2) surface reconstruction is observed for both samples, and it remains invariant irrespective of growth temperatures. The pyramids and the truncated pyramids are observed for samples S1, and S2, respectively. The sample's surface roughness is 1.76 nm (S1) and 47 nm (S2) is determined from the AFM images. The truncated pyramids density is higher in the S2 sample than the pyramids of sample S1.

The stacking fault is responsible for the pyramids and the truncated pyramids. The excess vacancy agglomeration along the <110> of {111} planes generates a Frank sessile dislocation loop. The high energy triangular Frank sessile dislocation may dissociate into stair-rod dislocations along the <110> edges and Shockley-partial dislocations along the three remaining {111} planes. The partial dislocations will bow out in their slip planes due to the repulsion by stir-rod dislocations. The stacking faults increase the energy in the different faces. If the energy is low then stacking fault tetrahedron (SFT) is formed, otherwise Frank loop partly dissociate and forms truncated pyramids.

Omega/2theta measurements were performed to determine the crystal growth direction of both the samples. FIG. 40(*a*) shows, only (111) crystal orientation is observed. For the S1 sample, prominent fringes are observed but not for the S2 sample. The Si sample thickness is 75 nm, measured from the XRD fringes and ellipsometry whereas the S2 sample thickness is 270 nm, measured from the ellipsometry. The lattice mismatch, thermal mismatch and residual contamination introduces interface roughness. If the interface or surface is not smooth, X-ray scattering loses coherency, and fringes disappear. FIG. 40(*b*) shows the normalized rocking curves of the samples S1 and S2. The sample S2 has higher surface roughness, but a smaller FWHM of the rocking curve than S1. The possible reason for the smaller FWHM can be the higher thickness of the film, which reduces the inhomogeneous strain distribution and an increase of coherence length. The phi scan (FIG. 40(*c*)) shows the twinning has increased at low-temperature growth, which is similar to previous studies. The low-temperature PL was measured at 10 K, and the FE emission was observed for both samples, as shown in FIG. 40(*d*). The FE for Si was shifted 4 meV from the ideal FE position, and the local stress can be responsible for shifting the FE emission peak. For sample S2, the defect state peak arises from the recombination of free or donor bound electron to acceptor recombination. Room temperature PL emission was observed for the sample S2, as shown in FIG. 41.

Effects of Annealing

Three samples A1, A2, and A3 are grown to study the effects of annealing on the crystal quality. The schematic diagrams of the samples are shown in FIG. 42. The sample A1 was grown without annealing (X=0 s), A2 was annealed two times at 800° C. for 45 s with the presence of As2 as shown in FIG. 42(*a*), A3 was annealed by thermal cycle annealing (TCA), and the TCA steps are shown in FIG. 42(*b*). The TCA temperature range was selected from the promising results of GaAs grown on Si by TCA to construct the InGaAs/AlGaAs quantum-well lasers.

The surface morphology of the samples A1, A2, and A3 are shown in AFM images (FIG. 43). The truncated pyramids are observed for all the samples. For sample Al, highly dense truncated pyramids are observed. The top flat area of the pyramids increased after introducing annealing and TCA. The edges of the pyramids suffer from dislocations, and during annealing, under thermal stress, the top flat area can be increased by the coalescence of the dislocations edges. In sample A3, the materials desorption or etching generates valleys, as shown in FIG. 43(*c*). The noncongruent evaporation at high temperatures in GaAs (111)A is observed where arsenic evaporates more intensively than gallium atoms. The excess of metal atoms leads to the formation of Ga droplets and etches the materials.

Only (111) crystal orientation was confirmed from the out-of-plane measurements (FIG. 44(*a*)). The FWHM from the rocking curve is listed in Table 6.

TABLE 6

Surface roughness, thickness, and FWHM of the samples A1, A2 and A3.

| Samples | Surface Roughness (nm) | Thickness (nm) | FWHM |
|---|---|---|---|
| A1 | 44 | 496 | 818 |
| A2 | 47 | 270 | 112 |
| A3 | 21.6 | 89 | 103 |

The A1 sample without annealing shows the maximum FWHM among three samples as shown in FIG. 44(*b*). The FWHM of A2 and A3 samples is reduced and almost the same, indicating that high crystallinity with a low orientational spread from the surface normal direction for both the samples. Therefore, annealing is essential to improve the crystal quality of the GaAs/sapphire system. Phi scan shows the twinning is observed for all samples, as shown in FIG. 44(*c*).

The PL emission was measured at both LT and RT as shown in FIG. 45(*a, b*). The FE emission was observed for samples A2 and A3 at LT. In addition to FE emission a defect state is observed due to a replacement of CAs or in other words due to free electron to acceptor, and/or donor-bound electron to acceptor recombination. A broad peak around 1.46 eV is observed for sample A1 which may be related to gallium vacancies, arsenic interstitials, or AsGa antisite defects. The RT PL measurements show a broad defect state emission for sample A1, for A2 and A3 is shifted towards high energy FIG. 45(*b*).

Microdisk Laser Characterization

The high crystal quality and RT PL of GaAs film encouraged us to fabricate a microdisk laser from GaAs/sapphire system. The samples A2 and A3 are both used for the fabrication of the 16 μm microdisk lasers. After the fabrication to characterize, the samples micro-PL set up was used. Until now, the laser structure from sample A3 is characterized, and the results are discussed below.

Two different types of lasers, 532 nm cw, and 700 nm pulsed lasers are used to characterize the microdisk lasers. The lasing was not successful. High surface roughness may be the possible reason for this. The PL emission from the microdisk with different pumping power for both cw, and the pulsed laser at 77 K is shown in FIG. 46. The PL intensity increases with increasing pumping power. The possible reason for the bandgap shrinks or redshifted PL signals at 77 K than 10 K measurements for both cw and pulsed laser is local lattice heating. The substrate's low thermal conductivity is also responsible for increasing the system's temperature and hence, bandgap shrinks.

The integrated PL intensity for two lasers with incident power is shown in FIG. 47. The integrated PL intensity follows the power law, $I_{PL} \propto L^n$, where $I_{PL}$=integrated PL intensity, L=excitation power, n reflects the various recombination process. For exciton recombination, the PL intensity is proportional to the excitation intensity (n=1). For free electron-hole pair recombination, the PL intensity is proportional to the square of excitation intensity (n=2). For cw laser, bound exciton states are formed at low and intermediate electron concentrations by the Coulomb interaction whereas for fs laser the recombination is dominant by free electron-hole because higher densities cause a static screening of the of the electron-hole Coulomb potential. The phase space filling up to the Fermi energy also leads to a strong decrease of the exciton binding energy as free electron concentration increases.

The above discussions focus on the growth of the GaAs buffer layer on c-plane sapphire substrates. Now, the knowledge and experience from GaAs/c-plane sapphire system will transfer for the growth of GaAs on the r-plane sapphire substrate. The advantage of the r-plane sapphire substrate over the c-plane sapphire substrate is its crystal structure. The rectangular crystal structure of r-plane sapphire makes it feasible to successfully grow silicon on sapphire (SOS), which is part of the silicon-on-insulator (SOI) family of CMOS technologies. Therefore, if GaAs is successfully grown on an r-plane sapphire substrate, then it is possible to take advantage of CMOS technology, where it would be possible to integrate both laser and amplifier with corresponding RF electronics [24]. While there are few reports of heteroepitaxial system of cubic Si(Ge) on both c and r plane sapphire and cubic III-As on c-plane sapphire, to the best of the inventors' knowledge, there are no reports about epitaxial growth of III-As on r plane sapphire as a substrate.

GaAs Growth on R Plane Sapphire

As discussed, the growth of GaAs on sapphire substrates is a dissimilar materials system. Consequently, it is not trivial to grow or predict the GaAs film's growth direction on r plane sapphire substrate. For example, the rectangular crystal structure of r plane sapphire substrate may influence the rectangular (110) crystal plane of GaAs for the atomic alignment, while the sapphire substrate's hexagonal crystal nature can force GaAs to grow along [111] direction, or GaAs may take totally different growth direction. In the following section, the discussion will be focused on the growth III-As on r plane (1102) sapphire.

For the study of the possible growth directions of GaAs on the r-plane sapphire substrate the atomic arrangements of the r-plane sapphire, the (111) plane, and (110) plane of GaAs are shown in FIG. 48. The lattice constants of each crystal plane are also mentioned. The lattice mismatches of (111) and (110) crystal planes of GaAs are calculated with r plane sapphire substrate by considering each different potential alignment. The (111) GaAs crystal plane has compressive (35.2%) and tensile (16.2%) strain in the two perpendicular directions. For the (110) crystal plane, it has compressive strain (10.7%) and tensile strain (16.2%).

In addition to the lattice mismatch, the substrate surface energy is also an important role in deciding the orientation and quality of the epitaxial film. As discussed, for a 2D epitaxial material growth of GaAs material, and the energy dynamics should maintain the following inequality in Equation (2):

$$\gamma_s \geq \gamma_i + \gamma_e \qquad (2)$$

where, $\gamma_s$, $\gamma_i$, and $\gamma_e$ are substrate surface energy, interface energy between substrate and film, and film surface energy, respectively. The relaxed c plane and r plane substrates surface energy are 1.85 and 2.26 $Jm^{-2}$, respectively. Interestingly, a better film and substrate interaction is observed for GaAs growth on r plane sapphire substrate over c plane sapphire substrate. The following sections focus on the comparison of GaAs growth on c plane and r plane sapphire substrate, the effect of growth parameters, and AlAs nucleation layer on GaAs film surface morphology on the r plane sapphire substrate.

The substrates were used in this experiment possessed by a well-defined step-terrace structure. The surface morphology of the c and r plane sapphire substrate are shown in 2 μm×2 μm AFM images (FIG. 49). The characteristics parameters of c and r plane sapphire substrates used in this investigation are calculated from AFM images and listed in Table 7. The inset RHEED images for both surfaces show narrow streaks and kikuchi lines, which confirmed each substrate's flatness and cleanliness.

TABLE 7

Step height, terrace width, and unintentional miscut angle of c and r plane substrates.

| Substrates | Step Height (nm) | Terrace Width (nm) | Unintentional miscut angle (degree) |
|---|---|---|---|
| C plane | 0.22 | 236 | 0.06 |
| R plane | 0.76 | 198 | 0.2 |

Comparison of GaAs Growth on c and r-plane Sapphire

To compare the GaAs growth on c and r plane sapphire substrates, two samples, C-600, and R-600, were grown at Tg=600° C. The nominal thickness was 10 nm, and the thickness was calibrated for homoepitaxial GaAs (100). The growth conditions were identical for both samples. For the surface morphology study, we have performed AFM measurements, and the AFM images are shown in FIG. 50(a, b). The 3D islands are observed for both samples indicate the direct growth of GaAs on both c and r plane sapphire substrate that follow VW or 3D growth mode. High lattice mismatch and dissimilar crystal structure in both cases promote 3D growth. From 2×2 AFM images of both samples, the island's height, density, and volume of GaAs material deposited are listed in Table 8. The higher surface energy of r-plane sapphire than the c-plane sapphire enhances GaAs' interaction on the r plane sapphire, which has increased GaAs island's density in the r-plane. Basically, the diffusion and ripening of GaAs islands is slower on r plane sapphire substrate. Phi scans of the GaAs (220) crystal plane of both samples are shown in FIG. 50(c). The arrow signs indicate GaAs (220) peaks of the C-600 sample. The sharp GaAs (220) peaks are from the R-600 sample, whereas peaks are broad in C-600. The sharp peaks of the R-600 sample indicate a well-defined in-plane correlation between film and substrates as opposed to the C-600 sample, where the weak in-plane correlation is observed. Moreover, six peaks are observed in the phi scan of the C-600 sample which are separated by 60° degrees to each other. Six peaks indicate six-fold symmetry where three primary domains and three rotated twins are separated by 120°. In the R-600 sample, six peaks corresponding to GaAs (220) are also observed, but these peaks are not exactly separated by 60°. This indicates two different primary domains of [111] oriented crystals that maintain two different in-plane crystal orientation relationships with the r-plane sapphire substrate. The equal intensity of both types of peaks shows that both orientation relationships are equally preferable. Inset RHEED images are after the growth of GaAs from C-600 and R-600. Two different RHEED patterns are observed for two samples. For the C-600 RHEED image, rings and spots are observed. The RHEED image rings indicate the growth film is in weak in-plane correlation with the substrate, which is also confirmed from the XRD result, whereas the spotty pattern indicates the 3D growth mode. Meanwhile, only spots without a ring pattern are observed in the RHEED image of the R-600 sample. Therefore, GaAs' better in-plane relationship with r plane sapphire substrate than c plane sapphire substrate is observed. All results are consistent with the expectations based on the equation.

TABLE 8

Island height, density, and total volume on 2 μm × 2 μm AFM scan area

| Sample ID | Average Height (nm) | Density (cm$^{-2}$) | Volume of 3D islands (m$^3$) |
|---|---|---|---|
| C-600 | 85 | 4.25 × 10$^8$ | 4 × 10$^{-20}$ |
| R-600 | 40 | 4.35 × 10$^9$ | 4.3 × 10$^{-20}$ |

To confirm the out of plane orientation, we have performed the symmetric ω-2θ scans as shown in FIG. 51. During the growth of GaAs on c-plane sapphire the crystal follows only [111] growth direction, whereas GaAs crystal follows both [111] and [220] growth direction on r-plane sapphire substrate. A higher angle tail in the GaAs (111) peak for R-600 is also observed, perhaps due to the strain difference in the two orientations of GaAs observed in phi-scan.

Effect of Growth Temperature on GaAs/r-plane Sapphire

The growth temperature influences the diffusion length of deposited adatoms on the substrate surface. At higher growth temperatures, adatoms experience more energy, and the diffusion length increases. Therefore, it is essential to study the effect of growth temperature on surface morphology and crystal quality. We grew four samples at four different growth temperature 500° C. (R-500), 600° C. (R-600), 650° C. (R-650), and 700° C. (R-700). The nominal thickness of GaAs was 10 nm for each sample. At 700° C., we observed no deposition of GaAs on r plane sapphire substrate. However, the surface morphology and crystal quality were investigated by the deposited GaAs at 500° C., 600° C., and 650° C. growth temperatures. The surface morphologies of these three samples are shown in FIG. 52.

From the AFM images, the best surface coverage is observed for the sample R-500. The 3D islands are observed for all samples. The islands size and density are listed in Table 9. The size of islands increases, and the density of the islands decrease with increasing growth temperature. These results are consistent with ripening [175], [176]. Three RHEED images of three samples are taken just after the growth. The ring pattern in the RHEED image is observed for R-500, indicating a weak in-plane correlation between the film and the substrate. The ring pattern vanishes with increasing growth temperature, and spotty RHEED images are observed for R-600 and R-650. The twinning is observed in the RHEED images of both samples R-600 and R-650

TABLE 9

Growth temperature, GaAs Island height and density for three GaAs/r-plane sapphire samples.

| Sample ID | Growth Temperature (° C.) | Height (nm) | Density (/cm$^2$) |
|---|---|---|---|
| R-500 | 500 | 9 | NA |
| R-600 | 600 | 40 | 4.35 × 10$^9$ |
| R-650 | 650 | 52.6 | 3.4 × 10$^9$ |

The symmetric w-2θ scans of three samples are shown in FIG. 53(a). Single crystallinity of GaAs on r plane sapphire substrate is observed for samples R-500 and R-650. Meanwhile, two crystal orientations: (111) and (110) are observed for the sample R-600. The phi scans of the GaAs (220) crystal plane for three samples are shown in FIG. 53(b). The in-plane correlation between film and substrate remains invariant with the growth temperature. The phi scan shows the higher growth temperature improves the in-plane correlation. The phi scan is broad and diffused for the sample (R-500) growth at low temperature, indicating the weak in-plane correlation between film and substrate, and this result is also in agreement with RHEED. The sharp and well define phi scans are observed for the samples (R-600 and R-650) growth at high temperature. Therefore, the high growth temperature is necessary for the better in-plane correlation between GaAs film and r-plane sapphire substrate.

Introduction of AlAs Layer

At different growth temperatures, the direct growth of GaAs does not wet the r plane sapphire substrate very well. During the growth of GaAs on c-plane sapphire, a thin nucleation layer of AlAs improved the chemical interaction and the quality of the GaAs film. Therefore, a thin 5 nm AlAs is introduced as a nucleation layer before the growth of GaAs on r plane sapphire. Three different samples are grown with the presence of AlAs at three different arsenic fluxes: 1×10$^{-6}$ (RA-1), 3.5×10$^{-6}$ (RA-3.5), and 6×10$^{-6}$ (RA-6). The growth temperature Tg=600° C. was fixed for all samples. The surface morphologies of these samples are shown in AFM images (FIG. 67). The highly dense 3D islands are observed for all three samples. The root mean square surface roughness of the samples was measured from the AFM images. The surface roughness of these samples is increased with increasing arsenic partial pressure, and the roughness values are 2.53 nm (RA-1), 2.86 nm (RA-3.5), and 3.68 nm (RA-6). The presence of AlAs improves the wetting of the substrate than the direct growth of GaAs. This is consistent with our observation on the c-plane sapphire substrate. The wetting of the substrate improves with the presence of AlAs because of the higher bond strength of Al—O (502 kJ/mol) compared to Ga—O (374 kJ/mol) and As—O (374 kJ/mol).

FIG. 55(a) shows the out-of-plane measurements of these three samples. Single crystallinity is observed for all three samples, and the out-of-plane orientation is GaAs (111). On the right side of the GaAs (111) peak, we have observed a clear peak instead of a tail that was observed for direct growth of GaAs on r plane sapphire. The higher angle peak arises from the tensile strain of GaAs/AlAs material. The phi scan of GaAs (220) and r plane sapphire are performed to investigate the in-plane correlation between substrate and film.

The GaAs have a zinc blend crystal structure. Ideally, in the phi scan, the (220) crystal plane of GaAs shows three equally separated peaks representing three-fold symmetry. There are six equally separated peaks observed with the presence of 60° twins. However, in this case, the phi scan of GaAs (220) gives 12 distinct peaks, which is not typical for a cubic zinc blende system shown in FIG. 55(b). These 12 peaks arise from the two major orientations. The two major orientations are shifted by approximately ±14° with respect to the 0006 reflections of the r-plane sapphire. The 60° rotated twins of both orientations produce total 12 (220) peaks. The inset pole figure also shows a total of 12 reflection spots which is consistent with the phi measurement. Among 12 spots six are brighter than the other six.

In FIG. 56, the major two orientations are depicted by two hexagons O1 and O2. Atomic distances are to the scale with small errors. The 110 axes of GaAs of these two orientations make an angle of approximately ±14° with respect to the [100] in-plane direction of r-plane sapphire. It is possible that initially, with smaller coverage of GaAs, only one orientation of GaAs existed where [100] in-plane direction of sapphire was aligned to [110] in-plane direction of GaAs. In other words, the GaAs hexagon was sitting on seed hexagon (shown by green dashed lines in FIG. 56). As the coverage of GaAs increases, the strain also increases, and the initial orientation is splitted in two orientations O1 and O2, by a 14° twist to minimize the strain.

In sum, the highly dissimilar material system of GaAs on c and r-plane sapphire has been grown. The direct growth of GaAs on both substrates are compared. The 3D growth mode and poor wetting of both substrates are observed. Due to the higher surface energy of r plane sapphire, the interaction between GaAs films and r-plane sapphire is better than c-plane sapphire. A weak in-plane correlation between substrate and film, and the formation of twin structures is observed in c-plane sapphire substrates. Two in-plane correlations are observed for GaAs films with r-plane sapphire, which is ~28° apart, irrespective of growth temperatures. The introduction of a thin AlAs nucleation layer between the sapphire substrates (c and r-plane) and GaAs film, improved the wetting of the surfaces. The improvement of the wetting of the substrates is explained by the higher bond strength of Al—O. The observed twin ratio reduction in c-plane sapphire is likely correlated to the coalescence of small AlAs 3D islands. To uncover the control of twinning, the inventors investigated the role of the starting substrate on nucleation by examining the pre-growth substrate treatment on the GaAs growth. The better heterointerface formation and improved surface morphology is observed in the case of well-defined c-plane step-terrace substrate surface than corrugated and weakly defined step-terrace substrate. Likewise, in-situ annealing, and growth temperature influenced the twin formation and GaAs surface morphology. In-situ annealing was very effective to reduce the twinning, as the inventors were able to reduce the GaAs twin volume less than 2% by in-situ annealing on c-plane sapphire substrate.

Two-step growth was employed to investigate the effectiveness of LT GaAs layer on the quality of GaAs buffer on c-plane sapphire. The LT GaAs, at the early stage of growth, results in smooth surface morphology. Pyramidal mounds and randomly shaped pits are also observed on the surface. Ehrlich-Schwöbel (ES) barriers and adatom motion in the presence of stacking faults are responsible for the formation of pyramids, while the pits are attributed to thermal etching by Ga droplets which form due to the lower sticking coefficient of arsenic on a GaAs (111)A surface. Compressively strained GaAs is observed without LT GaAs layer from the XRD omega-2theta scan and Raman measurements which matches our speculation on the atomic arrangement. The GaAs film was almost twin free. The HRTEM confirmed abrupt interface between film and substrate with very defects mostly confined near film/substrate interface. Two different regions of different quality materials are confirmed by HRTEM and rocking curves. Together, these observations indicate that the GaAs buffer with the LT layer is effective in achieving high-quality GaAs on c-plane sapphire.

The thickness of the GaAs film was improved by reducing the growth temperatures on c-plane sapphire. At the low growth temperature, the density of truncated pyramids is increased. The dissociation of Frank sessile dislocation generates either pyramids or truncated pyramids depend on the stacking fault energy on the three {111} planes. The inventors were able to get the RT PL from the GaAs/sapphire system. Microdisk lasers were fabricated after getting high quality and RT PL of GaAs. The spontaneous emission was observed from the micro-PL measurement. The higher surface roughness can be the possible reason for not getting the lasing from the GaAs on c-plane sapphire systems.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the invention pertains without departing from its spirit and scope. Accordingly, the scope of the invention is defined by the appended claims rather than the foregoing description and the exemplary embodiments described therein.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

REFERENCE LIST

[1] J. Capmany and D. Novak, "Microwave photonics combines two worlds," Nat. Photonics, vol. 1, no. 6, pp. 319-330, 2007.

[2] J. S. Fandiño, P. Muñoz, D. Doménech, and J. Capmany, "A monolithic integrated photonic microwave filter," Nat. Photonics, vol. 11, no. 2, pp. 124-129, 2017.

[3] J. Yao, "Photonic generation of microwave arbitrary waveforms," Opt. Commun., vol. 284, no. 15, pp. 3723-3736, 2011.

[4] D. Marpaung and C. Roeloffzen, "Integrated microwave photonics for phase modulated systems," 2012 IEEE Photonics Conf. IPC 2012, pp. 84-85, 2012.

[5] A. J. Seeds, "Microwave photonics," IEEE Trans. Microw. Theory Tech., vol. 50, no. 3, pp. 877-887, 2002.

[6] K. J. Williams, "Microwave photonics," Conf. Proc.—Int. Conf. Indium Phosphide Relat. Mater., vol. 27, no. 3, pp. 212-214, 2012.

[7] C. Cox, "Techniques and performance of intensity-modulation direct-detection analog optical links," IEEE Trans. Microw. Theory Tech., vol. 45, no. 8 PART 2, pp. 1375-1383, 1997.

[8] E. I. Ackerman et al., "Signal-to-noise performance of two analog photonic links using different noise reduction techniques," IEEE MTT-S Int. Microw. Symp. Dig., pp. 51-54, 2007.

[9] J. D. McKinney, M. Godinez, V. J. Urick, S. Thaniyavarn, W. Charczenko, and K. J. Williams, "Sub-10-dB noise figure in a multiple-GHz analog optical link," IEEE Photonics Technol. Lett., vol. 19, no. 7, pp. 465-467, 2007.

[10] D. Jager and A. Stohr, "Microwave Photonics—From Concepts to Applications," Architecture, no. December, pp. 1-4, 2005.

[11] D. Marpaung, J. Yao, and J. Capmany, "Integrated microwave photonics," Nat. Photonics, vol. 13, no. 2, pp. 80-90, 2019.

[12] X. Xu, M. Tan, J. Wu, R. Morandotti, A. Mitchell, and D. J. Moss, "Microcomb-Based Photonic RF Signal Processing," IEEE Photonics Technol. Lett., vol. 31, no. 23, pp. 1854-1857, 2019.

[13] M. Smit et al., "An introduction to InP-based generic integration technology," Semicond. Sci. Technol., vol. 29, no. 8, 2014.

[14] L. M. Augustin et al., "InP-Based Generic Foundry Platform for Photonic Integrated Circuits," IEEE J. Sel. Top. Quantum Electron., vol. 24, no. 1, 2018.

[15] W. Zhang and J. Yao, "Silicon-based integrated microwave photonics," IEEE J. Quantum Electron., vol. 52, no. 1, 2016.

[16] S. Ibrahim et al., "Demonstration of a fast-reconfigurable silicon CMOS optical lattice filter," Opt. Express, vol. 19, no. 14, p. 13245, 2011.

[17] K. Worhoff, R. G. Heideman, A. Leinse, and M. Hoekman, "TriPleX: A versatile dielectric photonic platform," Adv. Opt. Technol., vol. 4, no. 2, pp. 189-207, 2015.

[18] J. F. Bauters et al., "Planar waveguides with less than 01 dB/m propagation loss fabricated with wafer bonding," Opt. Express, vol. 19, no. 24, p. 24090, 2011.

[19] X. Ji et al., "Ultra-low-loss on-chip resonators with sub-milliwatt parametric oscillation threshold," Optica, vol. 4, no. 6, p. 619, 2017.

[20] D. Perez et al., "Multipurpose silicon photonics signal processor core," Nat. Commun., vol. 8, no. 1, pp. 1-9, 2017.

[21] C. G. H. Roeloffzen et al., "Low-loss si3n4 triplex optical waveguides: Technology and applications overview," IEEE J. Sel. Top. Quantum Electron., vol. 24, no. 4, 2018.

[22] J. Kischkat et al., "Mid-infrared optical properties of thin films of aluminum oxide, titanium dioxide, silicon dioxide, aluminum nitride, and silicon nitride," Appl. Opt., vol. 51, no. 28, pp. 6789-6798, 2012.

[23] S. K. Saha et al., "Crystalline GaAs Thin Film Growth on a c-Plane Sapphire Substrate," Cryst. Growth Des., vol. 19, no. 9, pp. 5088-5096, 2019.

[24] S. K. Saha et al., "GaAs epitaxial growth on R-plane sapphire substrate," J. Cryst. Growth, vol. 548, no. August, p. 125848, 2020.

[25] M. Yamaguchi, A. Yamamoto, M. Tachikawa, Y. Itoh, and M. Sugo, "Defect reduction effects in GaAs on Si substrates by thermal annealing," Appl. Phys. Lett., vol. 53, no. 23, pp. 2293-2295, 1988.

[26] D. S. Abramkin et al., "Influence of a Low-Temperature GaAs Dislocation Filter on the Perfection of GaAs/Si Layers," Optoelectron. Instrum. Data Process., vol. 54, no. 2, pp. 181-186, 2018.

[27] N. A. El-Masry, J. C. Tarn, and N. H. Karam, "Interactions of dislocations in GaAs grown on Si substrates with InGaAs—GaAsP strained layered superlattices," J. Appl. Phys., vol. 64, no. 7, pp. 3672-3677, 1988.

[28] J. S. Blakemore, "Semiconducting and other major properties of gallium arsenide," J. Appl. Phys., vol. 53, no. 10, 1982.

[29] N. Moll, A. Kley, E. Pehlke, and M. Scheffler, "GaAs equilibrium crystal shape from first principles," Phys. Rev. B—Condens. Matter Mater. Phys., vol. 54, no. 12, pp. 8844-8855, 1996.

[30] K. Seeger, Semiconductor Physics, 9th ed. Springer, 1991.

[31] J. W. and S. Sze, S. M., physics of Semiconductor Devices.

[32] V. Dobrovinskaya, E. R.; Lytvynov, L. A; Pischik, Sapphire: Material, Manufacturing, Applications. Springer Science+Business Media, 2009.

[33] F. Cuccureddu et al., "Surface morphology of c-plane sapphire (a-alumina) produced by high temperature anneal," Surf. Sci., vol. 604, no. 15-16, pp. 1294-1299, 2010.

[34] R. Chandrasekaran, A. S. Ozcan, D. Deniz, K. F. Ludwig, and T. D. Moustakas, "Growth of non-polar (1120) and semi-polar (1126) AlN and GaN films on the R-plane sapphire," Phys. Status Solidi Curr. Top. Solid State Phys., vol. 4, no. 5, pp. 1689-1693, 2007.

[35] P. Vogt, A. Trampert, M. Ramsteiner, and O. Bierwagen, Domain matching epitaxy of cubic In2O3 on r-plane sapphire, vol. 212, no. 7. 2015.

[36] V. Cimalla et al., "Growth of cubic InN on r-plane sapphire," Appl. Phys. Lett., vol. 83, no. 17, pp. 3468-3470, 2003.

[37] T. Lei, K. F. Ludwig, and T. D. Moustakas, "Heteroepitaxy, polymorphism, and faulting in GaN thin films on silicon and sapphire substrates," J. Appl. Phys., vol. 74, no. 7, pp. 4430-4437, 1993.

[38] J. M. Chauveau, P. Venníguś, M. Laügt, C. Departs, J. Zuniga-Perez, and C. Morhain, "Interface structure and anisotropic strain relaxation of nonpolar wurtzite (11 2-0) and (101-0) orientations: ZnO epilayers grown on sapphire," J. Appl. Phys., vol. 104, no. 7, 2008.

[39] R. Kumar et al., "GaAs Layer on c-plane Sapphire for Light Emitting Sources," Appl. Surf. Sci., p. 148554, 2020.

[40] A. Biermanns, "X-ray diffraction from single GaAs nanowires," 2012.

[41] Yu.B.Bolkhovityanov and O. P. Pchelyakov, "GaAs epitaxy on Si substrates:modern status of research and engineering," Uspekhi Fiz. Nauk, vol. 51, no. 5, pp. 437-456, 2008.

[42] C. C. R. Lorraine F. Francis, Bethanie J H Stadler, Materials Processing: A Unified Approach to Processing of Metals, Ceramics and Polymers. Elsevier Inc., 2016.

[43] E. R. S. C. L. Claeys, Stress-induced Defect Generation. Elsevier, 2016.

[44] P. Parajuli et al., "MICROSTRUCTURAl EVOLUTION AND ATOMIC-LEVEL SEGREGATION IN METALLIC ALLOY FILMS: AN APPROACH TOWARDS GRAIN BOUNDARY ENGINEERING by Presented to the Graduate Faculty of The University of Texas at San Antonio In Partial Fulfillment Of the Requirements For t," no. May 2019.

[45] Y. Wang, W. Chen, B. Wang, and Y. Zheng, "Ultrathin ferroelectric films: Growth, characterization, physics and applications," Materials (Basel)., vol. 6, no. 9, pp. 6377-6485, 2014.

[46] F. Wu, "Planar Defects in Metallic Thin Film Heterostructures," no. April, 2014.

[47] M. S. Muthuvalu and J. Sulaiman, "Journal of Fundamental Sciences," vol. 6, no. 2, pp. 104-110, 2010.

[48] S. P. Minor, "Growth of Indium Nitride Quantum Dots by Molecular Beam Epitaxy by," 2019.

[49] K. Hermann, Crystallography and Surface Structure: An Introduction for Surface Scientists and Nanoscientists. John Wiley & Sons, 2017.

[50] N. Kaiser, Review of the fundamentals of thin-film growth. 2002.

[51] D. F. and S. Thin Film Materials: Stress, Thin Film Materials: Stress, Defect Formation and Surface evolution. Cambridge University Press, 2004.
[52] John A. Venables, Introduction to Surface and Thin Film Processes. Cambridge University Press, 2000.
[53] Robert S. Feigelson, Handbook of Crystal Growth. Elsevier, 2015.
[54] C.-Y. Chou, "III-V Semiconductor Materials Grown by Molecular Beam Epitaxy for Infrared and High-Speed Transistor Applications," 2016.
[55] T. A. Morgan, "Self-Assembled Barium Titanate Nanoscale Films by Molecular Beam Epitaxy," 2018.
[56] R. B. Lewis, "Molecular Beam Epitaxy Growth Technology and Properties of GaAsBi Alloys," 2014.
[57] A. V. Vasev, M. A. Putyato, and V. V. Preobrazhenskii, "Some geometrical aspects of diffracted waves formation on a reconstructed crystal face at RHEED," Surf. Sci., vol. 677, pp. 306-315, 2018.
[58] B. Müller and M. Henzler, "SPA-RHEED—A novel method in reflection high-energy electron diffraction with extremely high angular and energy resolution," Rev. Sci. Instrum., vol. 66, no. 11, pp. 5232-5235, 1995.
[59] J. M. Van Hove, P. Pukite, P. I. Cohen, and C. S. Lent, "RHEED streaks and instrument response," J. Vac. Sci. Technol. A Vacuum, Surfaces, Film., vol. 1, no. 2, pp. 609-613, 1983.
[60] A. Fluri, "Metal Oxide-Based Thin Film Structures," pp. 109-132, 2018.
[61] M. O. Steen, Molecular Beam Epitaxy. Elsevier, 2018.
[62] S. Abdulrahman and A. Abdulrahman, "ANALYSIS OF CuCl THIN-FILM DEPOSITION AND GROWTH BY CLOSE-SPACE SUBLIMATION," 2018.
[63] Z. L. Wang, "Reflection high-energy electron diffraction," Reflect. Electron Microsc. Spectrosc. Surf. Anal., pp. 31-59, 2010.
[64] G. L. Price, "Reflection High Energy Electron Diffraction," pp. 307-318, 2003.
[65] S. Johnson, "In situ temperature control of molecular beam epitaxy growth using band-edge thermometry," J. Vac. Sci. Technol. B Microelectron. Nanom. Struct., vol. 16, no. 3, p. 1502, 1998.
[66] I. Farrer, J. J. Harris, R. Thomson, D. Barlett, C. A. Taylor, and D. A. Ritchie, "Substrate temperature measurement using a commercial band-edge detection system," J. Cryst. Growth, vol. 301-302, no. SPEC. ISS., pp. 88-92, 2007.
[67] R. N. Sacks, D. Barlett, C. A. Taylor, and J. Williams, "Growth related interference effects in band edge thermometry of semiconductors," J. Vac. Sci. Technol. B Microelectron. Nanom. Struct., vol. 23, no. 3, p. 1247, 2005.
[68] M. Aliofkhazraei, Comprehensive Materials Processing. Elsevier, 2014.
[69] M. Farre, Comprehensive Analytical Chemistry. 2012.
[70] B. S.Hameed, Nanomaterials in Chromatography. Elsevier, 2018.
[71] Y. F. Dufrêne, "Atomic force microscopy, a powerful tool in microbiology," J. Bacteriol., vol. 184, no. 19, pp. 5205-5213, 2002.
[72] Y. F. Dufrene et al., "Imaging modes of atomic force microscopy for application in molecular and cell biology," Nat. Nanotechnol., vol. 12, no. 4, pp. 295-307, 2017.
[73] R. Splinter, "Action potential transmission and volume conduction," Handb. Phys. Med. Biol., vol. 56, no. 9, pp. 5-1-5-9, 2010.
[74] G. Zeng, Y. Duan, F. Besenbacher, and M. Dong, "Nanomechanics of Amyloid Materials Studied by Atomic Force Microscopy," At. Force Microsc. Investig. into Biol.—From Cell to Protein, 2012.
[75] A. Kühle, Advanced Techniques for Assessment Surface Topography. Elsevier, 2003.
[76] M. Frentrup et al., "X-ray diffraction analysis of cubic zincblende III-nitrides," J. Phys. D. Appl. Phys., vol. 50, no. 43, 2017.
[77] V. Vishwakarma, Smart Nanoconcretes and Cement-Based Materials. Elsevier, 2020.
[78] H. J. Kim, Y. Park, H. Bin Bae, and S. H. Choi, "High-electron-mobility SiGe on sapphire substrate for fast chipsets," Adv. Condens. Matter Phys., vol. 2015, 2015.
[79] K. Inaba, S. Kobayashi, K. Uehara, A. Okada, S. L. Reddy, and T. Endo, "High Resolution X-Ray Diffraction Analyses of (La,Sr)MnO3ZnOSapphire(0001) Double Heteroepitaxial Films," Adv. Mater. Phys. Chem., vol. 03, no. 01, pp. 72-89, 2013.
[80] K. Maria; V. Maria, Polymer Science and Nanotechnology. Elsevier, 2020.
[81] P. S. Kumar; K. G. Pavithra; Mu.Naushad, Nanomaterials for Solar Cell Applications. Elsevier, 2019.
[82] C. A. English, Structural Alloys for Nuclear Energy Applications. Elsevier, 2019.
[83] N. G. Orji et al., "TEM calibration methods for critical dimension standards," Metrol. Insp. Process Control Microlithogr. XXI, vol. 6518, p. 651810, 2007.
[84] B. ThoriharaTomoda, Biopolymer Membranes and Films. Elsevier, 2020.
[85] Maria Kaliva, Polymer Science and Nanotechnology. Elsevier, 2020.
[86] B. Saad Alharthi, "Growth and Characterization of Silicon-Germanium-Tin Semiconductors for Future Nanophotonics Devices," 2018.
[87] D. D. L. Pevelen, Encyclopedia of Spectroscopy and Spectrometry. Elsevier, 2017.
[88] J. N. Hilfiker, Encyclopedia of Modern Optics. Elsevier, 2005.
[89] J. N. Hilfiker, Encyclopedia of Modern Optics. Elsevier, 2005.
[90] T. Pham, "Si-based Germanium Tin Photodetectors for Short-Wave and Mid-Wave Infrared Detections Part of the Electronic Devices and Semiconductor Manufacturing Commons," 2018.
[91] HuaiyuWang, Characterization of Biomaterials. Elsevier, 2013.
[92] D. W. Grainger, Comprehensive Biomaterials. Elsevier, 2011.
[93] D. K. Schroder, Semiconductor Material and Device Characterization, John Wiley & Sons, InC, 2015.
[94] J. Abraham, Phytonanotechnology. Elsevier, 2020.
[95] F. Wang, Advanced Nanomaterials for Solar Cells and Light Emitting Diodes. Elsevier, 2019.
[96] J. M. Grant, Investigation of Critical Technologies of Chemical Vapor Deposition for Advanced (Si) GeSn Materials. 2019.
[97] S. H. S. Al-Kabi, Si-Based Germanium Tin Semiconductor Lasers for Optoelectronic Applications. 2017.
[98] S. P. Minor, "Plasma-Assisted Molecular Beam Epitaxial Growth of Indium Nitride for Future Device Fabrication," p. 93, 2012.
[99] A. P. Kirk, Solar Photovoltaic Cells. Elsevier, 2015.
[100] H. Fu, Nitride Semiconductor Light-Emitting Diodes (LEDs). Elsevier, 2018.

[101] P. C. Grant, GeSn Thin Film Epitaxy and Quantum Wells for Optoelectronic Devices. 2018.

[102] Wei Dou, High-Sn-content GeSn Alloy towards Room-temperature Mid Infrared Laser. 2018.

[103] C. Steve, "The Setup, Design, and Implementation of a Photoluminescence Experiment on Quantum Wells University of Rochester Class of 2014 University of Colorado REU Program Summer 2011," 2014.

[104] C. L. Claeys, Materials Science and Materials Engineering. Elsevier, 2016.

[105] R. Kumar, A. Bag, P. Mukhopadhyay, S. Das, and D. Biswas, "Comparison of Different Grading Schemes in InGaAs Metamorphic Buffers on GaAs Substrate: Tilt Dependence on Cross-Hatch Irregularities," Appl. Surf. Sci., vol. 357, pp. 922-930, September 2015.

[105] R. Kumar et al., "Excitation intensity and thickness dependent emission mechanism from an ultrathin InAs layer in GaAs matrix," J. Appl. Phys., vol. 124, no. 23, 2018.

[107] O Y. Park, G. C. King, and S. H. Choi, "Rhombohedral epitaxy of cubic SiGe on trigonal c-plane sapphire," J. Cryst. Growth, vol. 310, no. 11, pp. 2724-2731, 2008.

[108] H. J. Kim, A. Duzik, and S. H. Choi, "Lattice-alignment mechanism of SiGe on Sapphire," Acta Mater., vol. 145, pp. 1-7, 2018.

[109] C. A. S. and C. J. M. T. P. Humphreys, N. R. Parikh, K. Das, J. B. Posthill, R. J. Nemanich, M. K. SummerVille, "Molecular Beam Epitaxial Growth and Characterization of GaAs on Sapphire and Silicon-on-Sapphire Substrates," J. Chem. Inf. Model., vol. 53, no. 9, pp. 1689-1699, 2013.

[110] and T. M. A. Koma, K. Sunouchi, "Physics of Semiconductors," 1985, p. 1465.

[111] and T. M. A. Koma, K. Sunouchi, Microelectronic Enngineering. Elsevier, 1984.

[112] A. Koma, "Van der Waals epitaxy for highly lattice-mismatched systems," J. Cryst. Growth, vol. 201-202, 1999.

[113] G. Saint-Girons, J. Cheng, P. Regreny, L. Largeau, G. Patriarche, and G. Hollinger, "Accommodation at the interface of highly dissimilar semiconductor/oxide epitaxial systems," Phys. Rev. B—Condens. Matter Mater. Phys., vol. 80, no. 15, pp. 1-6, 2009.

[114] Y.-R. Luo, Comprehensive Handbook of Chemical Bond Energies. Boca Raton, 2007.

[115] W. Wegscheider, K. Eberl, G. Abstreiter, H. Cerva, and H. Oppolzer, "Novel relaxation process in strained Si/Ge superlattices grown on Ge (001)," Appl. Phys. Lett., vol. 57, no. 15, pp. 1496-1498, 1990.

[116] W. Wegscheider, "Effect of compressive and tensile strain on misfit dislocation injection in SiGe epitaxial layers," J. Vac. Sci. Technol. B Microelectron. Nanom. Struct., vol. 11, no. 3, p. 1056, 1993.

[117] H. K. T.Maeda, M. Yoshimoto, T. Ohnishi, G. H. Lee, "Orientation-defined molecular layer epitaxy of a-A1203 thin films," J. Cryst. Growth, vol. 177, no. 1-2, pp. 95-101, 1997.

[118] I. M. Y. Shun-ichi, K. Shunsuke, F. Masanori, "Self-formed silicon quantum wires on ultrasmooth sapphire substrates," Appl. Phys. Lett., vol. 71, no. 1409, 1997.

[119] A. Ohtake and T. A. T. Ito, "As-rich (2×2) surface reconstruction on GaAs(111)A," Surf. Sci., vol. 606, no. 23-24, pp. 1864-1870, 2012.

[120] D. A. Woolf, Z. Sobiesierski, D. I. Westwood, and R. H. Williams, "The molecular beam epitaxial growth of GaAs/GaAs(111)B: Doping and growth temperature studies," J. Appl. Phys., vol. 71, no. 10, pp. 4908-4915, 1992.

[121] A. Kawaharazuka and Y. Horikoshi, "Behavior of Ga atoms deposited on GaAs (111)B and (111)A surfaces," J. Cryst. Growth, vol. 477, pp. 25-29, 2017.

[122] S. Y. Tong, G. Xu, and W. N. Mei, "Vacancy-buckling model for the (2×2) GaAs(111) surface," Phys. Rev. Lett., vol. 52, no. 19, pp. 1693-1696, 1984.

[123] H. Li, Y. Sun, C. Law, B. Visbeck, and F. Hicks, "Reconstructions of the InP(111)A surface," Phys. Rev. B—Condens. Matter Mater. Phys., vol. 68, no. 8, 2003.

[124] M. R. Fahy, K. Sato, and B. A. Joyce, "Reflection high-energy electron diffraction intensity oscillations during the growth by molecular beam epitaxy of GaAs (111)A," Appl. Phys. Lett., vol. 64, no. 2, pp. 190-192, 1994.

[125] C. D. Yerino, B. Liang, D. L. Huffaker, P. J. Simmonds, and M. L. Lee, "Review Article: Molecular beam epitaxy of lattice-matched InAlAs and InGaAs layers on InP (111)A, (111)B, and (110)," J. Vac. Sci. Technol. B, Nanotechnol. Microelectron. Mater. Process. Meas. Phenom., vol. 35, no. 1, p. 010801, 2017.

[126] K. Yang and L. J. Schowalter, "Surface reconstruction phase diagram and growth on GaAs(111)B substrates by molecular beam epitaxy," Appl. Phys. Lett., vol. 60, no. 15, pp. 1851-1853, 1992.

[127] J. W. Kim, S. Kim, and J. M. Seo, "Surface core-level shift of InSb(111)-2×2," Phys. Rev. B—Condens. Matter Mater. Phys., vol. 54, no. 7, pp. 4476-4479, 1996.

[128] D. A. Woolf, D. I. Westwood, and R. H. Williams, "The homoepitaxial growth of GaAs(111)A and (111)B by molecular beam epitaxy: An investigation of the temperature-dependent surface reconstructions and bulk electrical conductivity transitions," Semicond. Sci. Technol., vol. 8, no. 6, pp. 1075-1081, 1993.

[129] L. Esposito, S. Bietti, A. Fedorov, R. Nötzel, and S. Sanguinetti, "Ehrlich-Schwöbel effect on the growth dynamics of GaAs(111)A surfaces," Phys. Rev. Mater., vol. 1, no. 2, 2017.

[130] Y. Park et al., "Analysis of twin defects in GaAs(111)B molecular beam epitaxy growth," J. Vac. Sci. Technol. B Microelectron. Nanom. Struct., vol. 18, no. 3, p. 1566, 2000.

[131] K. Sato, M. R. Fahy, and B. A. Joyce, "The growth of high quality GaAs on GaAs (111)A," Jpn. J. Appl. Phys., vol. 33, no. 7, pp. L905-L907, 1994.

[132] Y. Horikoshi, T. Uehara, T. Iwai, and I. Yoshiba, "Area selective growth of GaAs by migration-enhanced epitaxy," Phys. Status Solidi Basic Res., vol. 244, no. 8, pp. 2697-2706, 2007.

[133] M. Yamaguchi, M. Tachikawa, Y. Itoh, M. Sugo, and S. Kondo, "Thermal annealing effects of defect reduction in GaAs on Si substrates," J. Appl. Phys., vol. 68, no. 9, pp. 4518-4522, 1990.

[134] N. C. Patra, S. Bharatan, J. Li, and S. Iyer, "Annealing studies of heteroepitaxial InSbN on GaAs grown by molecular beam epitaxy for long-wavelength infrared detectors," J. Appl. Phys., vol. 112, no. 8, pp. 2010-2015, 2012.

[135] N. El-Masry et al., "Defect Reduction in GaAs Epilayers on Si Substrates Using Strained Layer Superlattices," MRS Proc., vol. 91, pp. 99-103, 1987.

[136] T. Uehara, T. Iwai, I. Yoshiba, and Y. Horikoshi, "Area-selective epitaxial growth of GaAs Yu. B. Bolkhovityanov and O. P. chelyakov, "GaAs epitaxy on Si substrate: Modern status of research an dengineering," Uspekhi Fiz. Nauk, vol. 178, no. 5, p. 459, 2008.

[145] L. Esposito, S. Bietti, A. Fedorov, R. Notzel, and S. Sanguinetti, "Ehrlich-Schwobel effect on the growth dynamics of GaAs(111)A surfaces," Phys. Rev. Mater., vol. 1, no. 2, pp. 2-9, 2017.

[146] S. J. Liu, H. Huang, and C. H. Woo, "Schwoebel-Ehrlich barrier: From two to three dimensions," Appl. Phys. Lett., vol. 80, no. 18, pp. 3295-3297, 2002.

[147] M. S. Abrahams and C. J. Buiocchi, "Etching of dislocations on the low-index faces of GaAs," J. Appl. Phys., vol. 36, no. 9, pp. 2855-2863, 1965.

[148] S. Kanjanachuchai and C. Euaruksakul, "Self-running Ga droplets on GaAs (111)A and (111)B surfaces," ACS Appl. Mater. Interfaces, vol. 5, no. 16, pp. 7709-7713, 2013.

[149] D. Zeng, W. Jie, T. Wang, J. Zhang, and G. Zha, "Type and formation mechanism of thermal etch pit on annealed (111) CdZnTe surface," Thin Solid Films, vol. 517, no. 9, pp. 2896-2899, March 2009.

[150] H. Maki et al., "Control of surface morphology of ZnO (0 0 0 1⁻) by hydrochloric acid etching," Thin Solid Films, vol. 411, no. 1, pp. 91-95, 2002.

[151] R. Kumar and D. Biswas, "Tilt investigation of In(Al,Ga)As metamorphic buffer layers on GaAs (001) substrate: A novel technique for tilt determination," Cryst. Res. Technol., vol. 51, no. 12, pp. 723-729, December 2016.

[152] J. P. Bosco, G. M. Kimball, N. S. Lewis, and H. A. Atwater, "Pseudomorphic growth and strain relaxation of α-Zn3P 2 on GaAs(001) by molecular beam epitaxy," J. Cryst. Growth, vol. 363, pp. 205-210, 2013.

[153] M. Briceño, J. Kacher, and I. M. Robertson, "Dynamics of dislocation interactions with stacking-fault tetrahedra at high temperature," J. Nucl. Mater., vol. 433, no. 1-3, pp. 390-396, 2013.

[154] D. Hull and D. J. Bacon, "Dislocations in Face-centered Cubic Metals," Introd. to Dislocations, no. 110, pp. 85-107, 2011.

[155] M. Kiritani, "Story of stacking fault tetrahedra," Mater. Chem. Phys., vol. 50, no. 2, pp. 133-138, 1997.

[156] Y. Matsukawa and S. J. Zinkle, "Dynamic observation of the collapse process of a stacking fault tetrahedron by moving dislocations," J. Nucl. Mater., vol. 329-333, no. 1-3 PART B, pp. 919-923, 2004.

[157] D. Punktfehler and A. Science, "of Stacking Fault," 1966.

[158] F. Martin, P. Muralt, M.-A. Dubois, and A. Pezous, "Thickness dependence of the properties of highly c-axis textured AlN thin films," J. Vac. Sci. Technol. A Vacuum, Surfaces, Film., vol. 22, no. 2, pp. 361-365, 2004.

[159] A. C. Diebold, S. W. Steinhauser, R. P. Mariella, J. Marti, F. Reidinger, and R. F. Antrim, "Growth and characterization of GaAs on sapphire (0001) by molecular beam epitaxy," Surf Interface Anal., vol. 15, no. 2, pp. 150-158, 1990.

[160] J. Wang et al., "Extremely Low-Threshold Current Density InGaAs/AlGaAs Quantum-Well Lasers on Silicon," J. Light. Technol., vol. 33, no. 15, pp. 3163-3169, 2015.

[161] A. A. Spirina, A. G. Nastovjak, and N. L. Shwartz, "Influence of GaAs substrate properties on the congruent evaporation temperature," J. Phys. Conf. Ser., vol. 993, no. 1, 2018.

[162] J. Van De Ven, W. J. A. M. Hartmann, and L. J. Giling, Photoluminescence studies of defects and impurities in annealed GaAs, vol. 60, no. 10. 1986.

[163] A. A. Klochikhin, V. P. Kochereshko, and S. Tatarenko, "Influence of free carriers on exciton ground states in quantum wells," J. Lumin., vol. 154, pp. 310-315, 2014.

[164] S. Jin, Y. Zheng, and A. Li, "Characterization of photoluminescence intensity and efficiency of free excitons in semiconductor quantum well structures," J. Appl. Phys., vol. 82, no. 8, pp. 3870-3873, 1997.

[165] H. J. Kim, H. Bin Bae, Y. Park, K. Lee, and S. H. Choi, "Temperature dependence of crystalline SiGe growth on sapphire (0001) substrates by sputtering," J. Cryst. Growth, vol. 353, no. 1, pp. 124-128, 2012.

[166] W. Dubbelday and K. Kavanagh, "The growth of SiGe on sapphire using rapid thermal chemical vapor deposition," J. Cryst. Growth, vol. 222, no. 1-2, pp. 20-28, January 2001.

[167] A. Sugimura, T. Hosoi, K. Ishibitsu, and T. Kawamura, "Heteroepitaxial growth of GaAs on sapphire substrates by a three-step method using low pressure MOCVD," J. Cryst. Growth, vol. 77, no. 1-3, pp. 524-529, 1986.

[168] K. Kasai, K. Nakai, and M. Ozeki, "Material and device properties of GaAs on sapphire grown by metalorganic chemical vapor deposition," J. Appl. Phys., vol. 60, no. 1, pp. 1-5, 1986.

[169] T. P. Humphreys et al., "Heteroepitaxial growth and characterization of GaAs on silicon-on-sapphire and sapphire substrates," Appl. Phys. Lett., vol. 54, no. 17, pp. 1687-1689, 1989.

[170] T. F. Kuech, A. Segmüller, T. S. Kuan, and M. S. Goorsky, "Growth and properties of thin GaAs epitaxial layers on Al2O3," J. Appl. Phys., vol. 67, no. 10, pp. 6497-6506, 1990.

[171] L. C. Chuang et al., "GaAs nanoneedles grown on sapphire," Appl. Phys. Lett., vol. 98, no. 12, pp. 98-101, 2011.

[172] J. E. Boschker et al., "Surface reconstruction-induced coincidence lattice formation between two-dimensionally bonded materials and a three-dimensionally bonded substrate," Nano Lett., vol. 14, no. 6, pp. 3534-3538, 2014.

[173] T. Stirner, J. Sun, and M. Aust, "Ab Initio Hartree-Fock Simulation of R-Plane Sapphire," Phys. Procedia, vol. 32, no. August 2010, pp. 635-639, 2012.

[174] J. Sun, T. Stirner, and A. Matthews, "Structure and surface energy of low-index surfaces of stoichiometric α-Al2O3 and α-Cr2O3," Surf. Coatings Technol., vol. 201, no. 7 SPEC. ISS., pp. 4205-4208, 2006.

[175] G. Madras and B. J. McCoy, "Temperature effects during Ostwald ripening," J. Chem. Phys., vol. 119, no. 3, pp. 1683-1693, 2003.

[176] T. Van Westen and R. D. Groot, "Effect of Temperature Cycling on Ostwald Ripening," Cryst. Growth Des., vol. 18, no. 9, pp. 4952-4962, 2018.

What is claimed is:

1. An integrated microwave photonics (IMWP) apparatus, comprising:
a sapphire substrate having a step-terrace surface; and
a III-V semiconductor circuit disposed on the sapphire substrate, comprising a III-V stack layer epitaxially grown on the sapphire substrate, wherein the III-V stack layer comprises:
a first III-V layer disposed directly on the sapphire substrate;
a low temperature (LT) III-V buffer layer disposed directly on the first III-V layer;

a plurality of second III-V layers disposed and stacked directly on the LT III-V buffer layer, wherein the plurality of second III-V layers are respectively annealed;

a third III-V layer disposed directly on the second III-V layers;

a III-V quantum well layer disposed directly on the third III-V layers; and a fourth III-V layer disposed directly on the III-V quantum well layer;

wherein a growth temperature of the LT III-V layer and a growth temperature of the III-V quantum well layer are lower than a growth temperature of each of the first, second, third and fourth III-V layers; and wherein the first III-V layer is an AlAs layer, the III-V quantum well layer is an InGaAs quantum well layer, and each of the LT III-V buffer layer and the second, third and fourth III-V layers is a GaAs layer.

2. The IMWP apparatus according to claim 1, wherein the growth temperature of the LT III-V layer and the growth temperature of the III-V quantum well layer are 600° C., and the growth temperature of the first, second, third and fourth III-V layers is 700° C.

3. The IMWP apparatus according to claim 1, wherein a growth time of the III-V quantum well layer is 41 seconds, a growth time of each of the LT III-V buffer layer and the second III-V layers is 16 minutes, and a growth time of each of the third and fourth III-V layers is 8 minutes.

4. The IMWP apparatus according to claim 1, wherein a thickness of the first III-V layer is 5 nm, a thickness of the III-V quantum well layer is 1 nm, a thickness of each of the LT III-V buffer layer and the second III-V layers is 20 nm, and a thickness of each of the third and fourth III-V layers is 10 nm.

5. The IMWP apparatus according to claim 1, wherein the plurality of second III-V layers are respectively annealed at an annealing temperature of 800° C. for an annealing time of 45 seconds.

6. The IMWP apparatus according to claim 1, wherein the III-V semiconductor circuit further comprises a III-V circuitry disposed on the III-V stack layer.

7. The IMWP apparatus according to claim 6, wherein the III-V circuitry comprises at least one of a III-V modulator, a III-V quantum dot (QD) amplifier, a III-V QD laser, a III-V ring resonator, a III-V detector, and integrated photonic components.

8. The IMWP apparatus according to claim 1, further comprising a silicon on sapphire (SOS) CMOS RF circuit formed on the sapphire substrate.

9. An electronic device having the IMWP apparatus according to claim 1.

* * * * *